United States Patent
Lim et al.

(10) Patent No.: US 11,800,639 B2
(45) Date of Patent: Oct. 24, 2023

(54) FLEXIBLE CIRCUIT BOARD, COF MODULE AND ELECTRONIC DEVICE INCLUDING THE SAME

(71) Applicant: LG INNOTEK CO., LTD., Seoul (KR)

(72) Inventors: Jun Young Lim, Seoul (KR); Woong Sik Kim, Seoul (KR); Hyung Kyu Yoon, Seoul (KR); Min Hwan Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/115,218

(22) Filed: Feb. 28, 2023

(65) Prior Publication Data

US 2023/0209705 A1    Jun. 29, 2023

Related U.S. Application Data

(63) Continuation of application No. 17/836,405, filed on Jun. 9, 2022, now Pat. No. 11,622,444, which is a
(Continued)

(30) Foreign Application Priority Data

Jul. 22, 2016  (KR) .................. 10-2016-0093748
Aug. 12, 2016  (KR) .................. 10-2016-0102902

(51) Int. Cl.
*H05K 1/02*    (2006.01)
*H05K 1/18*    (2006.01)
(Continued)

(52) U.S. Cl.
CPC ......... *H05K 1/0281* (2013.01); *H01L 21/481* (2013.01); *H01L 21/4821* (2013.01);
(Continued)

(58) Field of Classification Search
CPC ............. H01L 21/481; H01L 23/49827; H01L 23/4985; H01L 24/16; H01L 2224/16227;
(Continued)

(56) References Cited

U.S. PATENT DOCUMENTS 7,250,575 B2    7/2007   Nagao et al.
7,382,042 B2    6/2008   Awata et al.
(Continued)

FOREIGN PATENT DOCUMENTS

CN    101742820    6/2010
CN    108141955    6/2018
(Continued)

OTHER PUBLICATIONS

U.S. Office Action issued in U.S. Appl. No. 15/657,296 dated May 31, 2018.
(Continued)

*Primary Examiner* — Nathan Milakovich
(74) *Attorney, Agent, or Firm* — KED & Associates LLP

(57) ABSTRACT

A flexible circuit board and an electronic device including a flexible circuit board are provided. The flexible circuit board may include a substrate having a bending area and a non-bending area, a wiring pattern layer provided on the bending area and the non-bending area, a plating layer provided on the wiring pattern layer and including an open area in an area corresponding to the bending area, and a protective layer that directly contacts one surface of the wiring pattern layer exposed at the open area and a side surface of the plating layer. The protective layer may have a larger thickness than a thickness of the plating layer.

17 Claims, 28 Drawing Sheets

Related U.S. Application Data continuation of application No. 17/106,039, filed on Nov. 27, 2020, now Pat. No. 11,395,403, which is a continuation of application No. 16/733,346, filed on Jan. 3, 2020, now Pat. No. 10,912,192, which is a continuation of application No. 16/378,943, filed on Apr. 9, 2019, now Pat. No. 10,561,016, which is a continuation of application No. 15/657,296, filed on Jul. 24, 2017, now Pat. No. 10,321,562.

(51) Int. Cl.
| | | |
|---|---|---|
| *H05K 3/28* | (2006.01) | |
| *H01L 23/498* | (2006.01) | |
| *H01L 23/00* | (2006.01) | |
| *H01L 21/48* | (2006.01) | |
| *H05K 1/14* | (2006.01) | |
| *H05K 3/18* | (2006.01) | |

(52) U.S. Cl.
CPC .......... *H01L 23/4985* (2013.01); *H01L 24/16* (2013.01); *H05K 1/0271* (2013.01); *H05K 1/144* (2013.01); *H05K 3/18* (2013.01); *H05K 3/28* (2013.01); *H01L 21/4867* (2013.01); *H01L 23/49827* (2013.01); *H01L 2224/16227* (2013.01); *H01L 2224/16235* (2013.01); *H01L 2924/15153* (2013.01); *H05K 1/189* (2013.01); *H05K 2201/055* (2013.01); *H05K 2201/10128* (2013.01)

(58) Field of Classification Search
CPC .... H05K 1/0271; H05K 1/0281; H05K 1/144; H05K 1/189; H05K 2201/10128
See application file for complete search history.

(56) References Cited

U.S. PATENT DOCUMENTS

| | | |
|---|---|---|
| 7,710,739 B2 | 5/2010 | Kimura et al. |
| 8,576,209 B2 | 11/2013 | Miyaguchi |
| 10,517,172 B2 | 12/2019 | Lim et al. |
| 10,986,726 B2 | 4/2021 | Lim et al. |
| 11,089,682 B2 | 8/2021 | Lee et al. |
| 11,239,172 B2 | 2/2022 | Lim et al. |
| 11,395,403 B2 | 7/2022 | Lim et al. |
| 2014/0254111 A1 | 9/2014 | Yamazaki et al. |
| 2016/0218053 A1 | 7/2016 | Cho et al. |
| 2020/0084888 A1 | 3/2020 | Lee et al. |
| 2020/0243452 A1 | 7/2020 | Lim et al. |

FOREIGN PATENT DOCUMENTS

| | | |
|---|---|---|
| CN | 112074075 | 12/2020 |
| KR | 10-2009-0127548 | 12/2009 |
| KR | 10-1547500 | 8/2015 |
| KR | 10-1611216 | 4/2016 |
| KR | 10-2016-0091595 | 8/2016 |

OTHER PUBLICATIONS

U.S. Notice of Allowance issued in U.S. Appl. No. 15/657,296 dated Jan. 10, 2019.
U.S. Notice of Allowance issued in U.S. Appl. No. 16/378,943 dated Oct. 3, 2019.
U.S. Office Action issued in U.S. Appl. No. 16/733,346 dated Apr. 16, 2020.
U.S. Notice of Allowance issued in U.S. Appl. No. 16/733,346 dated Sep. 17, 2020.
Chinese Office Action dated May 27, 2021 issued in Application No. 201710606525.3.
U.S. Notice of Allowance dated Mar. 14, 2022 issued in U.S. Appl. No. 17/106,039.
U.S. Office Action dated Oct. 27, 2022 issued in co-pending related U.S. Appl. No. 17/836,405.
Korean Office Action dated Aug. 17, 2023 issued in Application No. 10-2016-0102902.

FLEXIBLE CIRCUIT BOARD, COF MODULE AND ELECTRONIC DEVICE INCLUDING THE SAME

CROSS-REFERENCE TO RELATED APPLICATIONS

This application is a Continuation Application of U.S. patent application Ser. No. 17/836,405 filed Jun. 9, 2022, which is a Continuation Application of prior U.S. patent application Ser. No. 17/106,039 filed Nov. 27, 2020, now U.S. Pat. No. 11,395,403, issued Jul. 19, 2022, which is a Continuation Application of prior U.S. application Ser. No. 16/733,346 filed on Jan. 3, 2020, now U.S. Pat. No. 10,912,192, issued Feb. 2, 2021, which is a Continuation of prior U.S. application Ser. No. 16/378,943 filed Apr. 9, 2019, now U.S. Pat. No. 10,561,016, issued Feb. 11, 2020, which is a Continuation of prior U.S. application Ser. No. 15/657,296 filed Jul. 24, 2017, now U.S. Pat. No. 10,321,562, issued Jun. 11, 2019, which claims priority under 35 U.S.C. § 119 to Korean Application No. 10-2016-0093748, filed on Jul. 22, 2016, and Korean Application No. 10-2016-0102902, filed on Aug. 12, 2016, whose entire disclosures are incorporated herein by reference.

BACKGROUND

1. Field

A flexible circuit board, a chip on film (COF) module, and an electronic device including a flexible circuit board and a COF module are provided.

2. Background

Various electronic products are becoming thinner, miniaturized, and lighter. Research for mounting semiconductor chips with high density in a narrow region of an electronic device is being conducted in various ways. For example, since a chip on film (COF) method uses a flexible substrate, the COF method may be applied to both a flat panel display and a flexible display. Since the COF method may be applied to various electronic devices, the COF method is attracting attention. Since the COF method may have a fine pitch, the COF method may be used for a high-resolution display as pixelation increases.

A chip on film (COF) method is a method in which a semiconductor chip may be mounted on a flexible circuit board in the form of a thin film. For example, the semiconductor chip may be an integrated circuit (IC) chip or a large scale integrated circuit (LSI) chip. However, in a COF flexible circuit board, a crack may be generated in the process of repeatedly bending a circuit pattern formed on a flexible substrate or bonding in a bent state, and the COF flexible circuit board may be damaged by a tensile force generated during bending.

BRIEF DESCRIPTION OF THE DRAWINGS

Embodiments will be described in detail with reference to the following drawings in which like reference numerals refer to like elements, and wherein.

DETAILED DESCRIPTION

Figure 1:
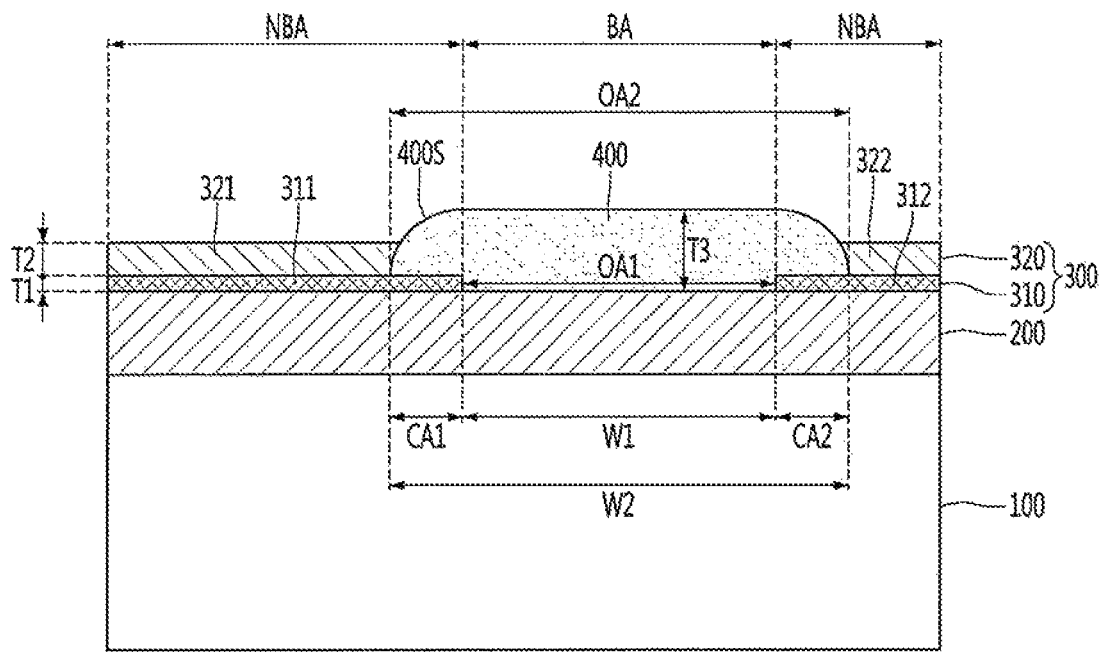
FIG. 1 to FIG. 4 are various cross-sectional views of a flexible circuit board according to an embodiment.

Referring to FIG. 1 to FIG. 8, a flexible circuit board may include: a substrate 100; a wiring pattern layer 200 provided on the substrate 100; a plating layer 300; and a protective layer 400. The substrate 100 may be a supporting substrate to support the wiring pattern layer 200, the plating layer 300, and the protective layer 400. The substrate 100 may include a bending area BA and a non-bending area NBA except for the bending area. The substrate 100 may include a bending area BA where bending may occur and a non-bending area NBA other than the bending area BA.

The substrate 100 may be a flexible substrate. The substrate 100 may include a flexible plastic. For example, the substrate 100 may be a polyimide (PI) substrate. However, the embodiment is not limited thereto, and may be a substrate made of a polymer material such as, e.g., polyethylene terephthalate (PET) or polyethylene naphthalate (PEN). Accordingly, a flexible circuit board including the substrate 100 may be used in various electronic devices having a curved display device. For example, a flexible circuit board including the substrate 100 may have flexible characteristics, thereby making it suitable to mount a semiconductor chip on a wearable electronic device. The substrate 100 may be an insulating substrate. The substrate 100 may be an insulating substrate that supports various wiring patterns.

The substrate 100 may have a thickness of 12 μm to 125 μm. For example, the substrate 100 may have a thickness of 50 μm or less. The substrate 100 may have a thickness of 20 μm to 40 μm. When the thickness of the substrate 100 exceeds 125 μm, a thickness of the entire flexible circuit board may be increased.

Wiring may be provided on the substrate 100. The wiring may be a plurality of patterned wirings. For example, a plurality of wirings on the substrate 100 may be provided apart from each other. The wiring pattern layer 200 may be provided on one surface of the substrate 100. The wiring pattern layer 200 may be provided on a bending area BA and a non-bending area NBA on the substrate 100.

An area of the substrate 100 may be larger than an area of the wiring pattern layer 200. A planar area of the substrate 100 may be larger than a planar area of the wiring pattern layer 200. The wiring pattern layer 200 may be partially provided on the substrate 100. For example, a lower surface of the wiring pattern layer 200 may be in contact with the substrate 100, and the substrate 100 may be exposed between the plurality of wirings. The wiring pattern layer 200 may include a conductive material. For example, the wiring pattern layer 200 may include a metal material having excellent electrical conductivity. The wiring pattern layer 200 may include copper (Cu). However, the embodiment is not limited to thereto, and the wiring pattern layer 200 may include at least one metal among copper (Cu), aluminum (Al), chromium (Cr), nickel (Ni), silver (Ag), molybdenum (Mo), gold (Au), titanium (Ti), and an alloy thereof.

The wiring pattern layer 200 may be provided to have a thickness of 1 μm to 20 μm. For example, the wiring pattern layer 200 may be provided to have a thickness of 5 μm to 20 μm. The wiring pattern layer 200 may be provided to have a thickness of 5 μm to 15 μm. When the thickness of the wiring pattern layer 200 is less than 1 μm, a resistance of the wiring pattern layer 200 may increase. When the thickness of the wiring pattern layer 200 is more than 20 μm, it may be difficult to create a fine pattern.

The plating layer 300 may be provided on the wiring pattern layer 200. Two layers of plating layers may be provided on the wiring pattern layer 200. The plating layer 300 may include a first plating layer 310 and a second plating layer 320. The plating layer 300 may be partially provided on the wiring pattern layer 200. The plating layer 300 may include open parts or areas OA1 and OA2 in an area corresponding to the bending area BA. The first plating layer 310 may include a first open area OA1, and the second plating layer 320 may include a second open area OA2. A width of the second open area OA2 of the second plating layer 320 may be larger than a width of the open area OA1 of the first plating layer 310.

The first plating layer 310 may be partially provided on the wiring pattern layer 200. For example, the first plating layer 310 may be provided on a non-bending area NBA on the wiring pattern layer 200. The first plating layer 310 may be partially provided on a bending area BA on the wiring pattern layer 200. For example, the first plating layer 310 may be provided only on the non-bending area NBA on the wiring pattern layer 200. The first plating layer 310 may not be provided on the bending area BA on the wiring pattern layer 200. Accordingly, the first plating layer 310 may include a first open area OA1 in an area corresponding to the bending area BA. For example, a width of the first open area OA1 may correspond to a width of the bending area BA.

An opened side surface of the first plating layer 310 may be provided in a boundary region between the bending area BA and the non-bending area NBA. For example, the width of the first open area OA1 may be smaller than the width of the bending area BA. Both open side surfaces of the first plating layer 310 may be provided on the bending area BA. For example, the width of the first open area OA1 may be larger than the width of the bending area BA. Both open side surfaces of the first plating layer 310 may be provided on the non-bending area NBA.

The first plating layers 310 may be spaced apart from each other by the first open area. For example, a first pattern plating layer 311 adjacent to one end of the bending area may not be connected to a first pattern plating layer 312 adjacent to another end of the bending area. The first pattern plating layer 311 and the first pattern plating layer 312 may partially overlap the bending area BA. Alternatively, the first pattern plating layer 311 and the first pattern plating layer 312 may be provided only on the non-bending area NBA.

The second plating layer 320 may be provided on the first plating layer 310. The second plating layer 320 may be partially provided on the first plating layer 310. The second plating layer 320 may be provided on an area of the first plating layer 310 except for an area where the protective layer 400 is provided on the first plating layer 310. The second plating layer 320 may be provided on an area of the first plating layer 310 except for an area where the protective layer 400 is provided on the first plating layer 310.

The second plating layer 320 may be provided on an area corresponding to a non-bending area NBA on the first plating layer 310. The second plating layer 320 may be partially provided on a bending area BA. Alternatively, the second plating layer 320 may be provided only on an area corresponding to the non-bending area NBA on the first plating layer 310.

The second plating layer 320 may not be provided on the bending area BA. Accordingly, the second plating layer 320 may include a second open area OA2. For example, the width of the second open area OA2 may be larger than the width of the bending area BA. A side surface of the second plating layer 320 may be spaced apart from a boundary region between the bending area BA and the non-bending area NBA. For example, the width of the second open area OA2 may correspond to the width of the bending area BA. The width of the second open area OA2 may be smaller than the width of the bending area BA. The second plating layers 320 may be spaced apart from each other by the second open area OA2. For example, a second pattern plating layer 321 from one end of the bending area BA may not be connected to a second pattern plating layer 322 from another end of the bending area BA.

The width of the first open area OA1 may be different from that of the second open area OA2. The width of the first open area OA1 may be smaller than that of the second open area OA2. The first open area OA1 and the second open area OA2 may be located in an area corresponding to the bending area BA. At least one open area of the first open area OA1 and the second open area OA2 may be entirely or partially located on the bending area BA.

The area of the second plating layer 320 may be smaller than that of the first plating layer 310. The second plating layer 320 may have a smaller planar area than a planar area of the first plating layer 310. One surface of the wiring pattern layer 200 and a side surface of the plating layer 300 may be exposed in the first open area OA1.

A protective layer 400 may be provided on the first open area OA1 and the second open area OA2. The protective layer 400 may be in direct contact with one surface of the wiring pattern layer 200 exposed at the first open area OA1 and a side surface of the plating layer 300.

A width W1 of the protective layer 400 provided on the first open area OA1 may be smaller than a width W2 of the protective layer 400 provided on the second open area OA2. The protective layer 400 may be in direct contact with one surface of the wiring pattern layer 200 exposed at the first open area OA1, an upper surface of the first plating layer 310, and a side surface of the second plating layer 320 exposed at the second open area OA2.

An upper surface of the first plating layer 310 exposed at the second open area OA2 may be located at the non-bending area NBA, but the embodiment is not limited thereto. For example, the upper surface of the first plating layer 310 exposed at the second open area OA2 may be located at the bending area BA. Alternatively, the upper surface of the first plating layer 310 exposed at the second open area OA2 may be located in the bending area BA and the non-bending area NBA.

The plating layer 300 may include tin (Sn). For example, the first plating layer 310 and the second plating layer 320 may include tin (Sn). The wiring pattern layer 200 may be formed of copper (Cu), and the first plating layer 310 and the second plating layer 320 may be formed of tin (Sn). Although the first plating layer 310 and the second plating layer 320 may both be formed of tin (Sn), the first plating layer 310 and the second plating layer 320 may be formed in different steps. The first plating layer 310 may be plated with tin (Sn), and then the protective layer 400 may be applied as an insulating pattern, and the second plating layer 320 may be plated with tin (Sn).

For example, when the manufacturing process of a flexible circuit board according to embodiments includes a heat treatment process such as thermal curing, a diffusion action of copper (Cu) of the wiring pattern layer 200 or tin (Sn) of the plating layer 300 may occur. As the diffusion concentration of copper (Cu) decreases from the first plating layer 310 to a surface of the second plating layer 320, a content of copper (Cu) may be reduced. The content of tin (Sn) may increase from the first plating layer 310 to the surface of the second plating layer 320.

The first plating layer 310 and the second plating layer 320 may be an alloy of tin (Sn) and copper (Cu) due to a chemical action at a lamination interface of the wiring pattern layer 200 and the plating layer 300. The first plating layer 310 and the second plating layer 320 may have different contents of tin (Sn) and copper (Cu). The first plating layer 310 directly contacting the copper wiring pattern layer may have a copper (Cu) content more than a copper (Cu) content of the second plating layer 320. Alternatively, the first plating layer 310 may include an alloy of tin (Sn) and copper (Cu), and the second plating layer 320 may include tin (Sn). The plating layer according to the embodiment may prevent electrochemical migration resistance due to a diffusion phenomenon of Cu/Sn, and may prevent short-circuit defects due to metal growth. However, the embodiment is not limited thereto, and may include any one of a Ni/Au alloy, gold (Au), electroless nickel immersion gold (ENIG), a Ni/Pd alloy, and organic solderability preservative (OSP).

The first plating layer 310 may have a thickness different from that of the second plating layer 320. A thickness T1 of the first plating layer 310 may be smaller than a thickness T2 of the second plating layer 320. For example, the first plating layer 310 may have a thickness of 0.1 μm or less. For example, the second plating layer 320 may have a thickness of 1 μm or less. The total thickness of the plating layer 300 may be 1.1 μm or less. Thicknesses of the first plating layer 310 and the second plating layer 320 may be 1.1 μm or less.

The protective layer 400 may cover an upper surface of the wiring pattern layer 200 on the bending area BA and a part of the first plating layer 310 and may be provided to be wider than the bending area BA. The protective layer 400 may be in contact with the wiring pattern layer 200, the first plating layer 310, and the second plating layer 320. The protective layer 400 may be in contact with the upper surface of the wiring pattern layer 200 on the bending area, a part of an upper surface of the first plating layer 310, and the second plating layer 320. The protective layer 400 may be in direct contact with an upper surface of the wiring pattern layer 200 of the bending area BA to the first open area OA1, an upper surface and a side surface of the first plating layer 310 outside the bending area BA to the first open area OA1, and a side surface of the second plating layer 320.

As the protective layer 400 according to the embodiment may directly contact the wiring pattern layer 200, the first plating layer 310, and the second plating layer 320 simultaneously, removal of a protective layer 400 may be prevented, thereby improving reliability of the flexible circuit board. The protective layer 400 may cover one side surface and the upper surface of the first plating layer 310. The protective layer 400 may be overlapped upward and downward with the first plating layer 310. For example, the protective layer 400 may overlap the first plating layer 310 in the non-bending area NBA and/or the bending area BA.

A first overlapping region CA1 may be a region in which the first plating layer 310 and the protective layer 400 may be in contact with each other, and a second overlapping region CA2 may be a region in which the first plating layer 310 and the plating layer 400 may be in contact with each other. The first overlapping region CA1 and the second overlapping region CA2 may be a peripheral region of an open area adjacent to the first open area OA1. The first overlapping region CA1 and the second overlapping region CA2 may be located on a bending area and/or a non-bending area.

A width of the first overlapping region CA1 or the second overlapping region CA2 may be 400 μm or more. The width of the first overlapping region CA1 or the second overlapping region CA2 may be smaller than the width of the bending area BA. For example, the widths of the first overlapping region CA1 and the second overlapping region CA2 may be smaller than that of the bending area BA.

Figure 3:
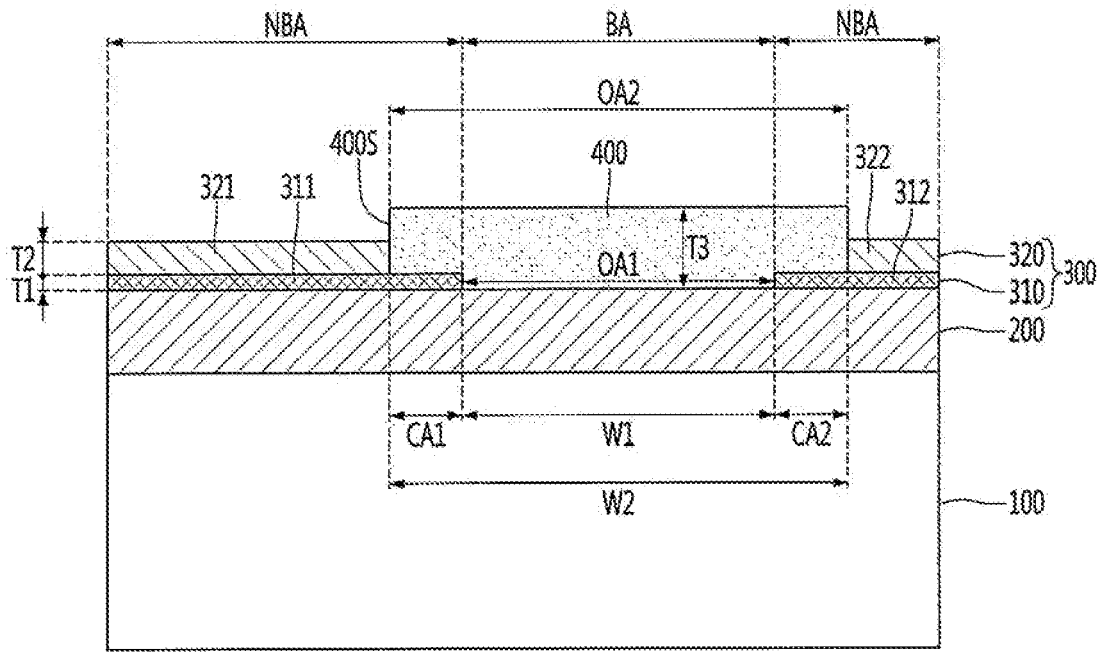
Figure 4:
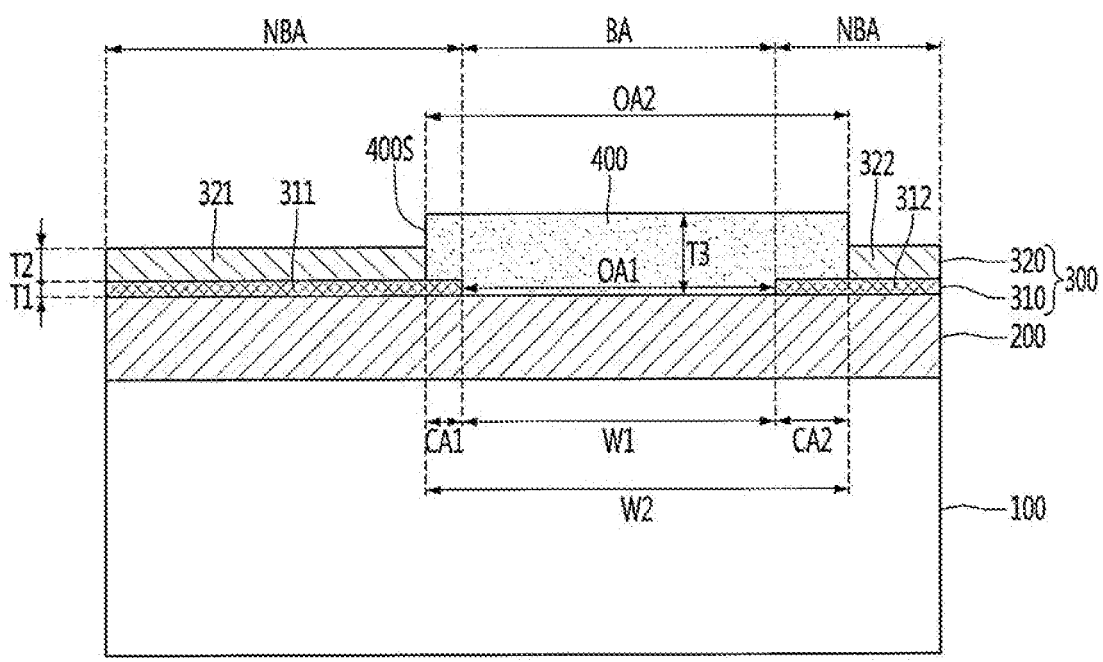

The widths of the first overlapping region CA1 and the second overlapping region CA2 may be corresponding to or different from each other. Referring to FIG. 3, the width of the first overlapping region CA1 may be equal to the width of the second overlapping region CA2. Referring to FIG. 4, the width of the first overlapping region CA1 may be different from that of the second overlapping region CA2. The width of the first overlapping region CA1 may be smaller than the width of the second overlapping region CA2.

A side surface 400S of the protective layer 400 may have various cross-sectional shapes. A side surface 400S of the protective layer 400 may include an inclined surface or a vertical surface. For example, referring to FIG. 1, the side surface 400S of the protective layer 400 may include an inclined surface. A contact area of the protective layer 400 with the second plating layer 320 may be increased, thereby preventing removal of the protective layer 400.

The side surface 400S of the protective layer 400 may include a curved inclined surface. For example, as the inclination angle with respect to the first plating layer 310 becomes closer to the first plating layer 310, the side surface 400S of the protective layer 400 may increase. The side surface 400S of the protective layer 400 may have an acute angle with respect to the first plating layer 310.

Figure 2:
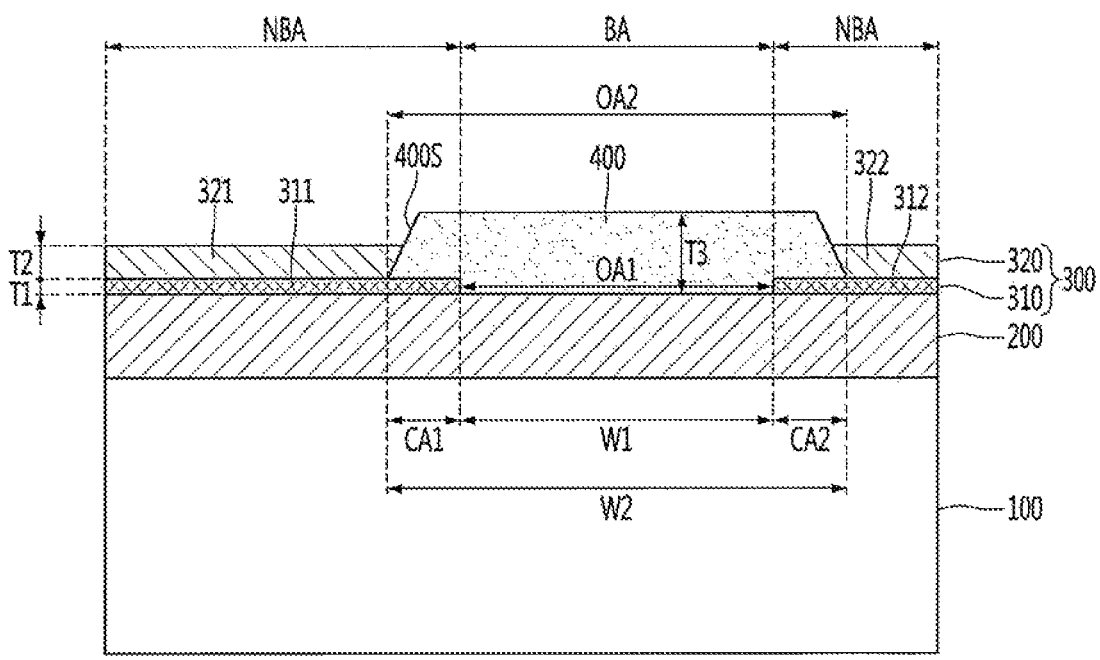

Referring to FIG. 2, the side surface 400S of the protective layer 400 may include an inclined surface. The side surface 400S of the protective layer 400 may include a straight inclined surface. For example, the inclination angle of the side surface 400S of the protective layer 400 and the first plating layer 310 may be constant regardless of distance from the first plating layer 310. The side surface 400S of the protective layer 400 may be at an acute angle with respect to the first plating layer 310.

Referring to FIGS. 3 and 4, the side surface 400S of the protective layer 400 may include a vertical surface. The side surface 400S of the protective layer 400 may include a straight inclined surface. For example, the side surface 400S of the protective layer 400 may be at an inclination angle of 90 degrees with the first plating layer 310 or the like.

The protective layer 400 may include an insulating material. The protective layer 400 may be a resist layer. For example, the protective layer 400 may be a solder resist layer containing an organic polymer material. For example, the protective layer 400 may include an epoxy acrylate resin. The protective layer 400 may include a resin, a curing agent, a photo initiator, a pigment, a solvent, a filler, an additive, and an acrylic monomer. However, the embodiment is not limited thereto, and the protective layer 400 may be any one of a photo-solder resist layer, a cover-lay, or a polymer material.

The protective layer 400 may be provided to have a larger thickness than the plating layer 300. A thickness T3 of the protective layer 400 may be larger than the thickness T2 of the second plating layer 320. Accordingly, an upper surface of the protective layer 400 may be provided higher than an upper surface of the second plating layer 320. Since the upper surface of the protective layer 400 is provided higher than the upper surface of the second plating layer 320, the protective layer 400 may have a step with the second plating layer 320.

The thickness of the protective layer 400 at the bending area may be different from that of the non-bending area. The thickness of the protective layer 400 on the bending area may be larger than that of the first protective layer 410 on the first overlapping region CA1. The thickness of the protective layer 400 on the bending area may be larger than that of the first protective layer 410 on the second overlapping region CA2.

A thickness T3 of the protective layer 400 in the bending area may be 1 μm to 20 μm. For example, the thickness T3 of the protective layer 400 in the bending area may be 5 μm to 20 μm. The protective layer 400 may be integrally formed. Accordingly, removal of the protective layer 400 according to the embodiment may be prevented, and reliability of the flexible circuit board may be improved. When the flexible circuit board according to embodiments is bent, stress due to tension may be dispersed entirely in the protective layer 400 integrally formed, and reliability may be improved. Efficiency of the process of forming the flexible circuit board according to the embodiments may be improved.

Referring to FIG. 5 to FIG. 8, a double-sided flexible circuit board may include a substrate 100 having a bending area and a non-bending area, a first wiring pattern layer 210 provided on a bending area and a non-bending area on one surface of the substrate, a first plating layer 310 provided on the first wiring pattern layer 210 and including an open area in an area corresponding to the bending area, a second plating layer 320 provided on the first plating layer 310, a first protective layer 410 directly contacting one surface of the first wiring pattern layer 210 exposed at the open area, a side surface of the first plating layer 210, and a side surface of the second plating layer 320, a second wiring pattern layer 220 provided on a bending area and a non-bending area on another surface opposite to the one surface of the substrate, a third plating layer 330 provided on the second wiring pattern layer 220, a fourth plating layer 340 provided on the third plating layer 330, and a second protective layer 420 provided on an area corresponding to the bending area on the other surface of the substrate. The first protective layer 410 may be provided higher than an upper surface of the second plating layer 320.

The wiring pattern layer 200 may be provided on both sides of the substrate 100. The wiring pattern layer 200 may include a first wiring pattern layer 210 and a second wiring pattern layer 220. The first wiring pattern layer 210 may be provided on one surface of the flexible substrate 100 and the second wiring pattern layer 220 may be provided on the other surface opposite to the one surface of the flexible substrate 100.

A thickness of the first wiring pattern layer 210 may correspond to a thickness of the second wiring pattern layer 220. The thickness of the first wiring pattern layer 210 and the second wiring pattern layer 220 may be 1 μm to 20 μm, respectively. The first plating layer 310 may be provided on the first wiring pattern layer 210. The third plating layer 330 may be provided on the second wiring pattern layer 220.

At least one of the first plating layer 310 and the third plating layer 330 may include a first open area OA1. For example, referring to FIG. 5, one of the first plating layer 310 and the third plating layer 330 may include the first open area OA1. The first plating layer 310 may include the first open area OA1. For example, referring to FIG. 7 and FIG. 8, the first plating layer 310 and the third plating layer 330 may include the first open area OA1, respectively.

Figure 7:
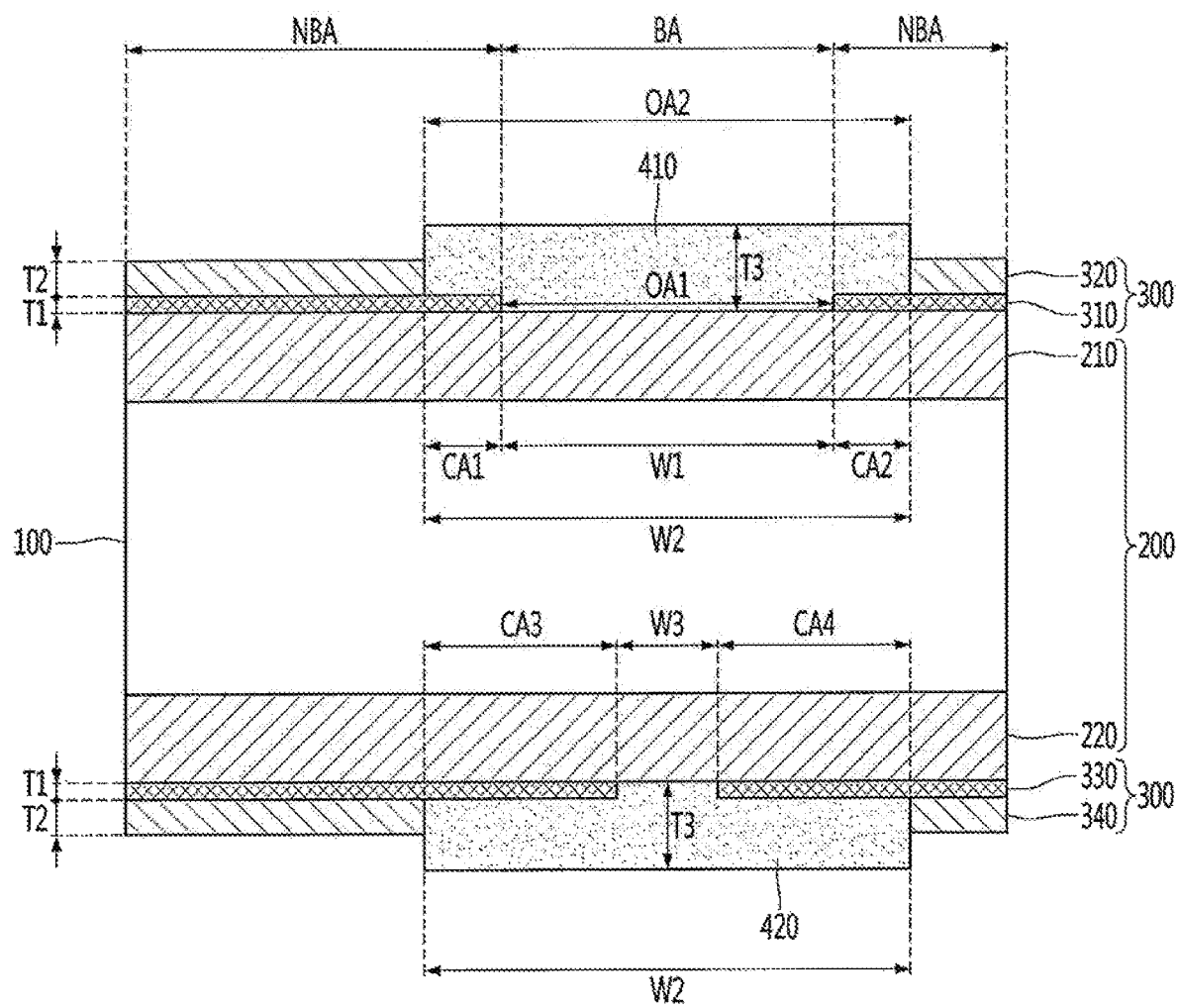
Figure 8:
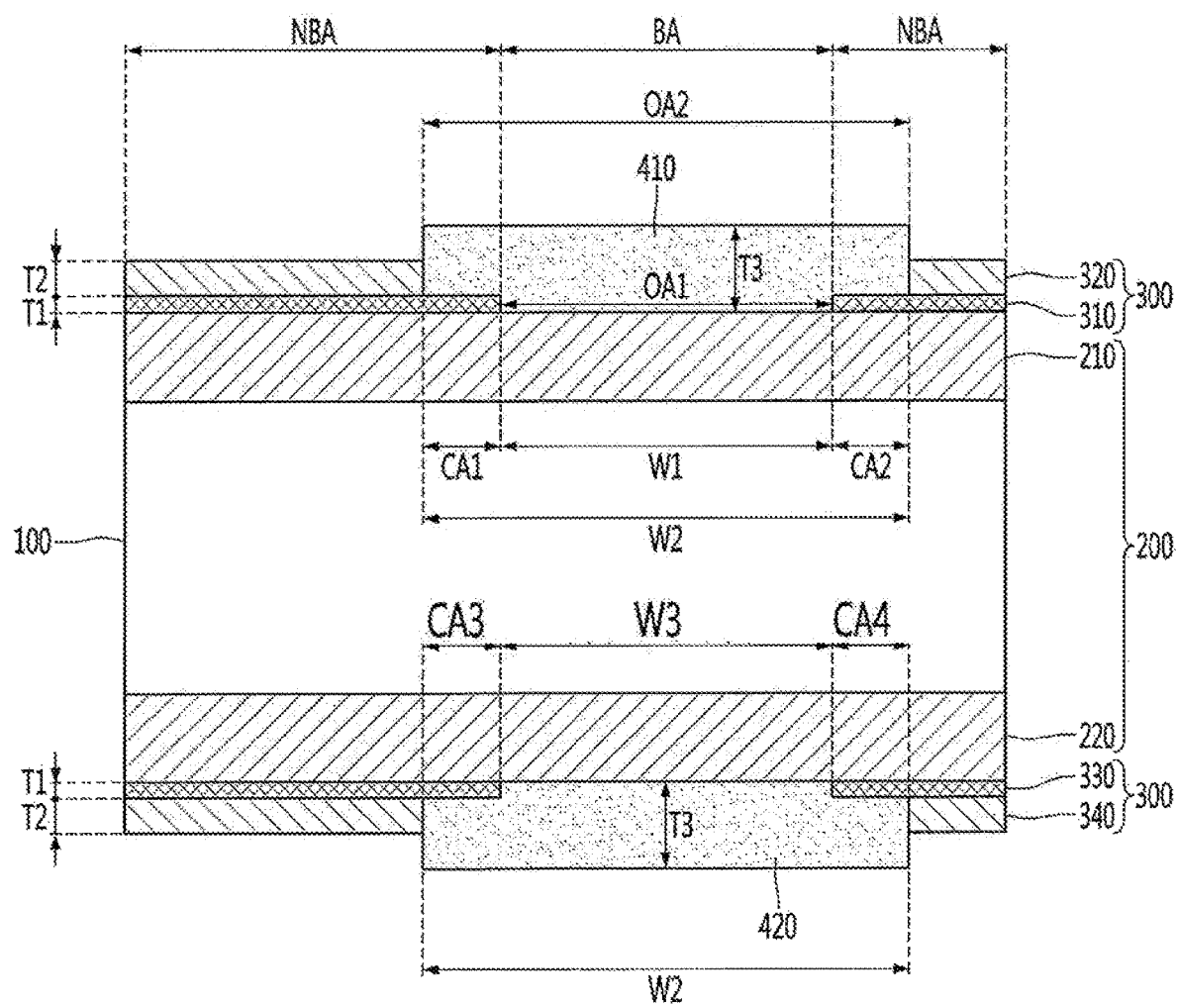

Referring to FIG. 7 and FIG. 8, the third plating layer 330 may be provided on the non-bending area. The second protective layer 420 may cover a part of upper surfaces of the second wiring pattern layer 220 and the third plating layer 330 on the bending area, and may be provided wider than the bending area. The fourth plating layer 340 may be provided on an area except for the area where the second protective layer 420 is provided. The second protective layer 420 may be provided higher than an upper surface of the fourth plating layer 340.

The second plating layer 320 may be provided on the first plating layer 310. The fourth plating layer 340 may be provided on the third plating layer 330. At least one of the second plating layer 320 and the fourth plating layer 340 may include a second open area OA2. For example, referring to FIG. 5, one of the second plating layer 320 and the fourth plating layer 340 may include the second open area OA2. The second plating layer 320 may include the second open area OA2. A width W1 of the first open area OA1 may be different from a width W2 of the second open area OA2. The width W1 of the first open area OA1 may be smaller than the width W2 of the second open area OA2.

Figure 6:
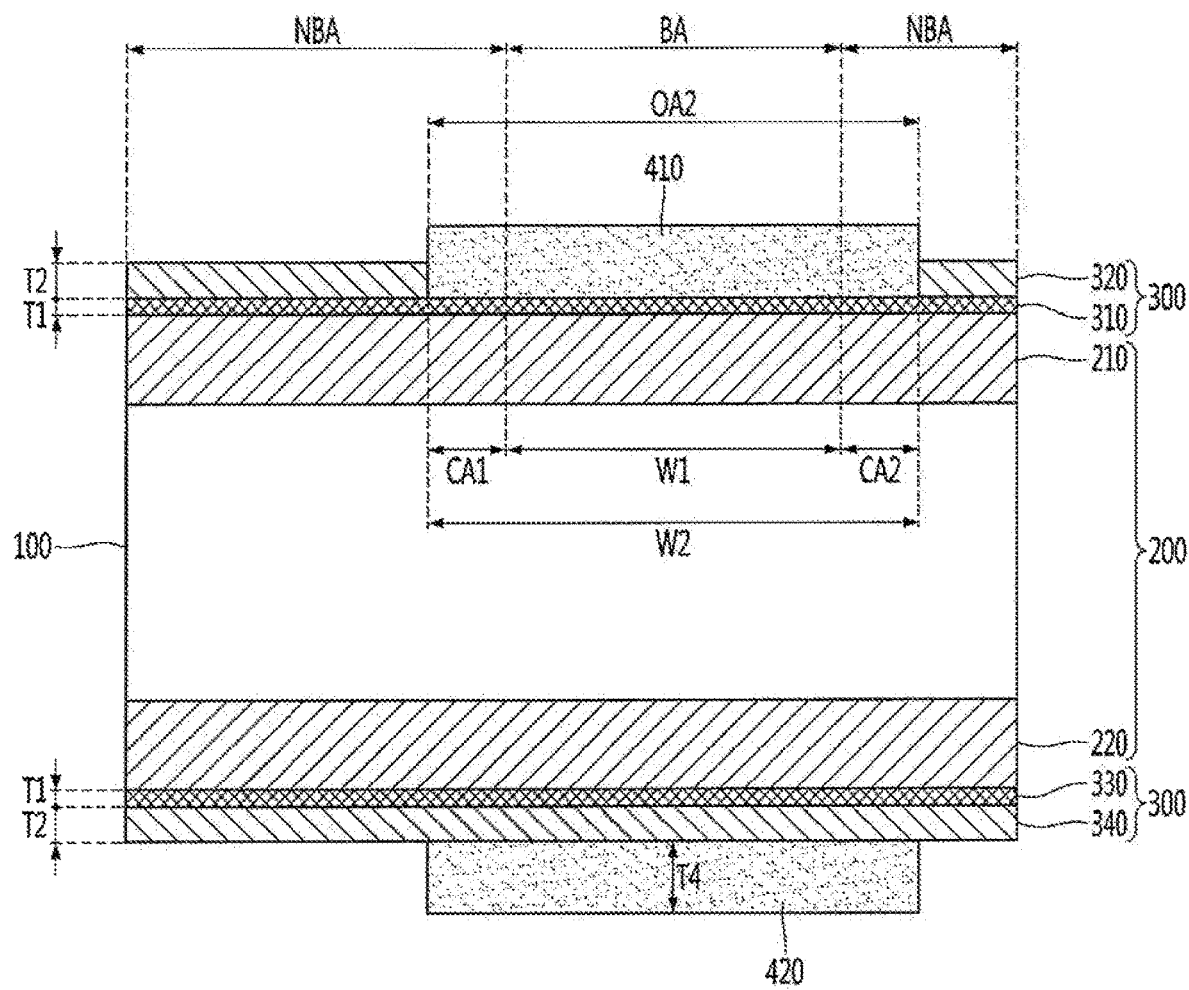

Referring to FIGS. 7 and 8, the second plating layer 320 and the fourth plating layer 340 may include the second open area OA2, respectively. Referring to FIG. 6, a location of the first protective layer 410 may be different from a location of the second protective layer 420. For example, the first plating layer 310 may be provided on the first wiring pattern layer 210 on one surface of the substrate 100, and the first protective layer 410 may be provided on the first plating layer 310. The second wiring pattern layer 220 may be provided on the other surface of the substrate 100, and the third plating layer 330, the fourth plating layer 340, and the second protective layer 420 may be sequentially provided on the second wiring pattern layer 220.

Two or more protective layers may be provided on at least one of one surface and the other surface of the substrate 100. For example, the first protective layer 410 may be provided on one surface of the substrate 100, and the second protective layer 420 may be provided on the other surface of the substrate 100. Two or more protective layers having different shapes may be provided on at least one of one surface and the other surface of the substrate 100. For example, the first protective layer 410 may have a different shape from the second protective layer 420. A cross-sectional shape of at least one of the first protective layer 410 and the second protective layer 420 may be T-shaped.

The first protective layer 410 may be provided on at least a part of the bending area BA. The first protective layer 410 may be provided entirely on the bending area BA. The first protective layer 410 may be provided on the entire bending area BA and a part of the non-bending area NBA. The first protective layer 410 may be provided on the second plating layer 320. In addition, the second protective layer 420 may be provided on the fourth plating layer 340.

At least one of the first protective layer 410 and the second protective layer 420 may have different widths for its top surface and bottom surface. For example, referring to FIG. 5, one of the first protective layer 410 and the second protective layer 420 may have an upper surface and a lower surface having different widths. A width W2 of the upper surface and a width W1 of the lower surface of the first protective layer 410 may be different. The width W2 of the upper surface of the first protective layer 410 may be larger than the width W1 of the lower surface thereof.

For example, referring to FIGS. 7 and 8, the first protective layer 410 and the second protective layer 420 may have different widths on the upper surface and the lower surface, respectively. Referring to FIG. 7, the width W2 of the upper surface and the width W1 of the lower surface of the first protective layer 410 may be different. The width W2 of the upper surface of the first protective layer 410 may be larger than the width W1 of the lower surface thereof. A width W2 of the upper surface and a width W3 of the lower surface of the second protective layer 420 may be different. The width W2 of the upper surface of the second protective layer 420 may be larger than the width W3 of the lower surface thereof. The width W1 of the lower surface of the first protective layer 410 may be different from the width W3 of the lower surface of the second protective layer 420.

Referring to FIG. 8, the width W2 of the upper surface and the width W1 of the lower surface of the first protective layer 410 may be different. The width W2 of the upper surface of the first protective layer 410 may be larger than the width W1 of the lower surface thereof. The width W2 of the upper surface and the width W1 of the lower surface of the second protective layer 420 may be different. The width W2 of the upper surface of the second protective layer 420 may be larger than the width W1 of the lower surface thereof. The width W1 of the lower surface of the first protective layer 410 may correspond to the width W1 of the lower surface of the second protective layer 420.

At least one of the first protective layer 410 and the second protective layer 420 may be in contact with the wiring pattern layer 200. For example, referring to FIG. 5, one protective layer of the first protective layer 410 and the second protective layer 420 may be in contact with the wiring pattern layer 200. The first protective layer 410 may be in contact with the wiring pattern layer 200. The first protective layer 410 may receive a tensile force, and the second protective layer 420 may be bent in a direction to receive a compressive force. As one surface of the first protective layer 410 contacts the wiring pattern layer 200, it may be possible to prevent a crack from being generated in the first wiring pattern layer 210 and the plating layer 300 at a portion when the flexible circuit board is folded. Therefore, reliability of the flexible circuit board may be improved.

For example, referring to FIGS. 7 and 8, the first protective layer 410 may be in contact with the first wiring pattern layer 210, and the second protective layer 420 may be in contact with the second wiring pattern layer 220, respectively. The first protective layer 410 or the second protective layer 420 may be bent in a direction to receive a tensile force. Accordingly, as one surface of the first protective layer 410 or one surface of the second protective layer 420 contacts the wiring pattern layer, it may be possible to prevent a crack from being generated in the first or second wiring pattern layer 210, 220 and/or the plating layers 310, 320, 330, and 340 at a portion thereof when the flexible circuit board is folded. Therefore, reliability of the flexible circuit board may be improved.

A thickness of the first protective layer 410 may correspond to or different from a thickness of the second protective layer 420. The thickness of the protective layer may refer to a measurement at the bending area. For example, referring to FIG. 5, the thickness T3 of the first protective layer 410 may be different from the thickness T4 of the second protective layer 420. The thickness T3 of the first protective layer 410 may be larger than the thickness T4 of the second protective layer 420. The thickness of the first protective layer 410 may be 10 µm to 20 µm, and the thickness of the second protective layer 420 may be 5 µm to 15 µm.

The first protective layer 410 may receive a tensile force, and the second protective layer 420 may be bent in a direction to receive a compressive force. Since the first protective layer 410 receiving a tensile force has a larger thickness than the second protective layer 420 receiving a compressive force, the first wiring pattern layer 210 and/or the plating layers 310 and 320 may be prevented from being cracked at a portion that receives tension when folding the flexible circuit board. Therefore, reliability of the flexible circuit board may be improved.

For example, referring to FIGS. 7 and 8, the thickness T3 of the first protective layer 410 may correspond to the thickness T3 of the second protective layer 420. The thickness of the first protective layer 410 may be 1 µm to 20 µm, and the thickness of the second protective layer 420 may be 1 µm to 20 µm.

The first protective layer 410 and the second protective layer 420 may be in contact with the first and second wiring pattern layers 210 and 220, respectively, the thickness of the first protective layer 410 may be 10 µm to 20 µm, and the thickness of the second protective layer 420 may be 5 µm to 15 µm. The first protective layer 410 may receive a tensile force, and the second protective layer 420 may be bent in a direction to receive a compressive force. Since the first protective layer 410 receiving a tensile force has a larger thickness than the second protective layer 420 receiving a compressive force, the first wiring pattern layer 210 and/or the plating layers 310 and 320 may be prevented from being cracked at a portion that has or receives tension when folding the flexible circuit board. Therefore, reliability of the flexible circuit board may be improved.

Figure 5:
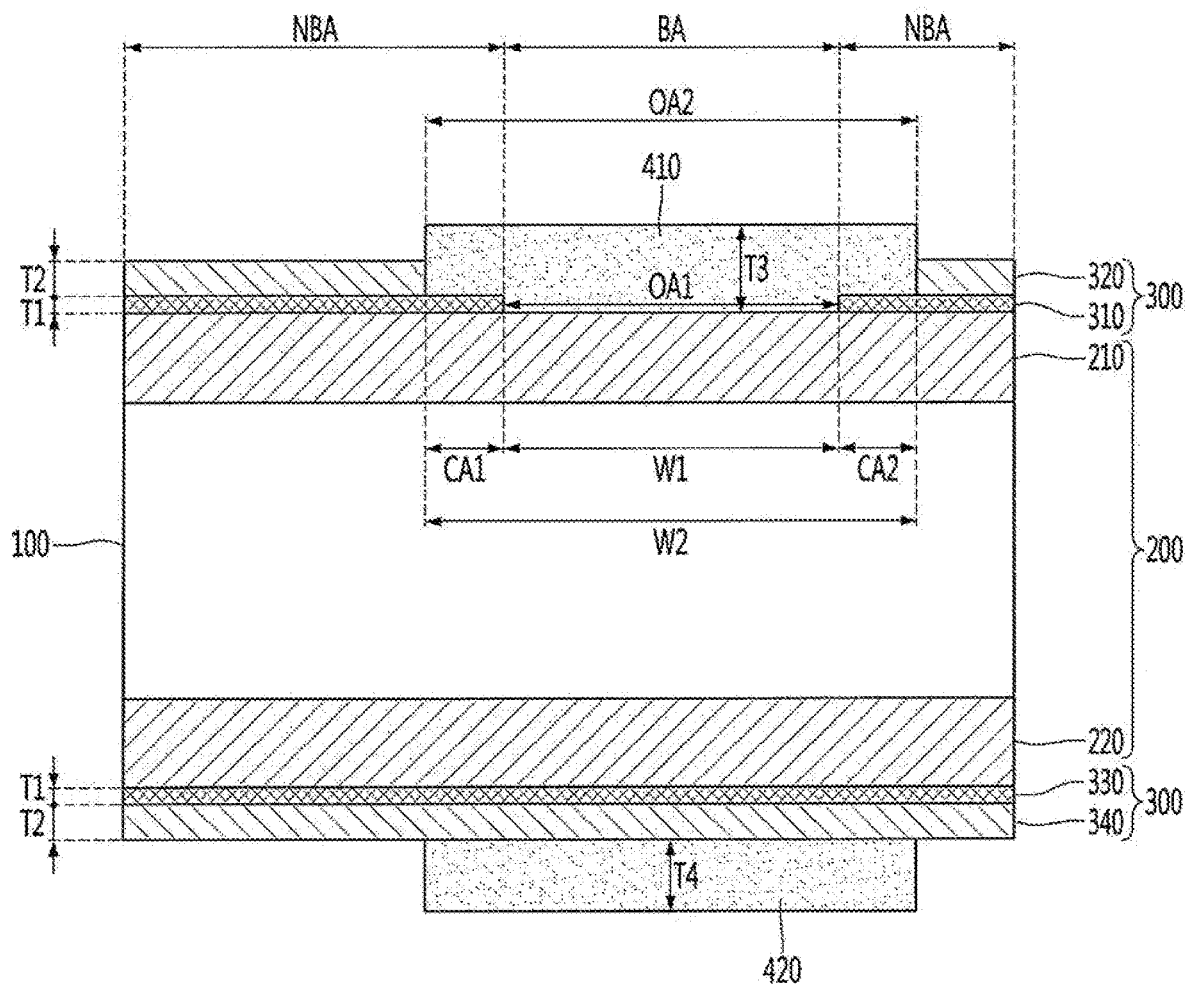
FIG. 5 to FIG. 8 are various cross-sectional views of a double-sided flexible printed circuit board according to an embodiment.

Referring to FIG. 5, FIG. 7 and FIG. 8, an outer side of one end of the bending area may include a first overlapping region in which the first plating layer and the first protective layer may be in contact with each other, and an outer side of another end of the bending area may include a second overlapping region in which the first plating layer and the first protective layer may be in contact with each other. A width of the first overlapping region may correspond to or may be different from a width of the second overlapping region. The outer side of one end of the bending area may include a third overlapping region in which the third plating layer and the second protective layer are in contact with each other, and the outer side of the other end of the bending area may include a fourth overlapping region in which the third plating layer and the second protective layer may be in contact with each other.

Referring to FIG. 7, the width of the first overlapping region CA1 may correspond to the width of the second overlapping region CA2. The width of the third overlapping region CA3 may correspond to the width of the fourth overlapping region CA4. The width of the first overlapping region CA1 may be smaller than the width of the third overlapping region CA3. The width of the second overlapping region CA2 may be smaller than the width of the fourth overlapping region CA4.

Referring to FIG. 8, the width of a contact region of the first protective layer 410 and the first wiring pattern layer 210 may be equal to the width of a contact region of the second protective layer 420 and the second wiring pattern layer 220. The width of the first overlapping region CA1 may correspond to the width of the second overlapping region CA2. The width of the first overlapping region CA1 may correspond to the width of the third overlapping region CA3. The width of the second overlapping region CA2 may correspond to the width of the fourth overlapping region CA4.

Referring to FIG. 8, the width W1 of the contact region of the first protective layer 410 and the first wiring pattern layer 210 may be equal to the width W1 of the contact region of the second protective layer 420 and the second wiring pattern layer 220. At this point, the thickness of the first protective layer 410 and the thickness of the second protective layer 420 may be same. The first protective layer 410 and the second protective layer 420 may have corresponding shapes and thicknesses. Stress due to deformation on one surface and the other surface of the substrate may be minimized. By increasing the contact area of the first and second protective layers 410/420 and the wiring pattern layer 200 and the plating layer 300, removal of the protective layers 410/420 may be prevented. The first and second protective layers 410/420 have corresponding shapes, and thus process efficiency may be improved.

In a double-sided flexible printed circuit board according to the embodiments, a protective layer on a side receiving a tensile force may contact a wiring pattern layer and thus cracking and breakage of the wiring pattern layer and/or a plating layer due to bending may be prevented, and reliability may be improved as a result.

The double-sided flexible printed circuit board may include a first protective layer 410 provided between the first plating layer 310 and the second plating layer 320. The double-sided flexible printed circuit board may include a structure of the first protective layer 410 in which a portion is buried between the first plating layer 310 and the second plating layer 320, and thus a tensile force of a bending area may be buffered, and cracking of a wiring pattern layer and a plating layer may be prevented.

In the double-sided flexible printed circuit board, as at least one protective layer of the first protective layer 410 and second protective layer 420 may be in contact with the wiring pattern layer 200, a crack due to a change in tensile force during bending may be prevented. Accordingly, a semiconductor chip may be mounted in a narrow region of an electronic device in high density, and a high-resolution display may be implemented. Appearance defects and reliability degradation due to generation of Sn particles may be prevented.

Hereinafter, a method of manufacturing a double-sided flexible printed circuit board according to the embodiments is described with reference to FIG. 9 to FIG. 12. The manufacturing method of a flexible circuit board may include preparing a substrate having a thickness of 12 μm to 125 μm, forming a wiring pattern layer having a thickness of 1 μm to 20 μm on one surface of the substrate, forming a first plating layer having a thickness of 0.1 μm or less on an area except for a bending area on the first wiring pattern layer, providing a protective layer having a thickness of 1 μm to 20 μm so as to cover the first wiring pattern layer and a part of the first plating layer on the bending area, and providing a second plating layer having a thickness of 1 μm or less in an area except for the area where the protective layer is provided on the first plating layer. Forming the first plating layer in an area except for the bending area on the wiring pattern layer may include providing a masking layer at the bending area on the wiring pattern layer, plating the first plating layer on the non-bending area, and removing the masking layer.

Figure 9:
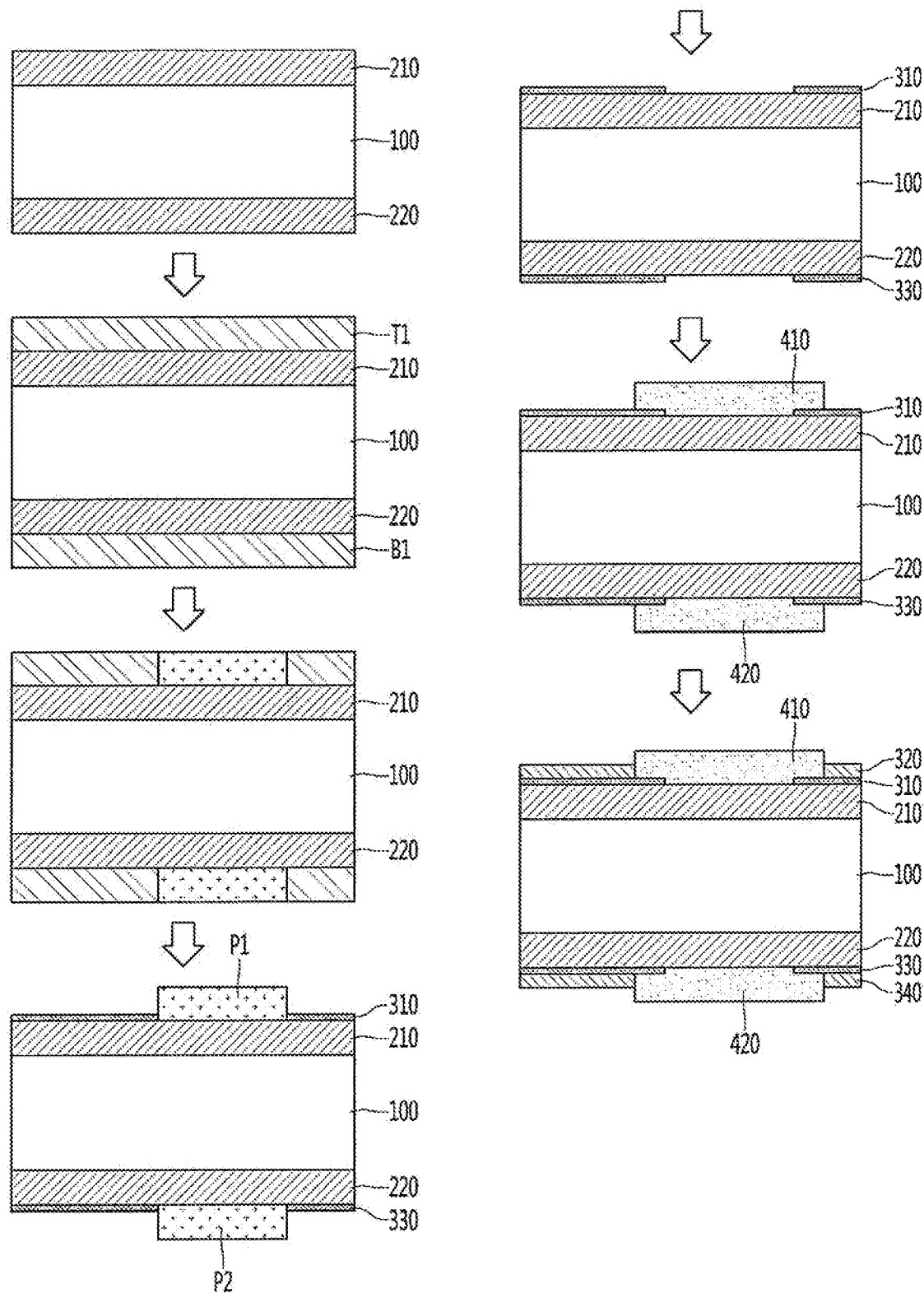
FIG. 9 to FIG. 12 are cross-sectional views of a manufacturing process of the double-sided flexible printed circuit board.

Referring to FIG. 9, a double-sided flexible printed circuit board may be manufactured according to a dry film masking method or a photo solder resist (PSR) printing method. First, a first wiring pattern layer 210 and a second wiring pattern layer 220 may be prepared on both sides of a substrate 100. A circuit may be formed on both surfaces of a substrate 100. The substrate 100 may be a polyimide flexible substrate, and a wiring pattern may include copper.

An upper sacrificial layer T1 may be formed by laminating a dry film on the first wiring pattern layer 210 or by printing a photo solder resist layer. A lower sacrificial layer B1 may be formed by laminating a dry film on the second wiring pattern layer 220 or by printing a photo solder resist layer. Next, a mask may be provided on the upper sacrificial layer T1 and the lower sacrificial layer B1, and an exposure step for exposing ultraviolet rays may be performed.

A development step of removing the unexposed upper sacrificial layer T1 and the lower sacrificial layer B1 may be performed. Accordingly, a patterned upper sacrificial layer P1 and a patterned lower sacrificial layer P2 may be formed. Next, a first plating layer 310 may be formed in a peripheral region of the patterned upper sacrificial layer P1. A third plating layer 330 may be formed in the peripheral region of the patterned lower sacrificial layer P2.

The patterned upper sacrificial layer P1 and the patterned lower sacrificial layer P2 may then be peeled off. A first plating layer 310 and a third plating layer 330 having a first open area may be formed. Each of the first plating layer 310 and the third plating layer 330 may be tin-plated.

Next, first and second protective layers 410 and 420 covering side surfaces and parts of upper surfaces of the first plating layer 310 and the third plating layer 330 may be provided while filling a first open area. Upper surfaces of the first and second protective layers 410 and 420 may have a larger width than that of the bending area.

Next, second and fourth plating layers 320 and 340 may be formed in the peripheral region of the first and second protective layers 410 and 420. The second and fourth plating layers 320 and 340 may be formed in an area where the first and second protective layers 410 and 420 are not provided with a thickness smaller than that of the first and second protective layers 410 and 420. Accordingly, side surfaces of the first and second protective layers 410 and 420 may contact the second and fourth plating layers 320 and 340. Each of the second plating layer 320 and the fourth plating layer 340 may be tin-plated.

Figure 10:
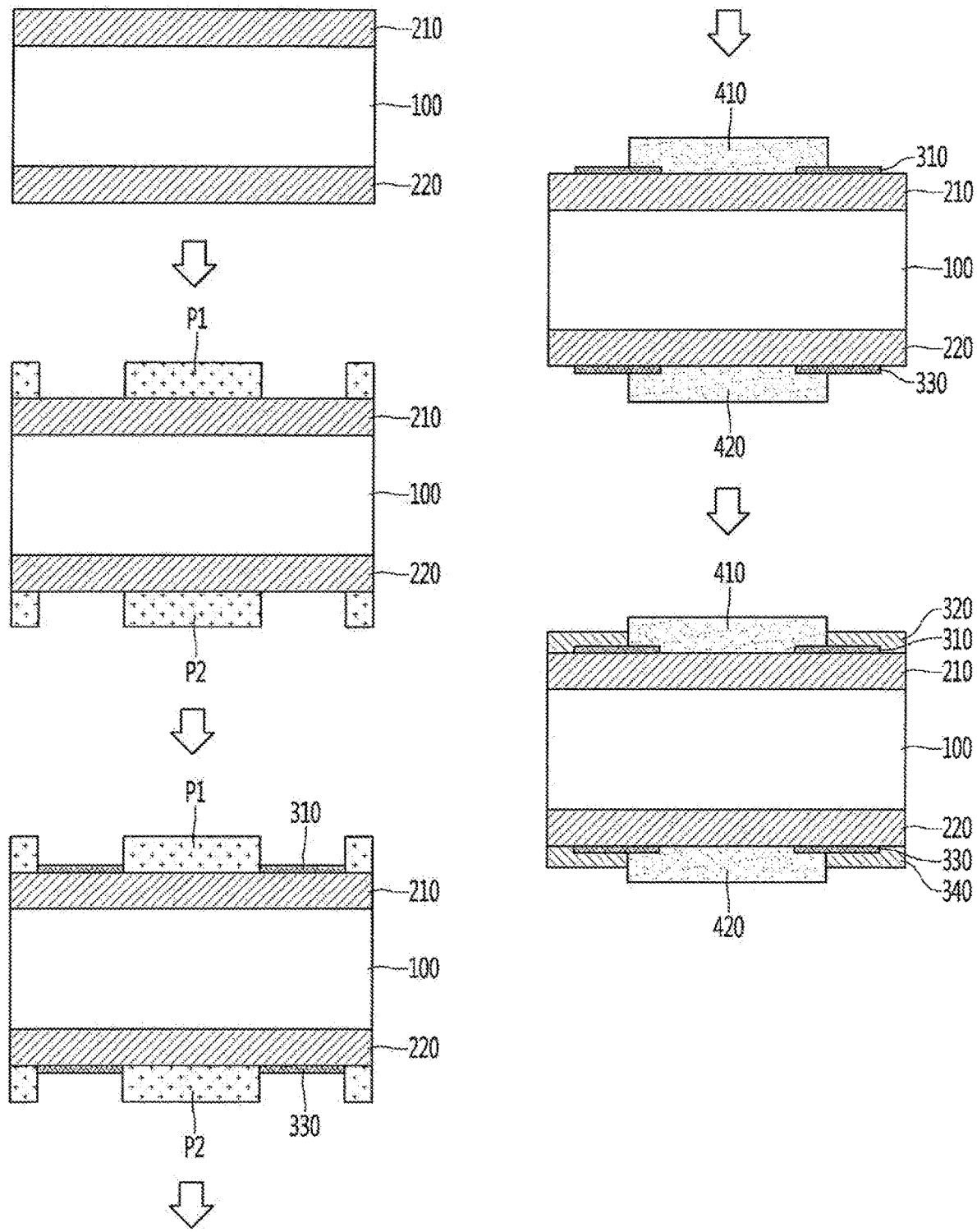

Referring to FIG. 10, a double-sided flexible printed circuit board may be manufactured according to a PET masking method. First, a first wiring pattern layer 210 and a second wiring pattern layer 220 may be prepared on both sides of a flexible substrate 100. A circuit may be formed on both surfaces of a flexible substrate 100. The flexible substrate 100 may be a polyimide flexible substrate, and a wiring pattern may include copper.

Next, a PET masking film may be punched to prepare a PET masking film having a through-hole. A patterned upper sacrificial layer P1 may then be formed by laminating a PET masking film having through holes on the first wiring pattern layer 210. A patterned lower sacrificial layer P2 may be formed by laminating a PET masking film having through holes on the second wiring pattern layer 220.

Next, a first plating layer 310 may be formed in a through hole of the patterned upper sacrificial layer P1. A third plating layer 330 may be formed in a through hole of the patterned lower sacrificial layer P2. The patterned upper sacrificial layer P1 and the patterned lower sacrificial layer P2 may then be peeled off. Accordingly, a first plating layer 310 and a third plating layer 330 having a first open area may be formed. Each of the first plating layer 310 and the third plating layer 330 may be tin-plated.

Next, protective layers 410 and 420 covering side surfaces and parts of upper surfaces of the first plating layer 310 and the third plating layer 330 may be provided while filling the first open area. Upper surfaces of the protective layers 410 and 420 may have a larger width than that of the bending area.

Second and fourth plating layers 320 and 340 may then be formed in the peripheral area of the first and second protective layers 410 and 420. The second and fourth plating layers 320 and 340 may be formed in an area where the protective layers 410 and 420 are not provided with a thickness smaller than that of the protective layer. Side surfaces of the first and second protective layers 410 and 420 may contact the second and fourth plating layers 320 and 340. The second plating layer 320 and the fourth plating layer 340 may be tin-plated respectively.

Figure 11:
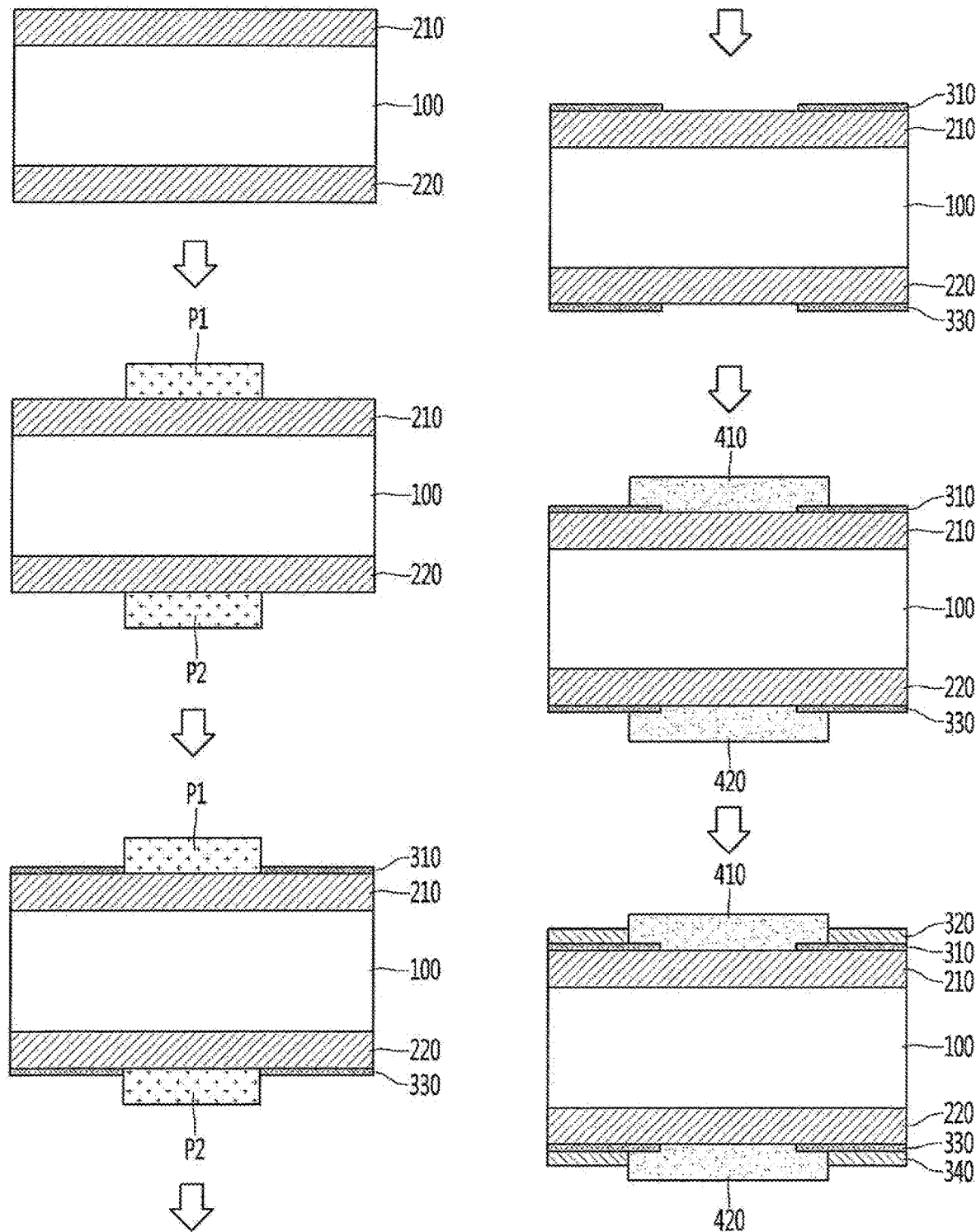

Referring to FIG. 11, a double-sided flexible printed circuit board may be manufactured according to a photoresist (PR) printing or gravure printing method. First, a first wiring pattern layer 210 and a second wiring pattern layer 220 may be prepared on both sides of a flexible substrate 100. A circuit may be formed on both surfaces of a flexible substrate 100. The flexible substrate 100 may be a polyimide flexible substrate, and a wiring pattern may include copper.

Next, a photoresist ink may be applied on the first wiring pattern layer 210 to form a patterned upper sacrificial layer P1. A photoresist ink may be printed on the second wiring pattern layer 220 to form a patterned lower sacrificial layer P2. A first plating layer 310 may be formed in the peripheral region of the patterned upper sacrificial layer P1. A third plating layer 330 may be formed in the peripheral region of the patterned lower sacrificial layer P2. The patterned upper sacrificial layer P1 and the patterned lower sacrificial layer P2 may then be peeled off. A first plating layer 310 and a third plating layer 330 having a first open area may be formed. The first plating layer 310 and the third plating layer 330 may be tin-plated respectively.

Next, first and second protective layers 410 and 420 covering side surfaces and parts of upper surfaces of the first plating layer 310 and the third plating layer 330 may be provided while filling the first open area. Upper surfaces of the protective layers may have a larger width than that of the bending area. Second and fourth plating layers 320 and 340 may then be formed in the peripheral region of the first and second protective layers 410 and 420. The second and fourth plating layers 320 and 340 may be formed in an area where the first and second protective layers 410 and 420 are not provided with a thickness smaller than that of the protective layer. Side surfaces of the protective layers may contact the second and fourth plating layers 320 and 340. The second plating layer 320 and the fourth plating layer 340 may be tin-plated respectively.

Figure 12:
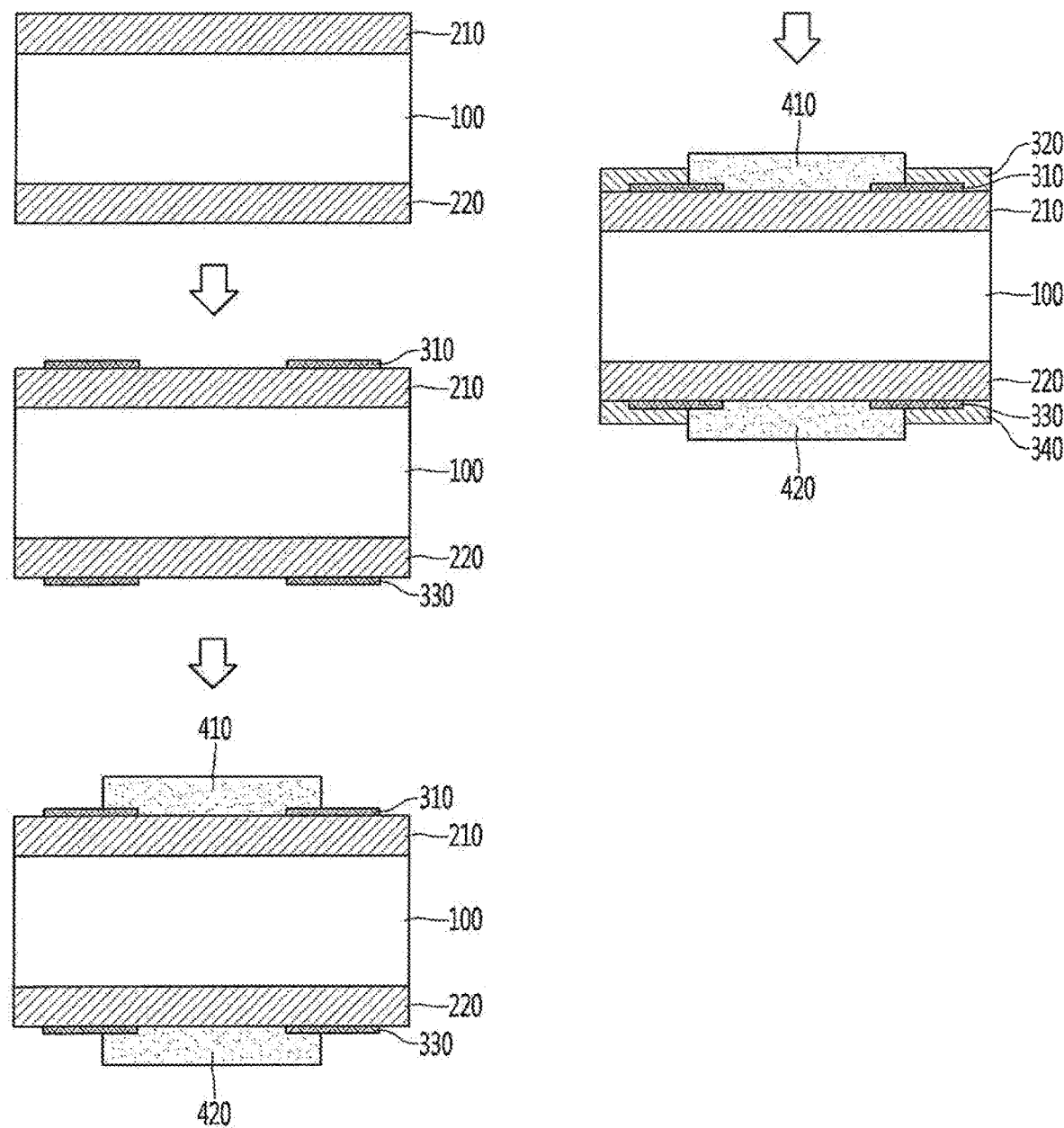

Referring to FIG. 12, a double-sided flexible printed circuit board may be manufactured according to a Spurt Jar plating method. First, a first wiring pattern layer 210 and a second wiring pattern layer 220 may be prepared on both sides of a flexible substrate 100. A circuit may be formed on both surfaces of a flexible substrate 100. The flexible substrate 100 may be a polyimide flexible substrate, and a wiring pattern may include copper.

Next, a first plating layer 310 and a third plating layer 330 having a first open area may be formed in an area corresponding to a bending area by performing Spurt Jar plating. The first plating layer 310 and the third plating layer 330 may be tin-plated respectively. Protective layers covering side surfaces and parts of upper surfaces of the first plating layer 310 and the third plating layer 330 may be provided while filling the first open area. Upper surfaces of the protective layers may have a larger width than that of the bending area.

Second and fourth plating layers 320 and 340 may then be formed in the peripheral region of the first and second protective layers 410 and 420. The second and fourth plating layers 320 and 340 may be formed in an area where the first and second protective layers 410 and 420 are not provided with a thickness smaller than that of the protective layer. Side surfaces of the protective layers may contact the second and fourth plating layers 320 and 340. The second plating layer 320 and the fourth plating layer 340 may be tin-plated respectively.

Referring to FIG. 13 to FIG. 20, a flexible circuit board according to another embodiment may include a substrate 100, a wiring pattern layer 200 provided on the substrate 100, a plating layer 300, and a protective layer 400. Same drawing symbols or labels may be assigned to the same compositions as those of the previous embodiment described above, and redundant description has been omitted.

The flexible circuit board may include a substrate 100 having a bending area BA and a non-bending area NBA, a wiring pattern layer 200 provided on a bending area and a non-bending area on the substrate 100, a plating layer 300 provided on the wiring pattern layer and including open areas OA1 and OA2 in an area corresponding to the bending area, and a protective layer 400 directly contacting one surface of the wiring pattern layer 200 exposed at the open areas OA1 and OA2 and a side surface of the plating layer 300. The protective layer 400 may be provided to have a larger thickness than a thickness of the plating layer 300.

An upper protective layer 412 and a lower protective layer 411 may be provided in two layers on a same surface of the substrate 100. The upper protective layer 412 may have a larger width than a width of the lower protective layer 411. On the same surface of the substrate 100, two protective layers having different shapes may be provided.

Figure 13:
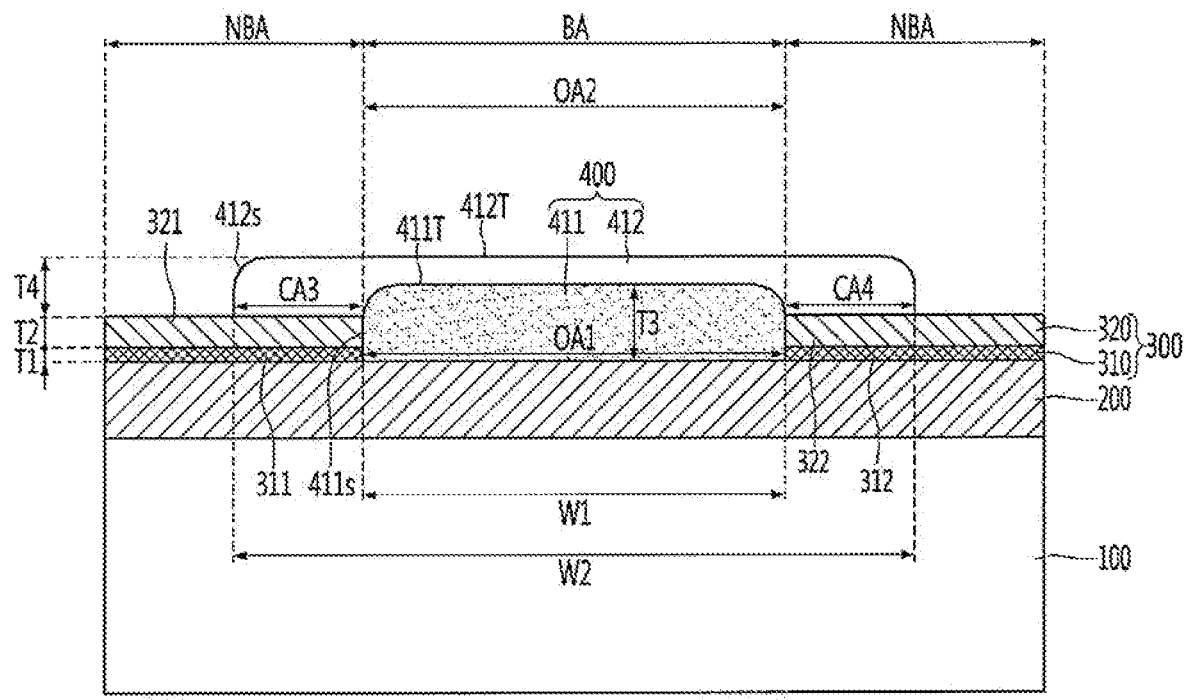
FIG. 13 to FIG. 20 are various cross-sectional views of a flexible circuit board according to another embodiment.
Figure 15:
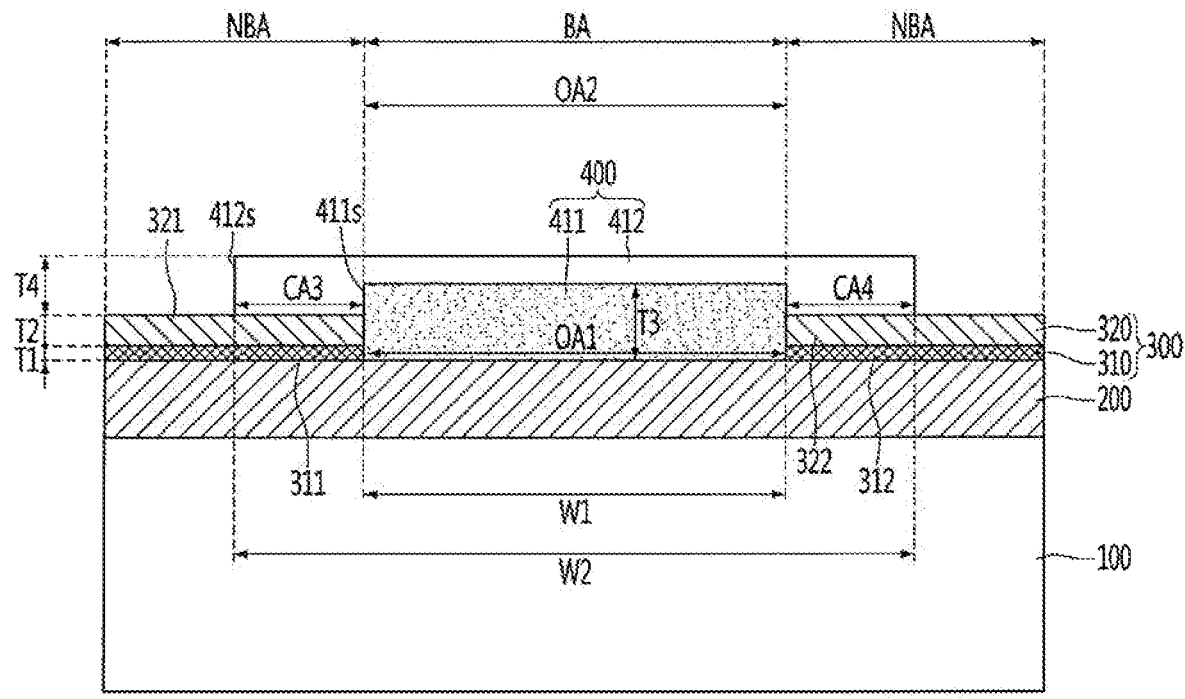
Figure 16:
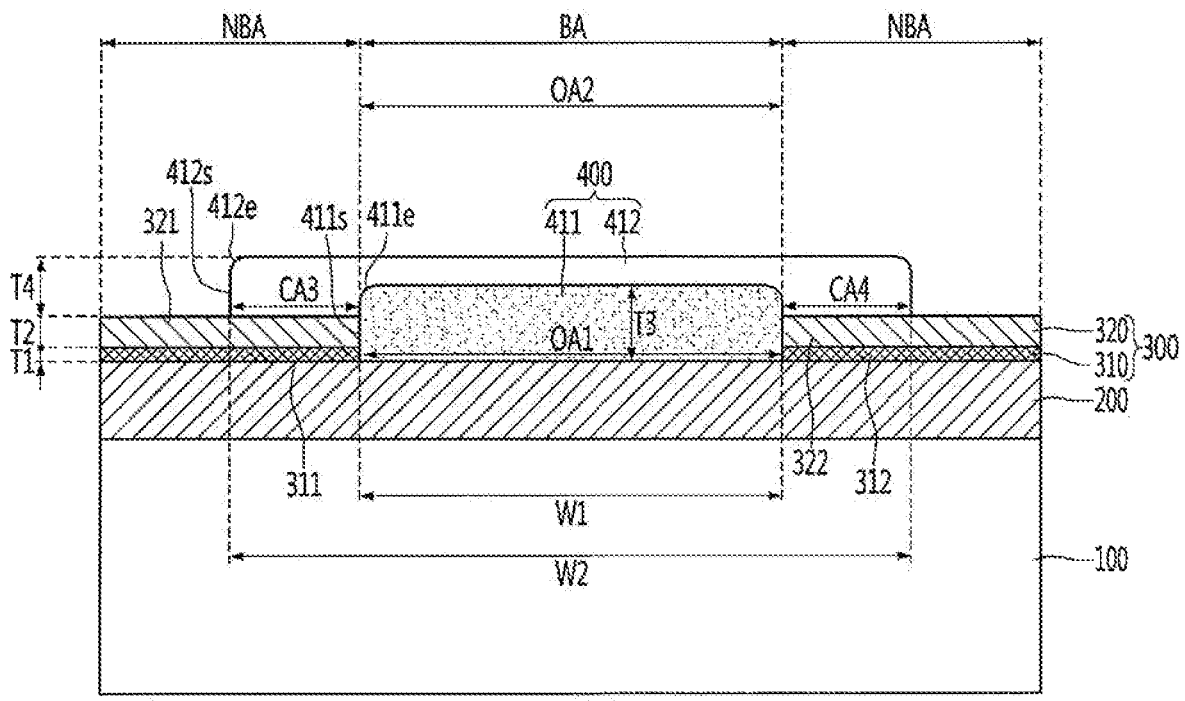

Referring to FIG. 13, FIG. 15, and FIG. 16, the width of the second open area OA2 of the second plating layer 320 may correspond to the width of the first open area OA1 of the first plating layer 310. The area of the second plating layer 320 may be the same as the area of the first plating layer 310. A planar area of the second plating layer 320 may correspond to a planar area of the first plating layer 310.

A lower protective layer 411 may be provided on one surface of a wiring pattern layer 200 exposed by the first open area OA1 and the second open area OA2. A width W1 of the lower protective layer 411 provided on the first open area OA1 may correspond to a width W1 of the lower protective layer 411 provided on the second open area OA2.

Figure 14:
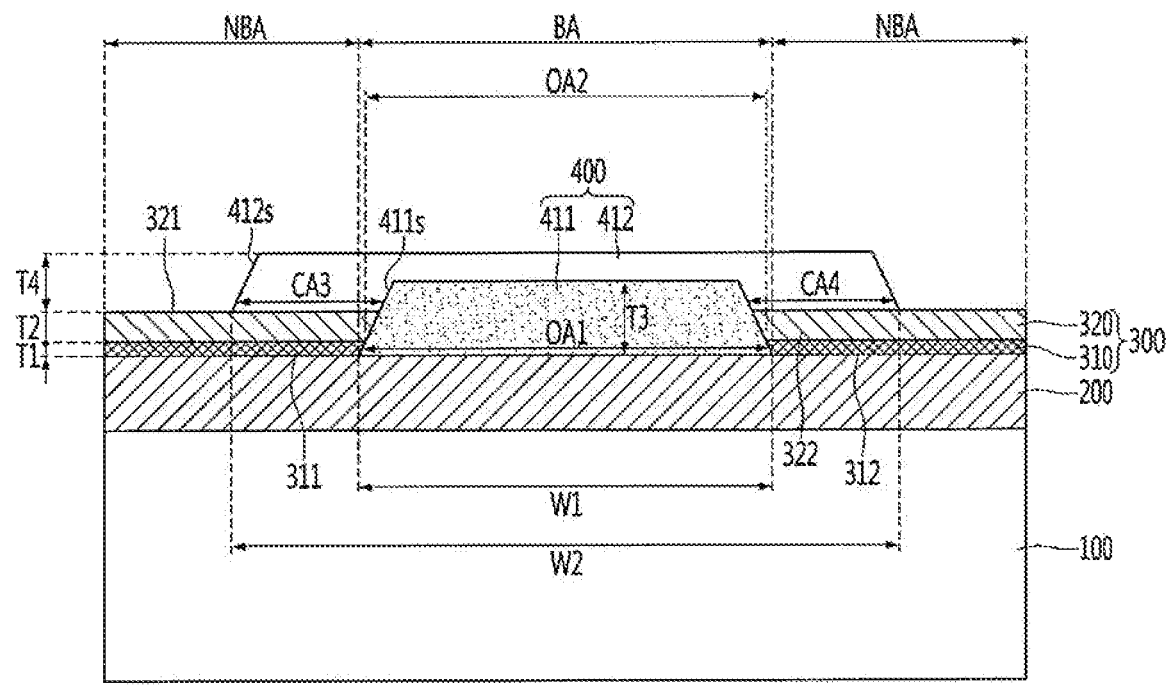

Alternatively, referring to FIG. 14, the width of the first open area OA1 may be similar to the width of the second open area OA2. The width of the first open area OA1 may be larger than the width of the second open area OA2 due to the inclined surface of the lower protective layer 411. The area of the second plating layer 320 may be larger than that of the first plating layer 310. The second plating layer 320 may have a larger planar area than that of the first plating layer 310.

A lower protective layer 411 may be provided on one surface of a wiring pattern layer 200 exposed by the first open area OA1 and the second open area OA2. A width W1 of the lower protective layer 411 provided on the first open area OA1 may be larger than a width W1 of the lower protective layer 411 provided on the second open area OA2 due to an inclined surface 411s of the lower protective layer 411.

For example, referring to FIG. 17 to FIG. 20, the second plating layer 320 may be partially provided on the first plating layer 310. The second plating layer 320 may be provided on an area of the first plating layer 310 except for an area where the lower protective layer 411 is provided on the first plating layer 310. The second plating layer 320 may be provided on an area of the first plating layer 310 except for the area where the lower protective layer 411 is provided on the first plating layer 310.

The second plating layer 320 may be partially provided on the first plating layer 310. For example, the second plating layer 320 may be provided on an area corresponding to the non-bending area NBA except for the bending area on the first plating layer 310. The second plating layer 320 may not be provided on the bending area BA. For example, the second plating layer 320 may be provided on an area corresponding to the non-bending area NBA on the first plating layer 310 and on an area corresponding to at least a part of the bending area BA. The second plating layer 320 may be partially provided on the non-bending area NBA and the bending area BA.

The second plating layer 320 may include a second open area OA2. For example, the width of the second open area OA2 may be larger than that of the bending area BA. A side surface of the second plating layer 320 may be spaced apart at a boundary region between the bending area BA and the non-bending area NBA. For example, the width of the second open area OA2 may correspond to the width of the bending area BA. For example, the width of the second open area OA2 may be smaller than the width of the bending area BA. The second plating layer 320 may be spaced apart from each other by the second open area OA2. For example, a second pattern plating layer 321 may not be connected to a second pattern plating layer 322.

The width of the first open area OA1 may be different from the width of the second open area OA2. The width of the first open area OA1 may be smaller than the width of the second open area OA2. The area of the second plating layer 320 may be smaller than that of the first plating layer 310. The second plating layer 320 may have a smaller planar area than a planar area of the first plating layer 310.

A lower protective layer 411 may be provided on the first open area OA1 and the second open area OA2. A width W1a of the lower protective layer 411 provided on the first open area OA1 may be smaller than a width W1b of the lower protective layer 411 provided on the second open area OA2.

The plating layer 300 may have a two-layer structure. The first plating layer 310 and the second plating layer 320 may be sequentially provided on the wiring pattern layer 200. The first plating layer 310 and the second plating layer 320 may be formed as two layers on the wiring pattern layer 200 in order to prevent formation of whiskers. Accordingly, a short circuit among the patterns of the wiring pattern layer 200 may be prevented.

The plating layer 300 may include tin (Sn). For example, the first plating layer 310 and the second plating layer 320 may include tin (Sn). The wiring pattern layer 200 may be formed of copper (Cu), and the first plating layer 310 and the second plating layer 320 may be formed of tin (Sn). When the plating layer 300 includes tin (Sn), oxidation of the wiring pattern layer 200 may be prevented due to excellent corrosion resistance of tin (Sn). The first plating layer 310 and the second plating layer 320 are formed of the same tin (Sn), but may be formed in a separate process. An electrical conductivity of the plating layer 300 may be lower than electrical conductivity of the wiring pattern layer 200. The plating layer 300 may be electrically connected to the wiring pattern layer 200.

Referring to FIG. 13 to FIG. 16, a process may be performed such that a lower protective layer 411, such as an insulating pattern, may be coated, the first plating layer 310 may be plated with tin (Sn), then the second plating layer 320 may be plated with tin (Sn), and an upper protective layer 412, such as an insulating pattern, may be provided. Referring to FIG. 17 to FIG. 20, a process may be performed such that the first plating layer 310 may be plated with tin (Sn), then a lower protective layer 411, such as an insulating pattern, may be coated, the second plating layer 320 may be plated with tin (Sn), and a upper protective layer 412, such as an insulating pattern, may be provided.

For example, when the manufacturing process of a flexible circuit board according to the embodiments includes a heat treatment process such as thermal curing, a diffusion action of copper (Cu) of the wiring pattern layer 200 or tin (Sn) of the plating layer 300 may occur. As a diffusion concentration of copper (Cu) decreases from the first plating layer 310 to a surface of the second plating layer 320, a content of copper (Cu) may be reduced. A content of tin (Sn) may increase from the first plating layer 310 to the surface of the second plating layer 320.

The protective layer 400 may include a lower protective layer 411 and an upper protective layer 412. The lower protective layer 411 may be provided on an area corresponding to a bending area BA of the wiring pattern layer 200, and the upper protective layer 412 may be sequentially provided on the lower protective layer 411.

Referring to FIG. 13 to FIG. 16, the lower protective layer 411 may cover an upper surface of the wiring pattern layer 200 on an area corresponding to the bending area BA, and may be provided to have a width corresponding to the bending area BA. However, the embodiment is not limited thereto, and the width of the lower protective layer 411 may be smaller than the width of the bending area BA or larger than the width of the bending area BA.

The lower protective layer 411 may be in contact with the wiring pattern layer 200, the first plating layer 310, and the second plating layer 320. The lower protective layer 411 may contact an upper surface of the wiring pattern layer 210 on an area corresponding to the bending area BA, a side surface of the first plating layer 310, and a side surface of the second plating layer 320. The lower protective layer 411 may directly contact an upper surface of the wiring pattern layer 210 exposed at an open area, the side surface of the first plating layer 310, and the side surface of the second plating layer 320. As the lower protective layer 411 may directly contact the wiring pattern layer 200, the first plating layer 310, and the second plating layer 320 simultaneously, removal of the lower protective layer 411 may be prevented, thereby improving reliability of the flexible circuit board.

Alternatively, referring to FIG. 17 to FIG. 20, a part of the lower protective layer 411 may cover an upper surface of the first plating layer 310. For example, a part of the lower protective layer 411 may cover an upper portion of the first plating layer 310 extending from the bending area BA to the non-bending area NBA. However, the embodiment is not limited thereto, and an open upper surface of the lower protective layer 411 may be located in the bending area BA and/or the non-bending area NBA.

One surface and another surface opposite to the one surface of the lower protective layer 411 may be provided on the bending area BA. Alternatively, one surface and the other surface opposite to the one surface of the lower protective layer 411 may be provided on a boundary region between the bending area BA and the non-bending area NBA. Alternatively, one surface and the other surface opposite to the one surface of the lower protective layer 411 may be provided on the non-bending area NBA. Accordingly, stresses that may occur during bending may be dispersed at two different interfaces. Due to the lower protective layer 411, stresses that may occur during bending may be dispersed at an interface between the lower protective layer 411 and the first plating layer 310, and at an interface between the lower protective layer 411 and the second plating layer 320. Accordingly, it may be possible to prevent damage due to cracking of the flexible circuit board, and thus reliability may be improved.

The lower protective layer 411 may cover an upper surface of the wiring pattern layer 200 on the bending area BA and a part of the first plating layer 310, and may be provided to have a larger width than the width of the first open area OA1. The lower protective layer 411 may be in contact with the wiring pattern layer 200, the first plating layer 310, and the second plating layer 320. The lower protective layer 411 may be in contact with an upper surface of the wiring pattern layer 200 on the bending area BA, a part of an upper surface of the first plating layer 310, and the second plating layer 320.

The lower protective layer 411 may be in direct contact with an upper surface of the wiring pattern layer 200 exposed at an open area, an upper surface and a side surface of the first plating layer 310, and a side surface of the second plating layer 320. As the lower protective layer 411 may be in direct contact with the wiring pattern layer 200, the first plating layer 310, and the second plating layer 320 simultaneously, removal of the lower protective layer 411 may be prevented, thereby improving reliability of the flexible circuit board.

The lower protective layer 411 may cover one side surface and the upper surface of the first plating layer 310. Accordingly, a contact area between the lower protective layer 411 and the first plating layer 310 may be increased. An adhesive strength of the lower protective layer 411 to the first plating layer 310 may be increased, thereby improving reliability.

The lower protective layer 411 may overlap the first plating layer 310. The lower protective layer 411 may overlap the first plating layer 310 on the bending area BA and/or the non-bending area NBA. A first overlapping region CA1 may be a region in which the first pattern plating layer 311 and the lower protective layer 411 may be in contact with each other, and a second overlapping region CA2 may be a region in which the first pattern plating layer 312 and the lower protective layer 411 may be in contact with each other.

A width of the first overlapping region CA1 or the second overlapping region CA2 may be 400 μm or more. The width of the first overlapping region CA1 or the second overlapping region CA2 may be smaller than the width of the bending area BA. For example, the widths of the first overlapping region CA1 and the second overlapping region CA2 may be smaller than the width of the bending area BA. The widths of the first overlapping region CA1 and the second overlapping region CA2 may be corresponding to or different from each other.

Figure 17:
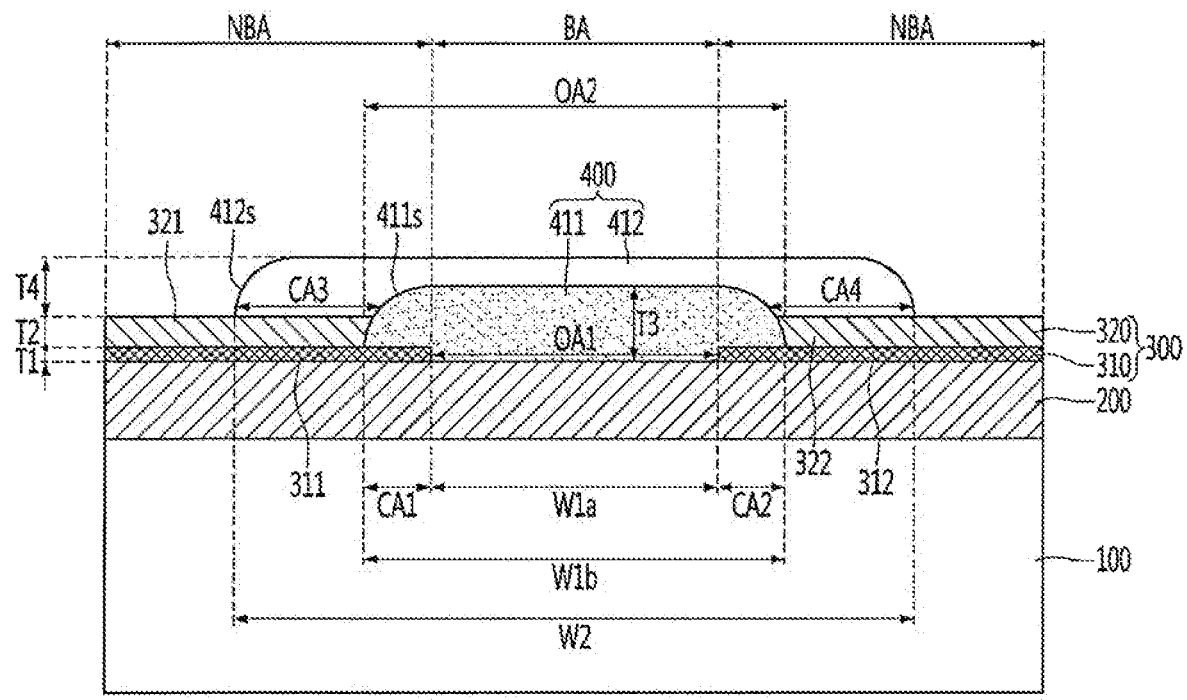
Figure 18:
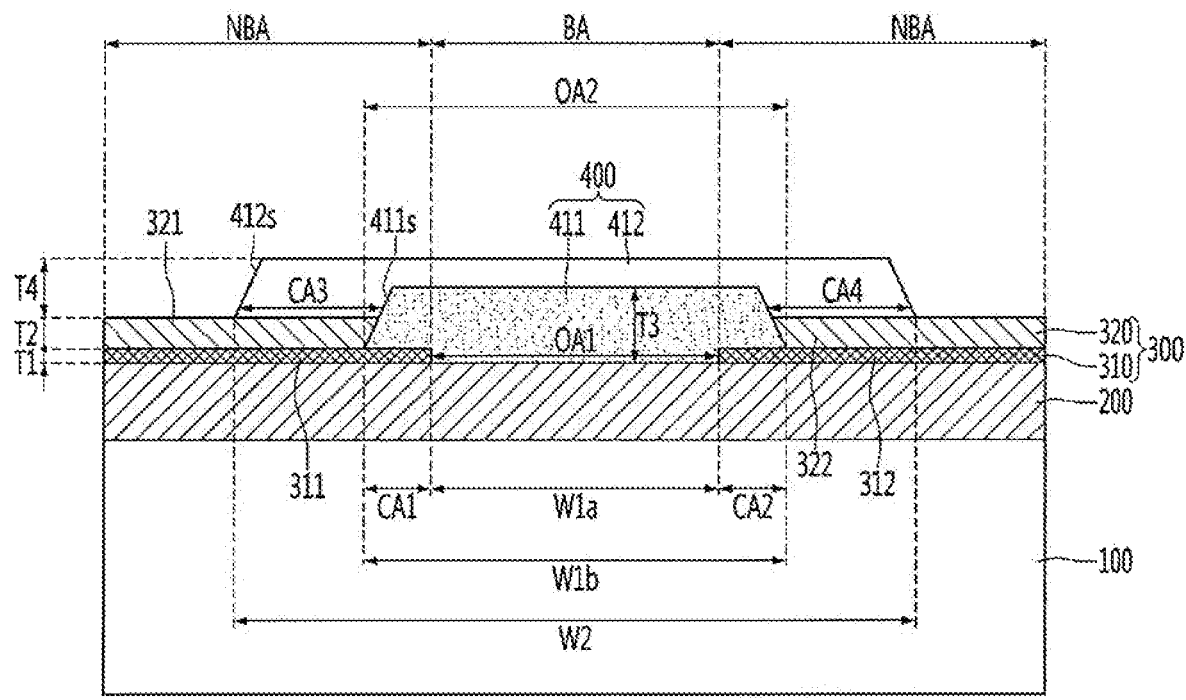
Figure 19:
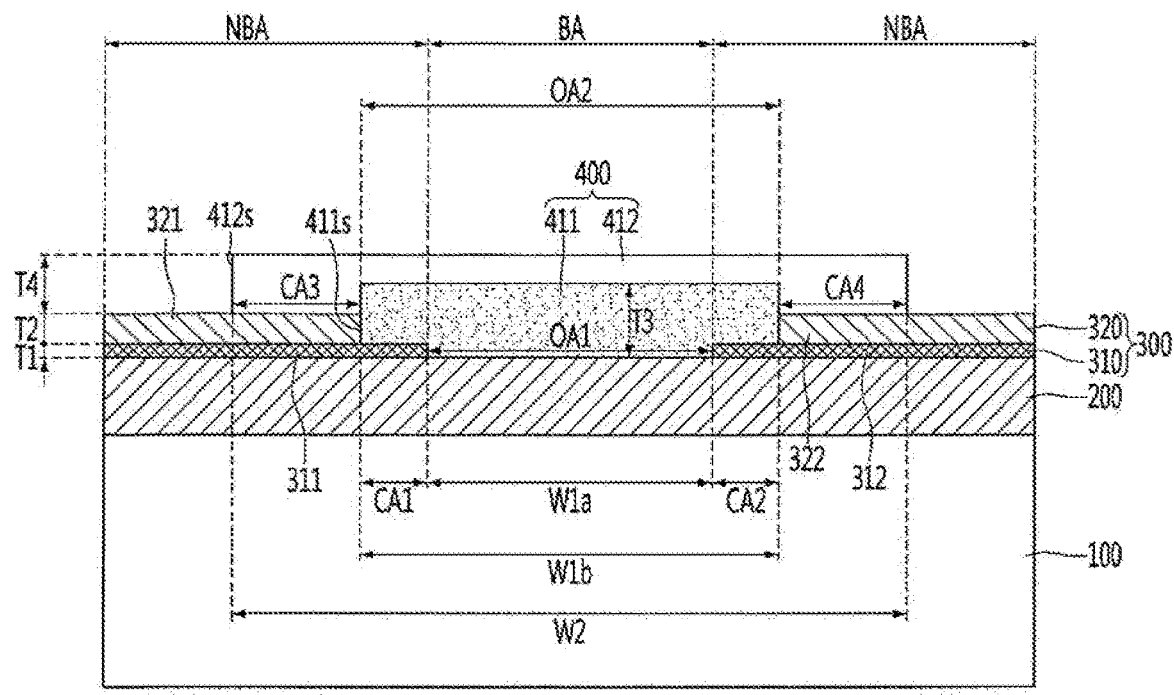
Figure 20:
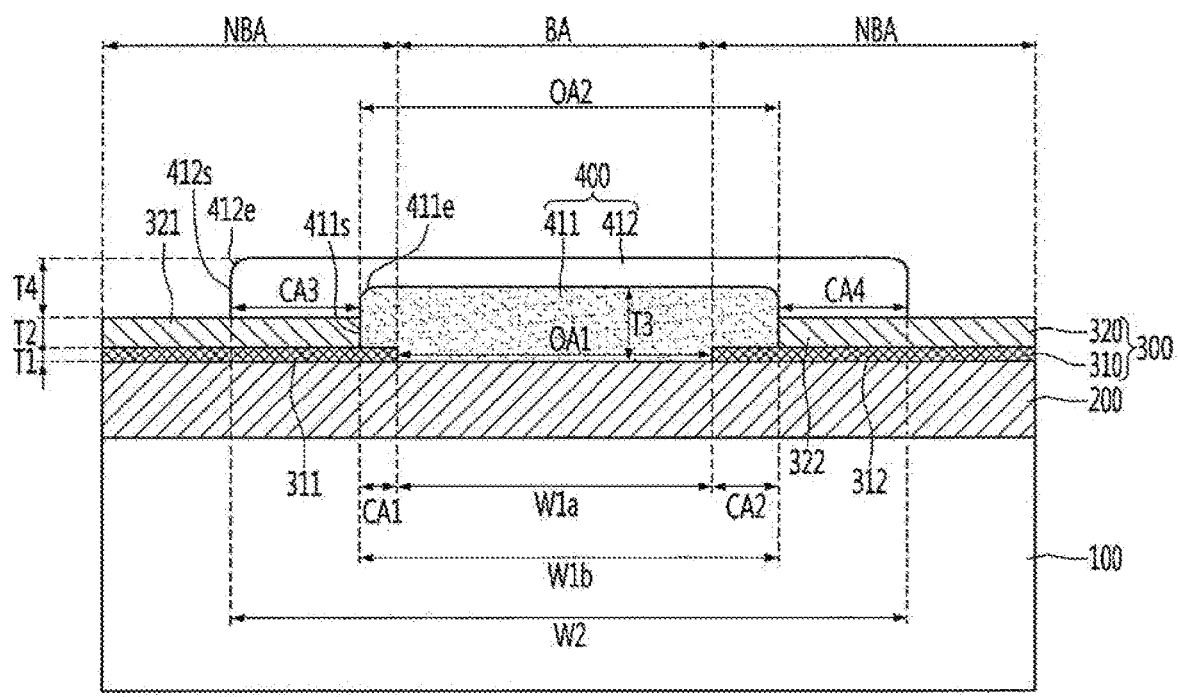

Referring to FIGS. 17 to 19, the width of the first overlapping region CA1 may be equal to that of the second overlapping region CA2. Referring to FIG. 20, the width of the first overlapping region CA1 may be different from the width of the second overlapping region CA2. The width of the first overlapping region CA1 may be smaller than the width of the second overlapping region CA2.

A side surface 411S of the lower protective layer 411 may have various cross-sectional shapes. The side surface 411S of the lower protective layer 411 may include an inclined surface or a vertical surface. Referring to FIGS. 12 and 16, the side surface 411S of the lower protective layer 411 may include a first inclined surface. As a result, a contact area of the lower protective layer 411 with the second plating layer 320 may be increased, and thus removal of the lower protective layer 411 may be prevented.

The side surface 411S of the lower protective layer 411 may include a curved first inclined surface. For example, the inclination angle of the side surface 411S of the lower protective layer 411 with respect to the first plating layer 310 may be increased as the side surface 411S becomes closer to the first plating layer 310. The side surface 411S of the lower protective layer 411 may have or be at an acute angle with respect to the first plating layer 310.

Alternatively, referring to FIGS. 14 and 18, the side surface 411S of the lower protective layer 411 may include a first inclined surface. The side surface 411S of the lower protective layer 411 may include a straight first inclined surface. For example, the inclination angle of the side surface 411S of the lower protective layer 411 with respect to the first plating layer 310 may be constant regardless of distance from the first plating layer 310. The side surface 411S of the lower protective layer 411 may have or be at an acute angle with respect to the first plating layer 310.

Alternatively, referring to FIGS. 15 and 19, the side surface 411S of the lower protective layer 411 may include a vertical surface. The side surface 411S of the lower protective layer 411 may include a straight first inclined surface. For example, the inclination angle of the side surface 411S of the lower protective layer 411 with respect to the first plating layer 310 may be at 90 degrees or the like.

Alternatively, referring to FIGS. 16 and 20, the side surface 411S of the lower protective layer 411 may include a vertical surface. The side surface 411S of the lower protective layer 411 may include a straight first inclined surface. For example, the inclination angle of the side surface 411S of the lower protective layer 411 with respect to the first plating layer 310 may be at 90 degrees or the like. A corner 411e that connects an upper surface and a side surface of the lower protective layer 411 may have a curvature. Accordingly, the upper surface of the lower protective layer 411 may be connected to the side surface thereof with a curved surface. Since the lower protective layer 411 may have strong adhesiveness, an inclined surface and/or an edge may have a curvature, thereby having a round shape.

The first inclined surface of the lower protective layer 411 may be in contact with a side surface of the first plating layer and a side surface of the second plating layer. The first inclined surface may be provided in the bending area BA or the non-bending area NBA.

A thickness T3 of the lower protective layer 411 may be larger than a thickness T2 of the second plating layer 320. Accordingly, the upper surface of the lower protective layer 411 may be provided higher than the upper surface of the second plating layer 320. The upper surface of the lower protective layer 411 may be provided higher than the upper surface of the second plating layer 320, and thus the lower protective layer 411 may have a step with the second plating layer 320.

The thickness T3 of the lower protective layer 411 in the bending area BA may be 1 µm to 20 µm. For example, the thickness T3 of the lower protective layer 411 in the bending area BA may be 5 µm to 20 µm.

Referring to FIGS. 17 to 20, the thickness T3 of the lower protective layer 411 in the bending area BA may be different from the thickness of the lower protective layer 411 in the non-bending area NBA. The thickness of the lower protective layer 411 in the open area may be larger than the thickness of the lower protective layer 411 on the first overlapping region CA1. The thickness of the lower protective layer 411 on the open area may be larger than the thickness of the lower protective layer 411 on the second overlapping region CA2.

The lower protective layer 411 may be integrally formed. Accordingly, removal of the lower protective layer 411 may be prevented, and thus reliability of the flexible circuit board may be improved. When the flexible circuit board is bent, stress due to tension may be dispersed entirely in the lower protective layer 411 integrally formed, and thus reliability may be improved. The efficiency of the process of forming the flexible circuit board may be improved.

The upper protective layer 412 may cover the lower protective layer 411 and the second plating layer 320, and may be provided wider than the lower protective layer 411. The upper protective layer 412 may be provided to cover the upper surface of the lower protective layer 411. For example, the upper protective layer 412 may have a larger width than the width of the bending area BA. One surface and another surface opposite to the one surface of the upper protective layer 412 may be provided on an area NBA other than the bending area BA. The upper protective layer 412 may be provided entirely on the lower protective layer 411, and may be provided on the second plating layer 320 located in a peripheral region thereof. Accordingly, the upper protective layer 412 may relieve stress concentration at an interface between the lower protective layer 411 and the second plating layer 320. Occurrences of removal of a film or crack that may occur during bending of the flexible circuit board may be reduced. However, the embodiment is not limited thereto, and the upper protective layer 412 may have a width corresponding to the bending area BA or may have a width smaller than the bending area BA.

The upper protective layer 412 may be in contact with the upper surfaces of the lower protective layer 411 and the second plating layer 320. The upper protective layer 412 may be in contact with the upper surface of the lower protective layer 411 on the area corresponding to the bending area BA and the upper surface of the second plating layer 320 on the non-bending area NBA.

The upper protective layer 412 may entirely cover the upper surface of the lower protective layer 411. The upper protective layer 412 may prevent, for example, moisture and foreign matters from infiltrating into an interface between the lower protective layer 411 and the plating layer 300. Therefore, damage or removal of the wiring pattern layer 200 due to oxidation may be prevented.

The upper protective layer 412 may be provided on the entire upper surface of the lower protective layer 411 and the upper surface of the second plating layer 320 on the non-bending area NBA by extending from the bending area BA on the lower protective layer 411. Accordingly, the upper protective layer 412 may prevent foreign matters from infiltrating due to unevenness of the interface between the lower protective layer 411 and the plating layer 300. Therefore, reliability and lifetime of the flexible circuit board may be improved.

The upper protective layer 412 may include an overlapping region contacting the second plating layer 320. The upper protective layer 412 may overlap the second plating layer 320 on the bending area BA and/or the non-bending area NBA.

A third overlapping region CA3 and a fourth overlapping region CA4 may be regions in which the second plating layer 320 and the upper protective layer 412 may be in contact with each other. The second plating layer 320 may include a second pattern plating layer 321 and a second pattern plating layer 322 spaced apart from each other by a second open area OA2. The third overlapping region CA3 may be a region in which the second pattern plating layer 321 and the upper protective layer 412 may be in contact with each other, and the fourth overlapping region CA4 may be a region in which the second pattern plating layer 322 and the upper protective layer 412 may be in contact with each other.

A width of the third overlapping region CA3 or the fourth overlapping region CA4 may be 400 µm or more. The width of the third overlapping region CA3 or the fourth overlapping region CA4 may be larger than, corresponding to, or less than the width of the bending area BA.

The widths of the overlapping regions CA3 and CA4 may be larger than a sum (T1+T2) of the thicknesses of the first plating layer 310 and the second plating layer 320. The widths of the third overlapping region CA3 and the fourth overlapping region CA4 may be larger than the sum of the thickness T1 of the first plating layer 310 and the thickness T2 of the second plating layer 320.

Since the upper protective layer 412 may be provided on the upper surface of the lower protective layer 411 and on one region of the upper surface of the second plating layer 320, adhesive strength may be increased, thereby improving reliability of the flexible circuit board. The widths of the overlapping regions CA3 and CA4 of the upper protective layer 412 may be larger than at least the thickness of the plating layer 300. Therefore, the flexible circuit board may prevent damage due to deformation caused by tension or compression. The widths of the third overlapping region CA3 and the fourth overlapping region CA4 may be corresponding to or different from each other. The upper protective layer 412 may prevent the lower protective layer 411 from being removed, thereby improving reliability of the flexible circuit board.

A side surface 412s of the upper protective layer 412 may have various cross-sectional shapes. The side surface 412s of the upper protective layer 412 may include an inclined surface or a vertical surface.

For example, referring to FIG. 13 and FIG. 17, the side surface 412s of the upper protective layer 412 may include a second inclined surface. The side surface 412s of the upper protective layer 412 may include a curved second inclined surface. The inclination angle of the side surface 412s of the upper protective layer 412 with respect to the second plating layer 320 may be increased as the side surface 412s becomes closer to the second plating layer 320. The side surface 412s of the upper protective layer 412 may have or be at an acute angle with respect to the second plating layer 320.

Alternatively, referring to FIG. 14 and FIG. 18, the side surface 412s of the upper protective layer 412 may include a second inclined surface. The side surface 412s of the upper protective layer 412 may include a straight second inclined surface. The inclination angle of the side surface 412s of the upper protective layer 412 with respect to the second plating layer 320 may be constant regardless of distance from the second plating layer 320. The side surface 412s of the upper protective layer 412 may have or be at an acute angle with respect to the second plating layer 320.

Alternatively, referring to FIG. 15 and FIG. 19, the side surface 412s of the upper protective layer 412 may include a vertical surface. The side surface 412s of the upper protective layer 412 may include a straight second inclined surface. For example, the inclination angle of the side surface 412s of the upper protective layer 412 with respect to the second plating layer 320 may be at 90 degrees or the like.

Alternatively, referring to FIG. 16 and FIG. 20, the side surface 412s of the upper protective layer 412 may include a vertical surface. The side surface 412s of the upper protective layer 412 may include a straight second inclined surface. The inclination angle of the side surface 412s of the upper protective layer 412 with respect to the second plating layer 320 may have or be at 90 degrees or the like. A corner 412e connecting an upper surface and a side surface of the upper protective layer 412 may have a curvature. Accordingly, the upper surface of the upper protective layer 412 may be connected to the side surface thereof with a curved surface.

A shape of the inclined surface of the lower protective layer 411 may correspond to a shape of the inclined surface of the upper protective layer 412. However, the embodiment is not limited thereto, and the side surfaces of the lower protective layer 411 and the upper protective layer 412 may have different structures or shapes or different curvatures. Since the upper protective layer 412 may have strong adhesiveness, an inclined surface and/or an edge may have a curvature, thereby having a round shape.

The second inclined surface of the upper protective layer 412 may be provided on the second plating layer 320. The second inclined surface of the upper protective layer 412 may be provided on the non-bending area NBA. However, the embodiment is not limited thereto, and the second inclined surface of the upper protective layer 412 may be provided on the bending area BA or on a boundary region between the bending area BA and the non-bending area NBA.

A thickness T4 of the upper protective layer 412 may be larger than the thickness T3 of the lower protective layer 411. Accordingly, an upper surface of the upper protective layer 412 may be provided higher than an upper surface of the lower protective layer 411. Since the upper surface of the upper protective layer 412 is provided higher than the upper surface of the lower protective layer 411, the lower protective layer 411 may have a step with the upper protective layer 412. Therefore, the upper protective layer 412 may improve an adhesion to the lower protective layer 411, thereby preventing moisture infiltration or the like.

A thickness T4 of the upper protective layer 412 in the non-bending area NBA may be larger than that of the upper protective layer 412 in the bending area BA. Alternatively, the thickness T4 of the upper protective layer 412 in the non-bending area NBA may correspond to the thickness of the upper protective layer 412 in the bending area BA. The thickness T4 of the upper protective layer 412 in the non-bending area NBA may be 1 μm to 20 μm. The thickness T4 of the upper protective layer 412 in the non-bending area NBA may be 5 μm to 20 μm.

The upper protective layer 412 may be integrally formed. Accordingly, removal of the upper protective layer 412 may be prevented, and thus reliability of the flexible circuit board may be improved. When the flexible circuit board according to the embodiment is bent, stress due to tension may be dispersed entirely in the upper protective layer 412 integrally formed, and thus reliability may be improved. The efficiency of the process of forming the flexible circuit board may be improved.

With reference to FIG. 21 to FIG. 26, a double-side flexible circuit board according to another embodiment may include: a substrate 100 having a bending area BA and a non-bending area NBA; a first wiring pattern layer 210 provided on the bending area BA and the non-bending area NBA on one surface of the substrate 100; a first plating layer 310 provided on the first wiring pattern layer 210 and including an open area in an area corresponding to the bending area BA; a second plating layer 320 provided on the first plating layer 310; a first protective layer 410 directly contacting one surface of the first wiring pattern layer 210 exposed at the open area, a side surface of the first plating layer 310, and a side surface of the second plating layer 320; a second wiring pattern layer 220 provided on a bending area BA and a non-bending area NBA on another surface opposite to the one surface of the substrate 100; a third plating layer 330 provided on the second wiring pattern layer 220; a fourth plating layer 340 provided on the third plating layer 330; and a second protective layer 420 provided on an area corresponding to the bending area BA on the other surface of the substrate 100. The first protective layer 410 may be provided higher than an upper surface of the second plating layer 320.

At least one protective layer of the first protective layer 410 and the second protective layer 420 may have a thickness of 1 μm to 20 μm. The first protective layer 410 may include an upper first protective layer 412 and a lower first protective layer 411 provided in two layers. An upper portion may be provided relatively far from one surface of the substrate 100, and a lower portion may be provided relatively close to one surface of the substrate 100.

The upper first protective layer 412 may include overlapping regions CA3 and CA4 that contact the second plating layer 320, and widths of the overlapping regions may be greater than a sum of thicknesses of the first plating layer 310 and the second plating layer 320. The lower first protective layer 411 may be in direct contact with the side surface of the first plating layer 310 and the side surface of the second plating layer 320. The upper first protective layer 412 may be in direct contact with an upper surface of the lower first protective layer 411 and an upper surface of the second plating layer 320.

A wiring pattern layer 200 may be provided on both sides of the substrate 100. The wiring pattern layer 200 may include the first wiring pattern layer 210 and the second wiring pattern layer 220. The first wiring pattern layer 210 may be provided on one surface of the flexible substrate 100, and the second wiring pattern layer 220 may be provided on the other surface opposite to the one surface of the flexible substrate 100.

A thickness of the first wiring pattern layer 210 may correspond to a thickness of the second wiring pattern layer 220. The thicknesses of the first wiring pattern layer 210 and the second wiring pattern layer 220 may be 1 μm to 20 μm, respectively. The first plating layer 310 may be provided on the first wiring pattern layer 210. The third plating layer 330 may be provided on the second wiring pattern layer 220.

At least one of the first plating layer 310 and the third plating layer 330 may include a first open area OA1. For example, referring to FIG. 21 to FIG. 23, the first plating layer 310 and the third plating layer 330 may include the first open area OA1, respectively. The first plating layer 310 may include the first open area OA1, and the third plating layer 330 may include the first open area OA1.

Figure 24:
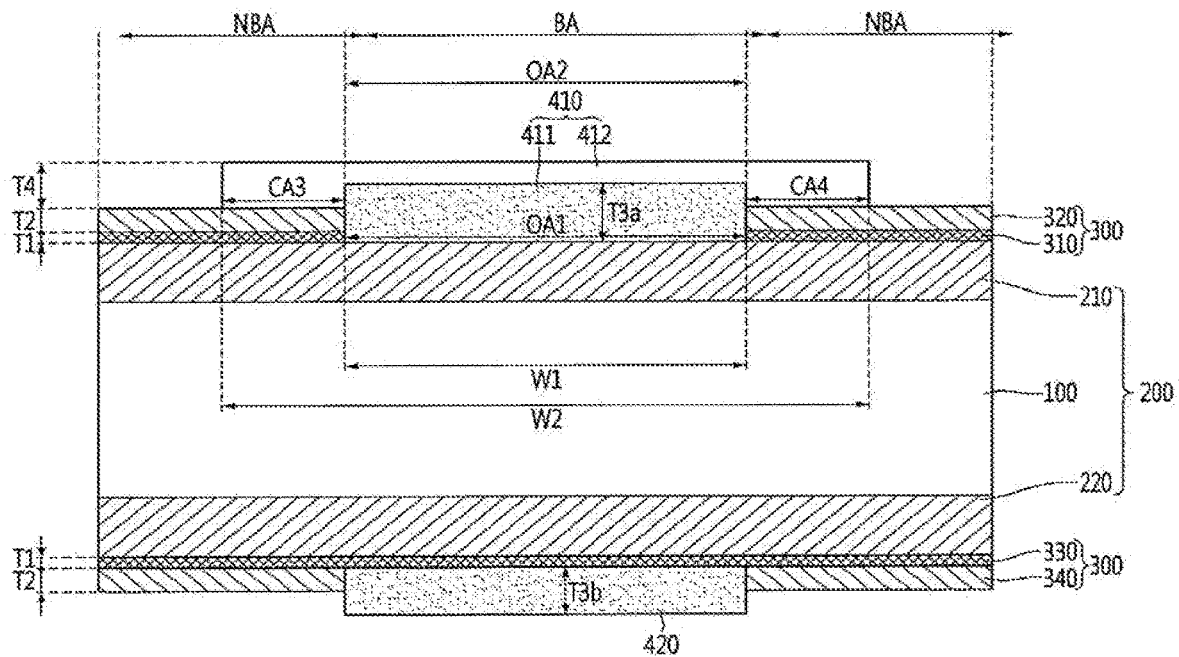
Figure 25:
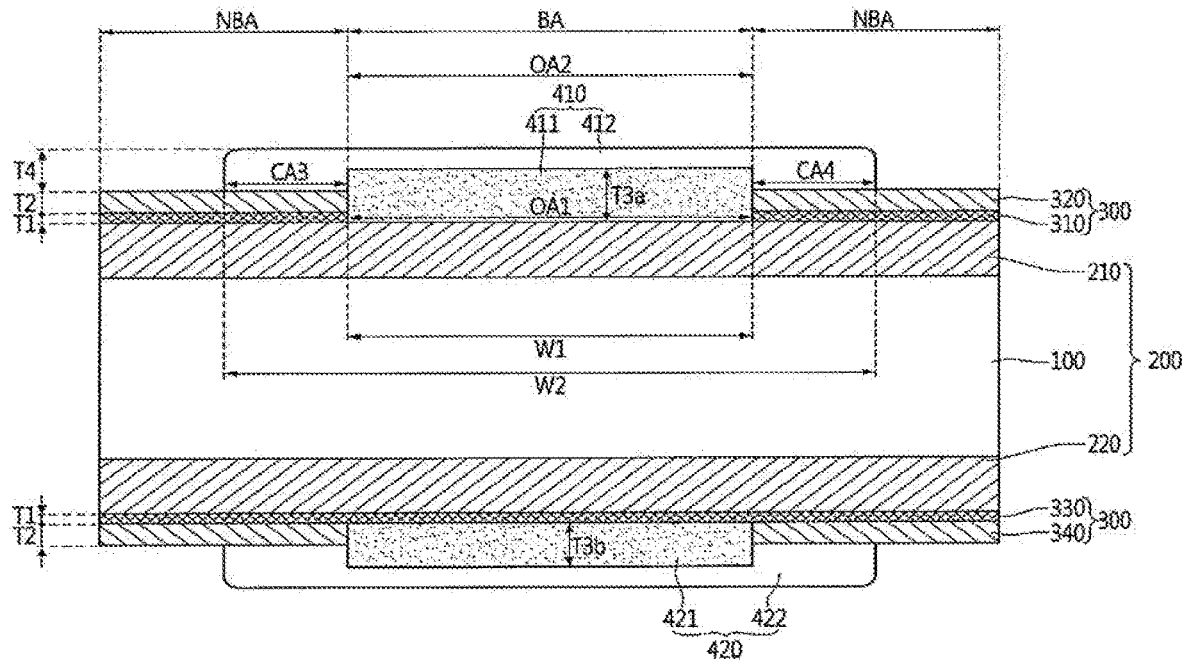
Figure 26:
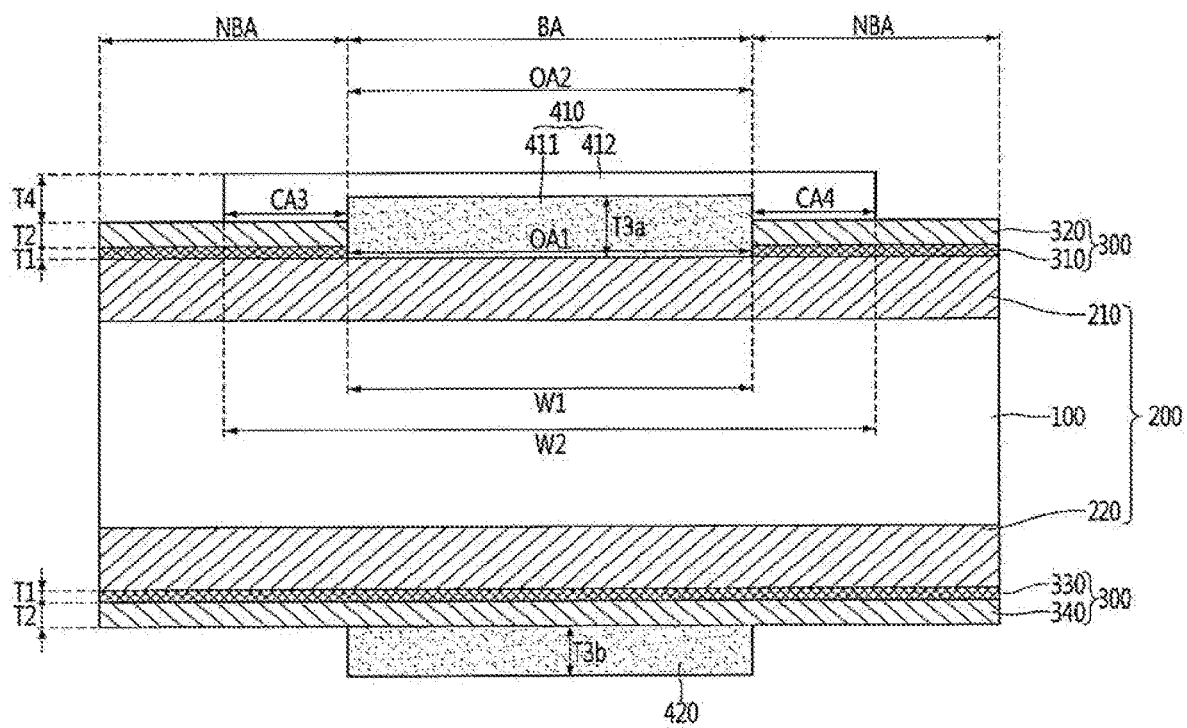

Referring to FIG. 24 to FIG. 26, one of the first plating layer 310 and the third plating layer 330 may include the first open area OA1. The first plating layer 310 may include the first open area OA1.

At least one of the second plating layer 320 and the fourth plating layer 340 may include a second open area OA2. Referring to FIGS. 21 to 25, the second plating layer 320 and the fourth plating layer 340 may include the second open area OA2, respectively. The second plating layer 320 may include the second open area OA2, and the fourth plating layer 340 may include the second open area OA2.

Referring to FIG. 26, one of the second plating layer 320 and the fourth plating layer 340 may include the second open area OA2. The second plating layer 320 may include the second open area OA2. The second protective layer 420 provided on the other surface of the substrate may include one or more layers.

Referring to FIG. 21 to FIG. 23 and FIG. 25, the second protective layer 420 provided on the other surface of the substrate 100 may be provided in two layers. The second protective layer 420 may include an upper second protective layer 422 and a lower second protective layer 421. An upper portion may be provided on a relatively far distance from the other surface of the substrate 100, and a lower portion may be provided relatively close to the other surface of the substrate 100. The upper second protective layer 422 may be in direct contact with the upper surfaces of the lower second protective layer 421 and the fourth plating layer 340.

Figure 21:
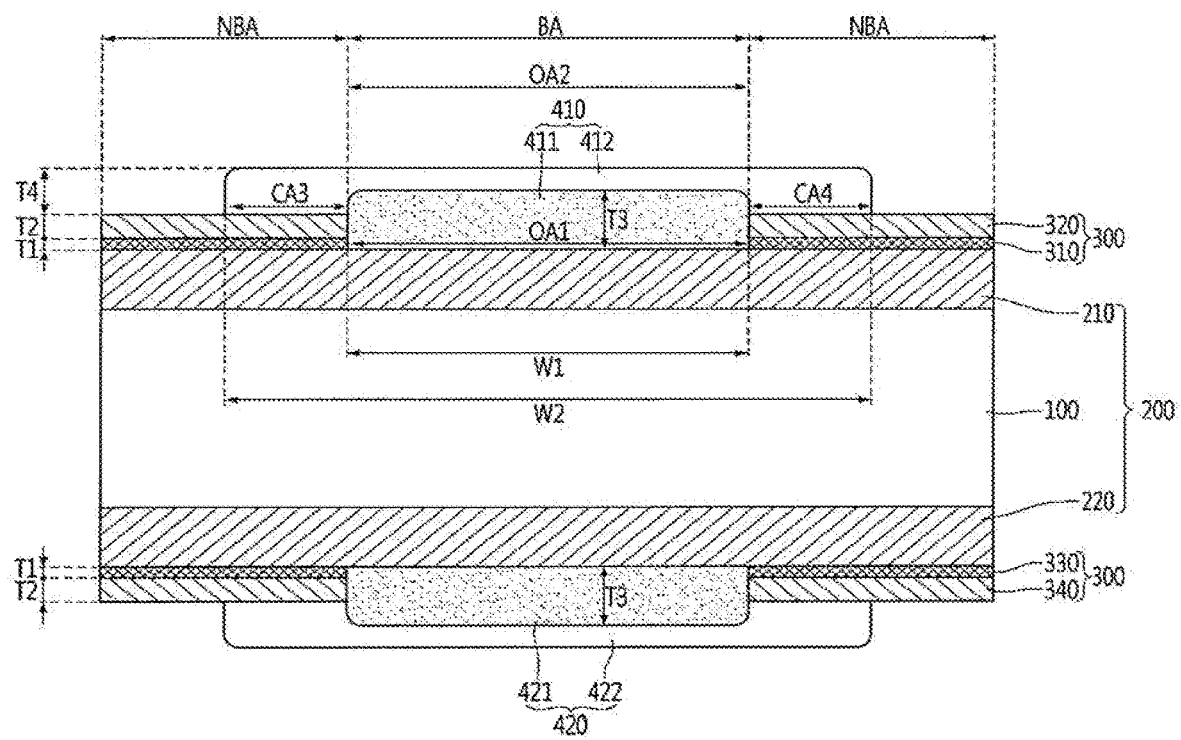
FIG. 21 to FIG. 26 are various cross-sectional views of a double-sided flexible printed circuit board according to another embodiment.
Figure 22:
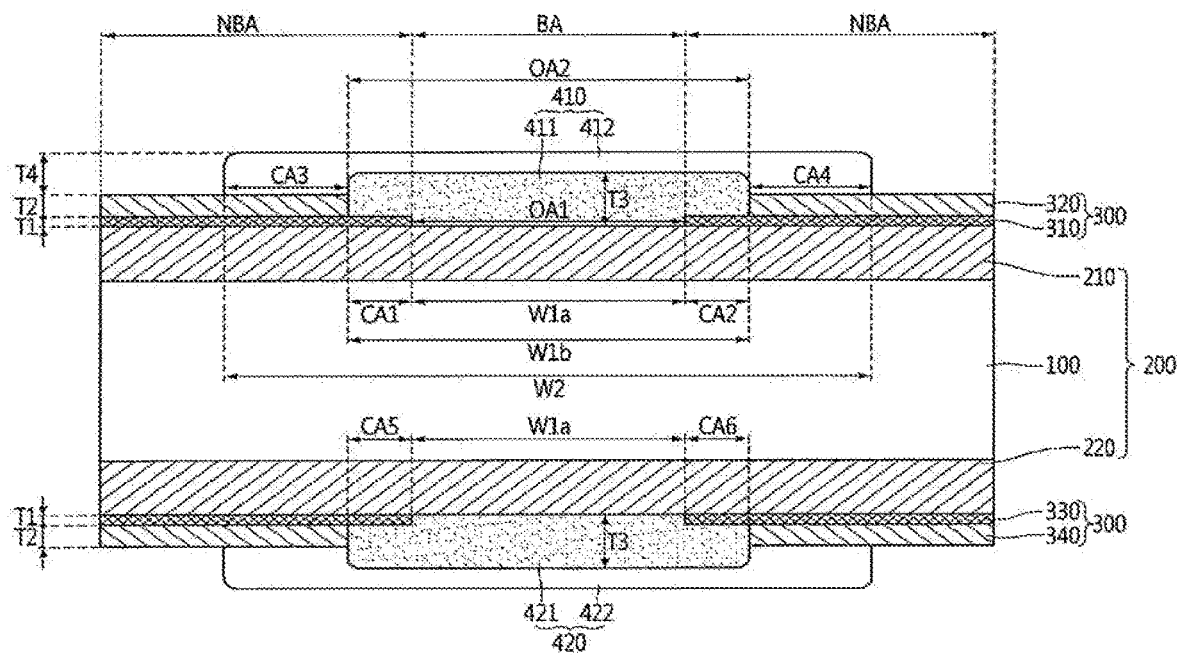
Figure 23:
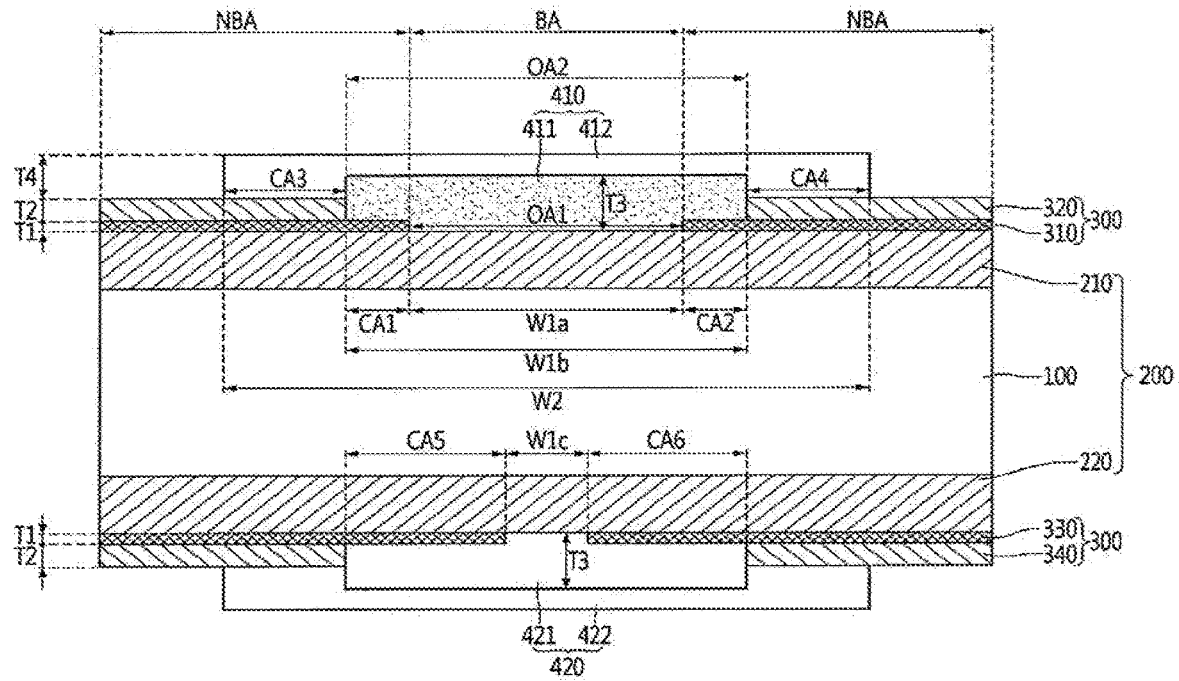

Referring to FIG. 21 to FIG. 23, the open area on one surface of the substrate 100 may be overlapped upward and downward with the open area on the other surface of the substrate 100. Each of the open areas provided on both sides of the substrate 100 may occupy a same region of the substrate 100. Each open area provided on either side of the substrate 100 may be located at least in part of a bending area BA, and may include a portion that overlaps in whole or in part.

Referring to FIG. 23, the third plating layer 330 and the fourth plating layer 340 may include an open area in areas corresponding to the bending area BA, and the second protective layer 420 may contact one surface of the second wiring pattern layer 220. The lower second protective layer 421 may be in contact with one surface of the second wiring pattern layer 220.

Referring to FIG. 21 to FIG. 23, the lower second protective layer 421 may be in contact with an upper surface of the second wiring pattern layer 220, a side surface of the third plating layer 330, and a side surface of the fourth plating layer 340. Referring to FIG. 21, the lower first protective layer 411 and the lower second protective layer 421 may be provided in the bending area. A width W1 of the first open area OA1 may correspond to a width W1 of the second open area OA2.

Alternatively, referring to FIG. 22 to FIG. 23, a part of the lower second protective layer 421 may be in contact with the upper surface of the third plating layer 330 in the non-bending area NBA. A part of the lower first protective layer 411 may extend from the bending area BA to cover an upper part of the first plating layer 310. A part of the lower second protective layer 421 may extend from the bending area BA to cover an upper part of the third plating layer 330. At this point, a width W1a of the first open area OA1 of the first plating layer 310 may be different from a width W1b of the second open area OA2 of the second plating layer 320. The width W1a of the first open area OA1 of the first plating layer 310 may be smaller than the width W1b of the second open area OA2 of the second plating layer 320.

Referring to FIG. 22, the width W1a of the first open area OA1 of the first plating layer 310 may correspond to the width of the first open area OA1 of the third plating layer 330. The width W1b of the second open area OA2 of the second plating layer 320 may correspond to the width of the second open area OA2 of the fourth plating layer 340.

Referring to FIG. 23, the width W1a of the first open area OA1 of the first plating layer 310 may be different from a width W1c of the first open area OA1 of the third plating layer 330. The width W1a of the first open area OA1 of the first plating layer 310 may be larger than the width W1c of the first open area OA1 of the third plating layer 330. The width W1b of the second open area OA2 of the second plating layer 320 may correspond to the width of the second open area OA2 of the fourth plating layer 340.

Referring to FIG. 25, the lower second protective layer 421 may be provided on the third plating layer 330, and the lower second protective layer 421 may be provided on the upper surface of the third plating layer 330 and the side surface of the fourth plating layer 340.

Referring to FIG. 24 and FIG. 26, the second protective layer 420 provided on the other surface of the substrate 100 may be a single layer. Referring to FIG. 24, the second protective layer 420 may be in contact with one surface of the third plating layer 330. Referring to FIG. 26, the second protective layer 420 may be in contact with one surface of the fourth plating layer 340.

A double-sided flexible printed circuit board may include two layers of an upper first protective layer and a lower first protective layer on one surface of the substrate, and may include a second protective layer of a single layer on the other surface of the substrate, thereby relieving stress during bending. The one surface of the substrate including the upper first protective layer and the lower first protective layer may be in a direction in which tensile force is applied.

Alternatively, the double-sided flexible printed circuit board may include two layers of an upper first protective layer and a lower first protective layer on one surface of the substrate, and may include two layers of an upper second protective layer and a lower second protective layer on the other surface of the substrate, thereby relieving stress during of bending. The one surface of the substrate including the upper first protective layer and the lower first protective layer may be in a direction in which tensile force is applied.

Accordingly, two different protective layers may prevent cavities and disperse stress at an interface. On one surface of the substrate to which a large tensile force is applied, the width of the open area may be larger than the other surface, and thus, stress may be relieved efficiently.

For example, referring to FIG. 20, FIG. 21, FIG. 22, and FIG. 24, the upper second protective layer 422 may cover an upper surface of the lower second protective layer 421 and the fourth plating layer 340, and may be provided wider than the lower second protective layer 421. The one surface of the substrate including an upper first protective layer and a lower first protective layer may be in a direction in which a tensile force is applied, or the other surface of the substrate including an upper second protective layer and a lower second protective layer may be in a direction in which a tensile force is applied. That is, regardless of a direction of bending, the embodiment may include different two-layered protective layers, capable of preventing cavities and dispersing stress at the interface.

At least one of the first protective layer 410 and the second protective layer 420 may be in contact with the wiring pattern layer. For example, referring to FIG. 21 to FIG. 23, the lower first protective layer 411 may be in contact with the first wiring pattern layer 210, and the lower second protective layer 421 may be in contact with the second wiring pattern layer 220, respectively. The lower first protective layer 411 or the lower second protective layer 421 may be bent in a direction to receive a tensile force.

Accordingly, as one surface of the lower first protective layer 411 or one surface of the lower second protective layer 421 may be in contact with the wiring pattern layer, it may be possible to prevent a crack from being generated in the first or second wiring pattern layer 210 or 220, and/or the plating layers 310, 320, 330, and 340 at a portion with tension when the flexible circuit board is folded. Therefore, reliability of the flexible circuit board may be improved. A surface having a larger contact area with the wiring pattern layer between one surface of the lower first protective layer 411 and one surface of the lower second protective layer 421 may be bent in a direction to receive a tensile force, and thus, the protective layer may relieve the tensile force, and cracking of the wiring pattern layer may be prevented.

For example, referring to FIG. 23 to FIG. 25, one protective layer of the lower first protective layer 411 and the lower second protective layer 421 may be in contact with the wiring pattern layer 200. The lower first protective layer 411 may be in contact with the wiring pattern layer 200. The lower first protective layer 411 may receive a tensile force, and the lower second protective layer 421 may be bent in a direction to receive a compressive force. Accordingly, as one surface of the lower first protective layer 411 may be in contact with the first wiring pattern layer 210, it may be possible to prevent a crack from being generated in the first wiring pattern layer 210 and the plating layer 300 at a portion with tension when the flexible circuit board is folded. Therefore, reliability of the flexible circuit board according to the embodiment may be improved.

A thickness of the lower first protective layer 411 may correspond to or may be different from a thickness of the lower second protective layer 421. The thickness of the first protective layer 411 may be a measurement at the bending area BA. For example, referring to FIG. 21 to FIG. 23, the thickness T3 of the lower first protective layer 411 may be different from the thickness T3 of the lower second protective layer 421. The thickness of the lower first protective layer 411 may be 1 µm to 20 µm, and the thickness of the lower second protective layer 421 may be 1 µm to 20 µm.

The lower first protective layer 411 and the lower second protective layer 421 may be in contact with the first and second wiring pattern layers 210 and 220, respectively. The thickness of the lower first protective layer 411 may be 10 µm to 20 µm. The thickness of the lower second protective layer 421 may be 5 µm to 15 µm. The lower first protective layer 411 may receive a tensile force, and the lower second protective layer 421 may be bent in a direction to receive a compressive force. Since the lower first protective layer 411 receiving a tensile force has a larger thickness than the lower second protective layer 421 receiving a compressive force, it may be possible to prevent a crack from being generated in the first wiring pattern layer 210, and/or the plating layers 310 and 320 at a portion with tension when the flexible circuit board is folded. Therefore, reliability of the flexible circuit board may be improved.

For example, referring to FIG. 24 to FIG. 26, a thickness T3a of the lower first protective layer 411 may be different from a thickness T3b of the lower second protective layer 421. The thickness T3a of the lower first protective layer 411 may be larger than the thickness T3b of the lower second protective layer 421. The thickness of the lower first protective layer 411 may be 10 µm to 20 µm, and the thickness of the lower second protective layer 421 may be 5 µm to 15 µm. The lower first protective layer 411 may receive a tensile force, and the lower second protective layer 421 may be bent in a direction to receive a compressive force. Since the lower first protective layer 411 receiving a tensile force has a larger thickness than the lower second protective layer 421 receiving a compressive force, it may be possible to prevent a crack from being generated in the first wiring pattern layer 210, and/or the plating layers 310 and 320 at a portion with tension when the flexible circuit board is folded. Thus, reliability of the flexible circuit board may be improved.

Referring to FIG. 22 and FIG. 23, a first overlapping region and a second overlapping region in which the first plating layer and the first protective layer may be in contact with each other may be included. A width of the first overlapping region may correspond to a width of the second overlapping region.

Referring to FIG. 22, a width of a first overlapping region CA1 in which the first plating layer 310 and the lower first protective layer 411 may be in contact with each other on one side of a first open area OA1 may correspond to that of a fifth overlapping region CA5 in which the third plating layer 330 and the lower second protective layer 421 are contact with each other at one side of the first open area OA1. A width of a second overlapping region CA2 in which the first plating layer 310 and the lower first protective layer 411 may be in contact with each other on the other side of a first open area OA1 may correspond to that of a sixth overlapping region CA6 in which the third plating layer 330 and the lower second protective layer 421 may be contact with each other at the other side of the first open area OA1. Referring to FIG. 23, the width of the fifth overlapping region CA5 may be larger than the width of the first overlapping region CA1. The width of the sixth overlapping region CA6 may be larger than the width of the second overlapping region CA2.

Referring to FIG. 21 to FIG. 26, the upper second protective layer 422 may cover the lower second protective layer 421 and the fourth plating layer 340, and may be provided wider than the lower second protective layer 421. The upper second protective layer 422 may cover the upper surface of the lower second protective layer 421, and may be provided to have a larger width than the bending area BA. One surface of the upper second protective layer 422 and another surface opposite to the one surface may be provided on the non-bending area NBA. The upper second protective layer 422 may be provided entirely on the lower second protective layer 421, and may be provided on a peripheral area of the lower second protective layer 421.

The upper second protective layer 422 may be in contact with the upper surfaces of the lower second protective layer 421 and the fourth plating layer 340. The upper second protective layer 422 may be in contact with the upper surface of the lower second protective layer 421 on the bending area BA and the upper surface of the fourth plating layer 340 on the non-bending area NBA.

The upper second protective layer 422 may entirely cover the upper surface of the lower second protective layer 421. The upper second protective layer 422 may prevent for example, moisture and foreign matter from infiltrating into the interface between the lower second protective layer 421 and the plating layer 300. As a result, it may possible to prevent damage or removal of the wiring pattern layer 200 due to oxidation.

The upper second protective layer 422 may extend over the entire upper surface of the lower second protective layer 421 and the bending area BA on the lower second protective layer 421, and may be provided on the upper surface of the fourth plating layer 340 on the non-bending area NBA. Thus, the upper second protective layer 422 may prevent foreign matters from infiltrating due to unevenness of the interface between the lower second protective layer 421 and the plating layer 300. Therefore, reliability and lifetime of the flexible circuit board may be improved. The upper second protective layer 422 may include an overlapping region contacting the fourth plating layer 340. The upper second protective layer 422 may overlap the fourth plating layer 340 on the non-bending area NBA.

A shape of the first protective layer 410 may be symmetrical with a shape of the second protective layer 420. For example, the lower first protective layer 411 and the lower second protective layer 421 may be T-shaped. Alternatively, the shape of the first protective layer 410 may be different from the shape of the second protective layer 420. For example, the lower first protective layer 411 may be T-shaped, and the lower second protective layer 421 may be stripe-shaped.

Since the upper second protective layer 422 may be provided on the upper surface of the lower second protective layer 421 and on one area of the upper surface of the fourth plating layer 340, adhesive strength may be increased, and thus reliability of the flexible circuit board may be improved.

The widths of the overlapping regions CA3 and CA4 between the upper second protective layer 422 and the fourth plating layer 340 may be larger than the thickness of the plating layer 300. Accordingly, the flexible circuit board may prevent damage due to deformation caused by tension or compression. The widths of the third overlapping region CA3 and the fourth overlapping region CA4 may be corresponding to or different from each other.

The upper second protective layer 422 may prevent removal of the lower second protective layer 421, thereby improving reliability of the flexible circuit board. An upper surface of the upper second protective layer 422 may be provided higher than the upper surface of the lower second protective layer 421. Since the upper surface of the upper second protective layer 422 is provided higher than the upper surface of the lower second protective layer 421, the lower second protective layer 421 may have a step with the upper second protective layer 422. Accordingly, the upper second protective layer 422 may be capable of improving adhesion to the lower second protective layer 421, and thus moisture infiltration or the like may be prevented.

In the double-sided flexible printed circuit board according to the embodiments, the upper protective layer having a larger width than any one of the lower first protective layer and the lower second protective layer may be provided higher than the upper surface of any one of the lower first protective layer and the lower second protective layer on at least one protective layer of the lower first protective layer and the lower second protective layer. The upper first protective layer having a width larger than that of the lower first protective layer may be provided on the lower first protective layer, and the upper second protective layer having a width larger than that of the lower second protective layer may be provided on the lower second protective layer. Accordingly, stress generated during bending the plurality of protective layers on at least one surface of the substrate may be dispersed, and thus breakage of the plating layer and/or the wiring pattern layer may be prevented.

The upper first protective layer provided on the lower first protective layer may block access of an infiltrable material at the interface between the lower first protective layer and the plating layer, thereby preventing damage or removal of a film due to oxidation of a wiring pattern. The upper second protective layer provided on the lower second protective layer may block access of an infiltrable material at the interface between the lower second protective layer and the plating layer, thereby preventing damage or removal of a film due to oxidation of a wiring pattern.

Since the upper surface of the lower first protective layer may be provided higher than the upper surface of the second plating layer, a cavity may be prevented from being formed between the lower first protective layer and the plating layer or between the lower first protective layer and the wiring pattern layer. Therefore, removal of a film or damage of a wiring pattern layer and/or a plating layer may be prevented. Since a protective layer on a side receiving a tensile force may be in contact with a wiring pattern layer, cracking and breakage of a wiring pattern layer and/or a plating layer due to bending may be prevented, and thus reliability may be improved.

The double-sided flexible printed circuit board may include a lower first protective layer 411 provided between the first plating layer 310 and the second plating layer 320. The double-sided flexible printed circuit board may include the structure of a lower first protective layer 411 in which a portion may be buried between the first plating layer 310 and the second plating layer 320, and thus a tensile force of a bending area may be buffered, and cracking of a wiring pattern layer and a plating layer may be prevented.

As at least one protective layer of the lower first protective layer and the lower second protective layer may be in contact with the wiring pattern layer, a crack due to a change in tensile force during bending may be prevented. A semiconductor chip may be mounted in a narrow area of an electronic device in high density, and a high resolution display may be realized. Furthermore, the embodiments may prevent appearance defects and reliability degradation due to generation of Sn particles.

Figure 27:
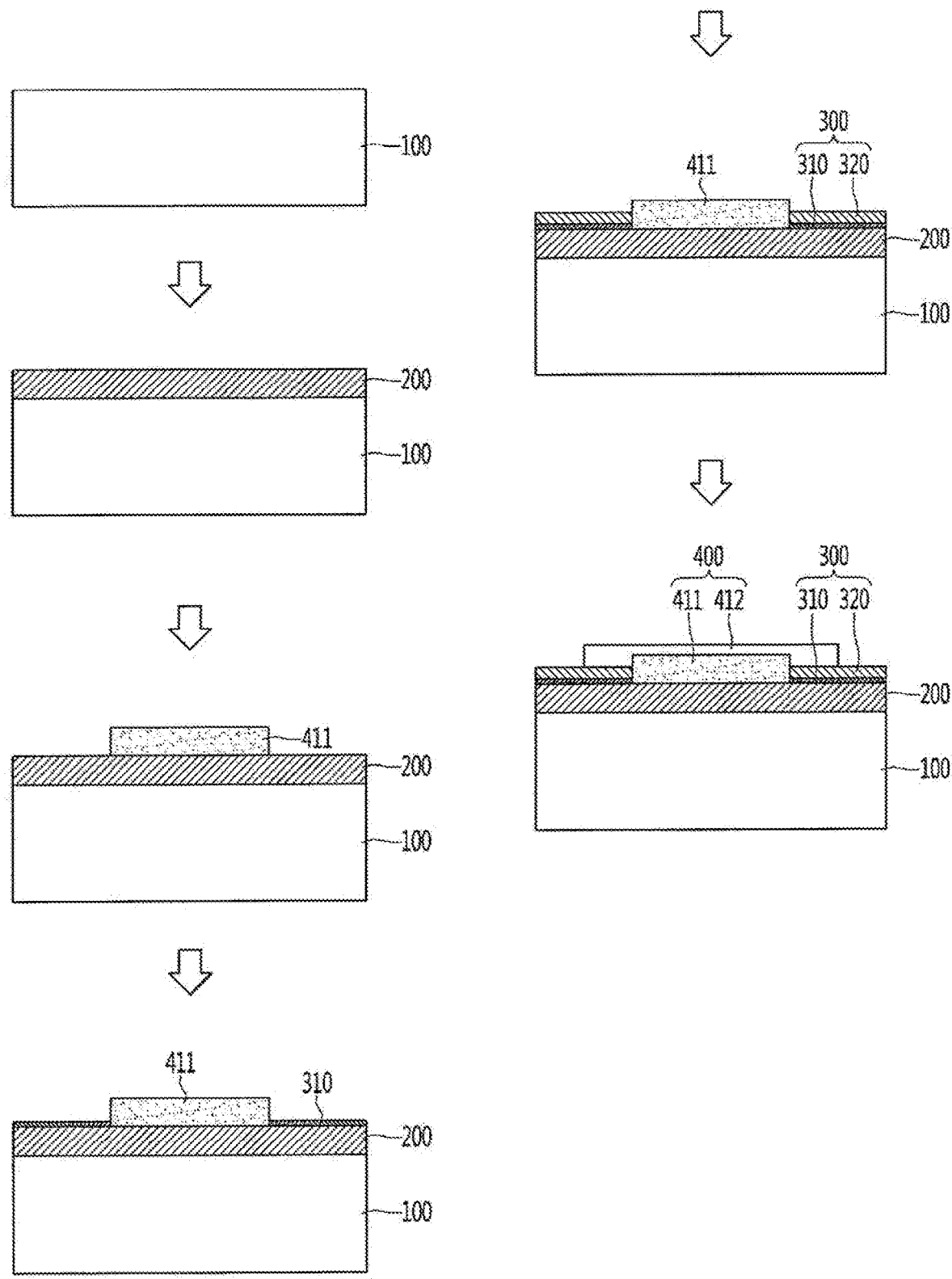
FIG. 27 is a cross-sectional view of a manufacturing process of a flexible circuit board according to FIG. 13.

Hereinafter, a method of manufacturing a flexible circuit board according to the embodiments is be described with reference to FIG. 27. The manufacturing method of a flexible circuit board according to the embodiment may include preparing a substrate having a thickness of 12 to 125 μm, forming a wiring pattern layer having a thickness of 1 to 20 μm on one surface of the substrate, providing a first protective layer having a thickness of 1 to 20 μm on a bending area of the wiring pattern layer, forming a first plating layer having a thickness of 0.1 μm or less on an area other than an area where the first protective layer is provided on the wiring pattern layer, providing a second plating layer having a thickness of 1 μm or less on the first plating layer, and providing a second protective layer covering the first protective layer and the second plating layer and having a width larger than that of the first protective layer to a thickness of 1 to 20 μm.

Hereinafter, a method of manufacturing a double-sided flexible printed circuit board is described with reference to FIGS. 28 to 31. The embodiment is not limited thereto, and some components previously discussed may be omitted during the process. For example, the upper second protective layer 422 may be omitted. In addition, some components may be located differently during the process. For example, the lower second protective layer 421 may be provided on the third plating layer 330, or the lower second protective layer 421 may be provided on the fourth plating layer 340.

Figure 28:
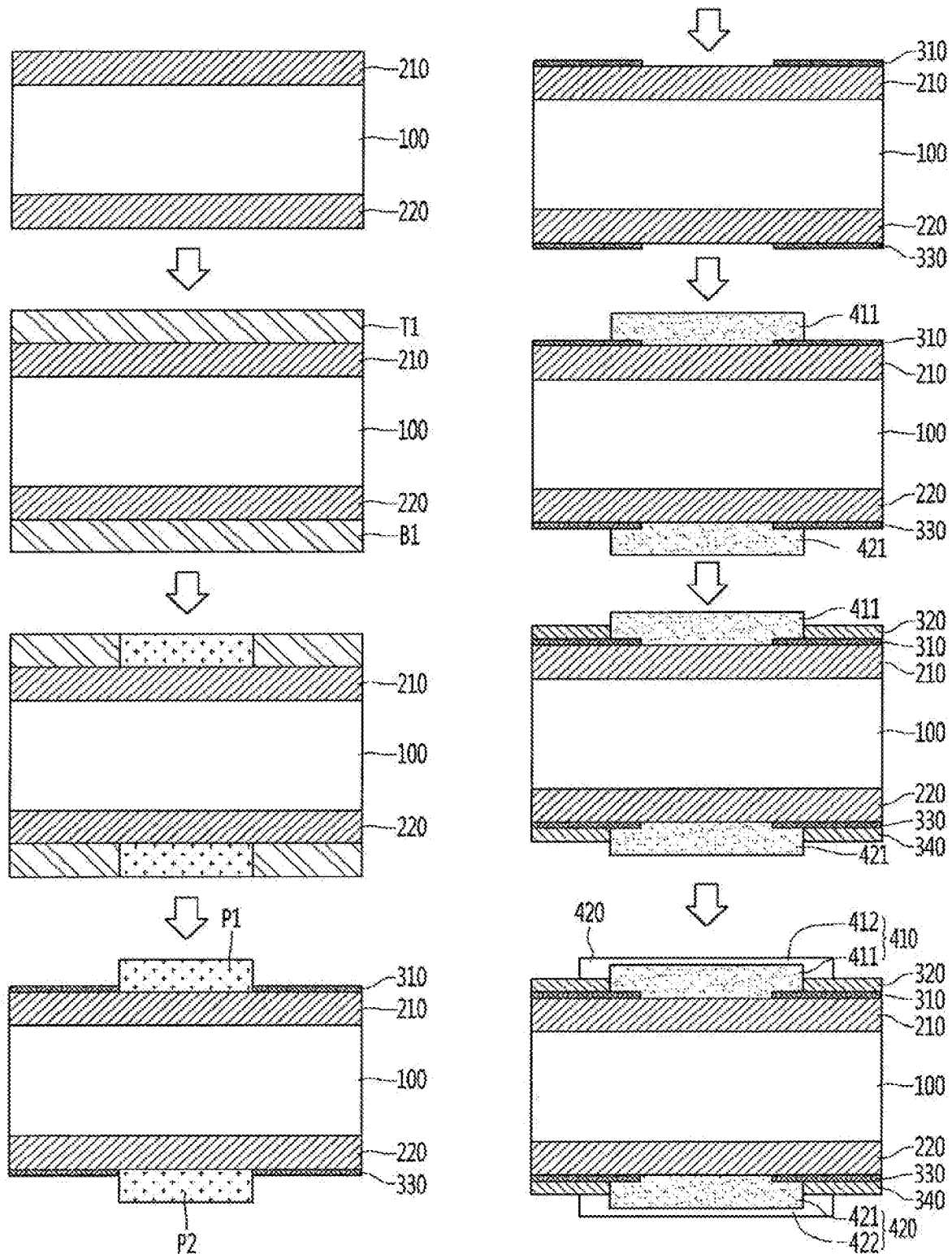
FIG. 28 to FIG. 31 are cross-sectional views of a manufacturing process of a double-sided flexible printed circuit board according to FIG. 22.

Referring to FIG. 28, a double-sided flexible printed circuit board may be manufactured according to a dry film masking method or a photo solder resist (PSR) printing method. First, a first wiring pattern layer 210 and a second wiring pattern layer 220 may be prepared on both sides of a substrate 100. A circuit may be formed on both surfaces of a substrate 100. The substrate 100 may be a polyimide flexible substrate, and a wiring pattern may include copper.

Next, an upper sacrificial layer T1 may be formed by laminating a dry film on the first wiring pattern layer 210 or by printing a photo solder resist layer. A lower sacrificial layer B1 may be formed by laminating a dry film on the second wiring pattern layer 220 or by printing a photo solder resist layer. A mask may be provided on the upper sacrificial layer T1 and the lower sacrificial layer B1, and an exposure step for exposing ultraviolet rays may be performed.

Next, a development step of removing the unexposed upper sacrificial layer T1 and the lower sacrificial layer B1 may be performed. Accordingly, a patterned upper sacrificial layer P1 and a patterned lower sacrificial layer P2 may be formed. A first plating layer 310 may then be formed in the peripheral area of the patterned upper sacrificial layer P1. A third plating layer 330 may be formed in the peripheral area of the patterned lower sacrificial layer P2.

Next, the patterned upper sacrificial layer P1 and the patterned lower sacrificial layer P2 may be peeled off. Accordingly, a first plating layer 310 and a third plating layer 330 including a first open area may be formed. Each of the first plating layer 310 and the third plating layer 330 may be tin-plated.

Next, lower first and lower second protective layers 411 and 421 covering side surfaces and parts of upper surfaces of the first plating layer 310 and the third plating layer 330 may be provided while filling the first open area. Upper surfaces of the lower first and lower second protective layers 411 and 421 may have a larger width than that of the bending area.

Second and fourth plating layers 320 and 340 may then be formed in the peripheral area of the lower first and lower second protective layers 411 and 421. The second and fourth plating layers 320 and 340 may be formed in an area where the lower first and lower second protective layers 411 and 421 are not provided with a thickness smaller than that of the protective layer. Accordingly, side surfaces of the lower first and lower second protective layers 411 and 421 may be in contact with the second and fourth plating layers 320 and 340. The second plating layer 320 and the fourth plating layer 340 may be tin-plated respectively.

Next, an upper first protective layer 412 may be formed on the entire upper surface of the lower first protective layer 411 and on one area of the upper surface of the second plating layer 320 which may be a peripheral area of the lower first protective layer 411. An upper surface of the upper first protective layer 412 may be formed with a height higher than that of the lower first protective layer 411. The upper first protective layer 412 may include a same material as a material of the lower first protective layer 411.

An upper second protective layer 422 may be formed on the entire upper surface of the lower second protective layer 421 and on one area of the upper surface of the fourth plating layer 340 which may be a peripheral area of the lower second protective layer 421. An upper surface of the upper second protective layer 422 may be formed with a height higher than that of the lower second protective layer 421. The upper second protective layer 422 may include the same material as that of the lower second protective layer 421.

Figure 29:
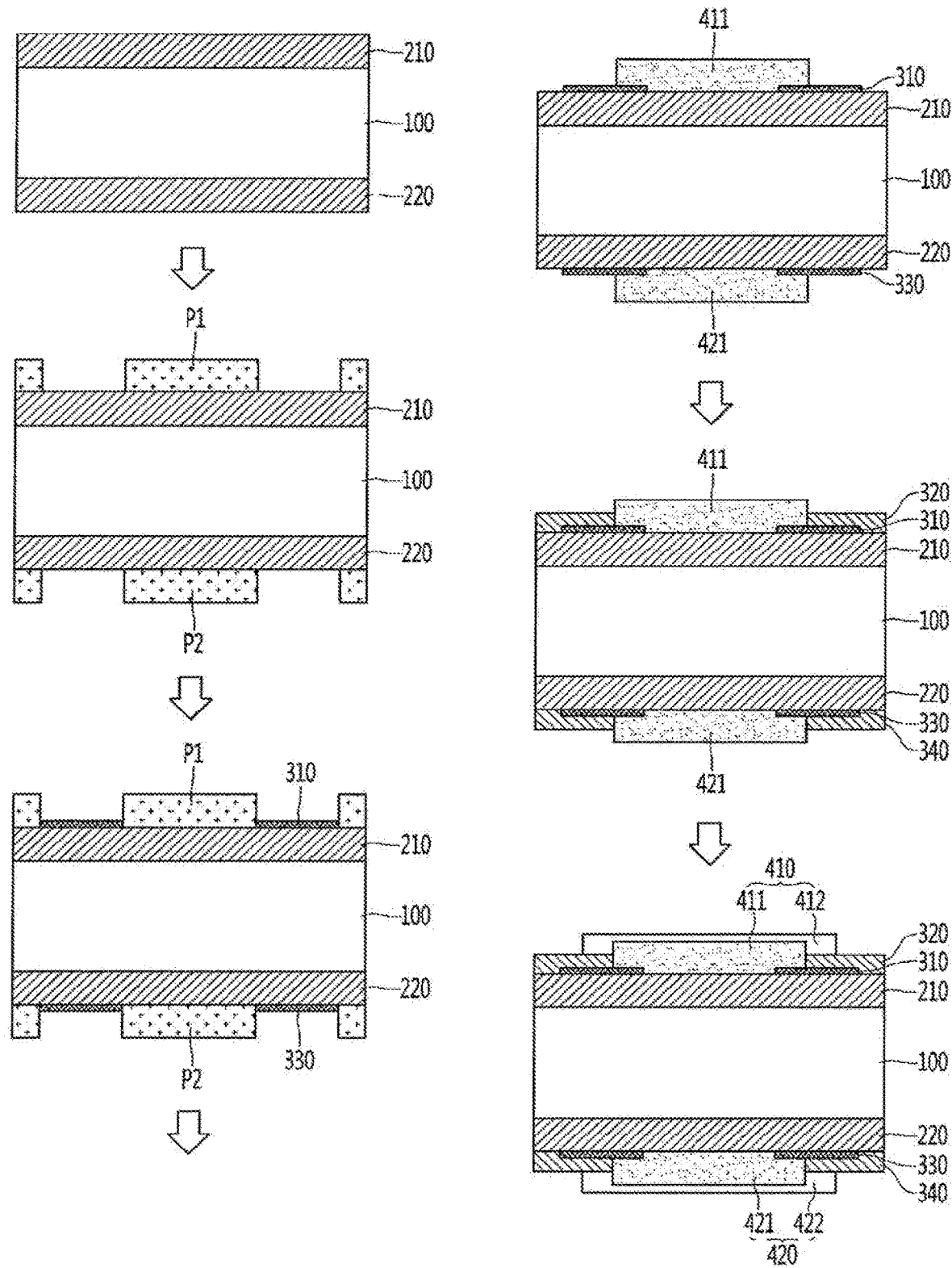

Referring to FIG. 29, a double-sided flexible printed circuit board may be manufactured according to a PET masking method. First, a first wiring pattern layer 210 and a second wiring pattern layer 220 may be prepared on both sides of a flexible substrate 100. A circuit is formed on both surfaces of a flexible substrate 100. The flexible substrate 100 may be a polyimide flexible substrate, and a wiring pattern may include copper.

Next, a PET masking film may be punched to prepare a PET masking film having a through-hole. A patterned upper sacrificial layer P1 may be formed by laminating a PET masking film having through holes on the first wiring pattern layer 210. A patterned lower sacrificial layer P2 may be formed by laminating a PET masking film having through holes on the second wiring pattern layer 220.

Next, a first plating layer 310 may be formed in a through hole of the patterned upper sacrificial layer P1. A third plating layer 330 may be formed in a through hole of the patterned lower sacrificial layer P2. The patterned upper sacrificial layer P1 and the patterned lower sacrificial layer P2 may then be peeled off. Accordingly, a first plating layer 310 and a third plating layer 330 including a first open area may be formed. The first plating layer 310 and the third plating layer 330 may be tin-plated respectively.

Next, lower first and lower second protective layers 411 and 421 covering side surfaces and parts of upper surfaces of the first plating layer 310 and the third plating layer 330 may be provided while filling the first open area. Upper surfaces of the lower first and lower second protective layers 411 and 421 may have a larger width than that of the bending area.

Second and fourth plating layers 320 and 340 may be formed in the peripheral area of the lower first and lower second protective layers 411 and 421. The second and fourth plating layers 320 and 340 may be formed in an area where the lower first and lower second protective layers 411 and 421 are not provided with a thickness smaller than that of the protective layer. Accordingly, side surfaces of the lower first and lower second protective layers 411 and 421 may be in contact with the second and fourth plating layers 320 and 340. The second plating layer 320 and the fourth plating layer 340 may be tin-plated respectively.

Next, an upper first protective layer 412 may be formed on the entire upper surface of the lower first protective layer 411 and on one area of the upper surface of the second plating layer 320 which may be a peripheral area of the lower first protective layer 411. An upper surface of the upper first protective layer 412 may have a height higher than that of the lower first protective layer 411. The upper first protective layer 412 may include the same material as that of the lower first protective layer 411.

An upper second protective layer 422 may be formed on the entire upper surface of the lower second protective layer 421 and on one area of the upper surface of the fourth plating layer 340 which may be a peripheral area of the lower second protective layer 421. An upper surface of the upper second protective layer 422 may be formed with a height higher than that of the lower second protective layer 421. The upper second protective layer 422 may include the same material as that of the lower second protective layer 421.

Figure 30:
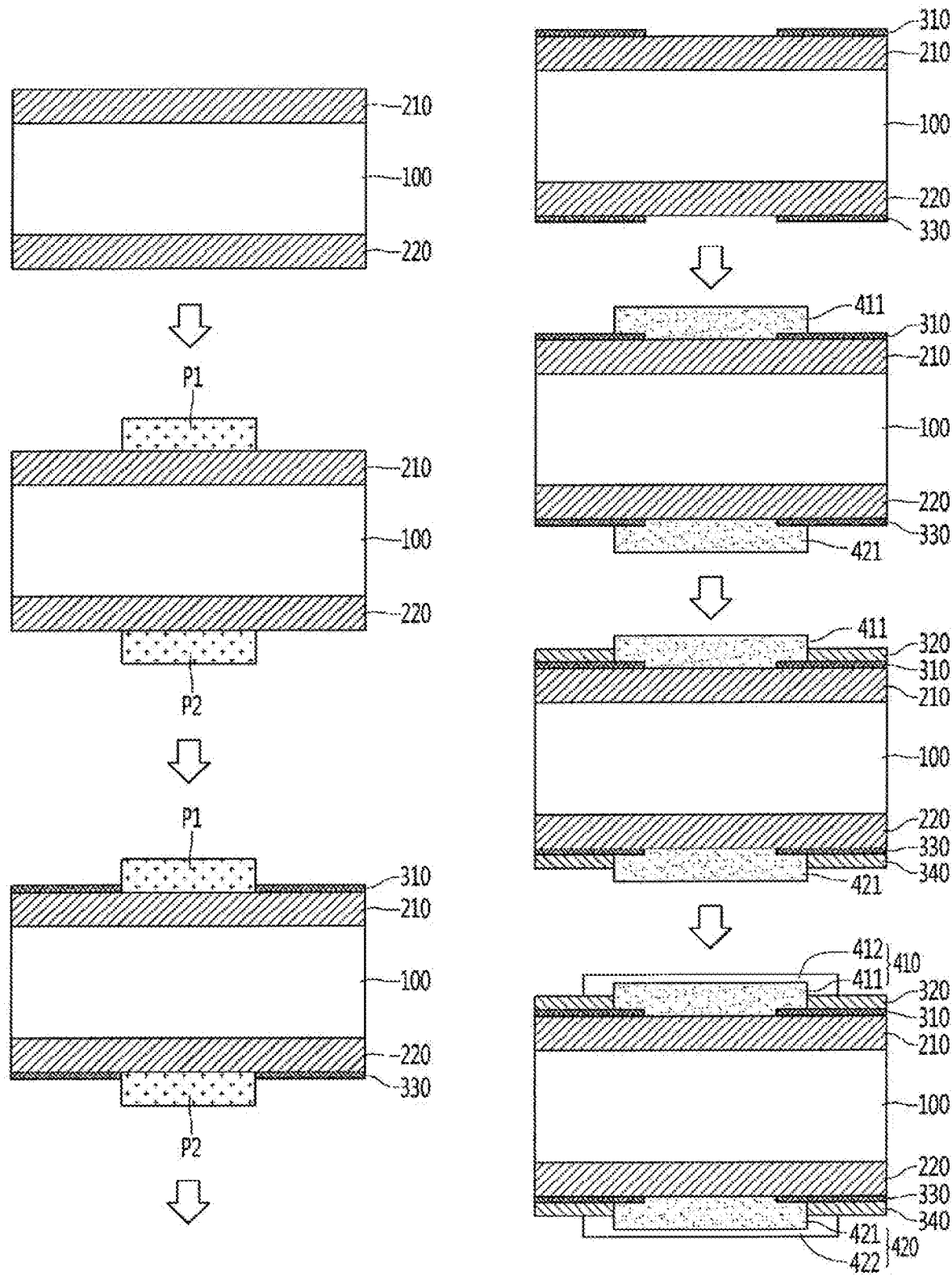

Referring to FIG. 30, a double-sided flexible printed circuit board may be manufactured according to a photoresist (PR) printing or gravure printing method. First, a first wiring pattern layer 210 and a second wiring pattern layer 220 may be prepared on both sides of a flexible substrate 100. A circuit may be formed on both surfaces of a flexible substrate 100. The flexible substrate 100 may be a polyimide flexible substrate, and a wiring pattern may include copper.

Next, a photoresist ink may be applied on the first wiring pattern layer 210 to form a patterned upper sacrificial layer P1. A photoresist ink may be printed on the second wiring pattern layer 220 to form a patterned lower sacrificial layer P2.

Next, a first plating layer 310 may be formed in the peripheral area of the patterned upper sacrificial layer P1. A third plating layer 330 may be formed in the peripheral area of the patterned lower sacrificial layer P2. The patterned upper sacrificial layer P1 and the patterned lower sacrificial layer P2 may then be peeled off. Accordingly, a first plating layer 310 and a third plating layer 330 including a first open area may be formed. The first plating layer 310 and the third plating layer 330 may be tin-plated respectively.

Next, lower first and lower second protective layers 411 and 421 covering side surfaces and parts of upper surfaces of the first plating layer 310 and the third plating layer 330 may be provided while filling the first open area. Upper surfaces of the protective layers may have a larger width than that of the bending area.

Second and fourth plating layers 320 and 340 may be formed in the peripheral area of the lower first and lower second protective layers 411 and 421. The second and fourth plating layers 320 and 340 may be formed in an area where the lower first and lower second protective layers 411 and 421 are not provided with a thickness smaller than that of the protective layer. Accordingly, side surfaces of the protective layers may be in contact with the second and fourth plating layers 320 and 340. The second plating layer 320 and the fourth plating layer 340 may be tin-plated respectively.

Next, an upper first protective layer 412 may be formed on the entire upper surface of the lower first protective layer 411 and on one area of the upper surface of the second plating layer 320 which may be a peripheral area of the lower first protective layer 411. An upper surface of the upper first protective layer 412 may be formed with a height higher than that of the lower first protective layer 411. The upper first protective layer 412 may include the same material as that of the lower first protective layer 411.

An upper second protective layer 422 may be formed on the entire upper surface of the lower second protective layer 421 and on one area of the upper surface of the fourth plating layer 340 which is a peripheral area of the lower second protective layer 421. An upper surface of the upper second protective layer 422 may be formed with a height higher than that of the lower second protective layer 421. The upper second protective layer 422 may include the same material as that of the lower second protective layer 421.

Figure 31:
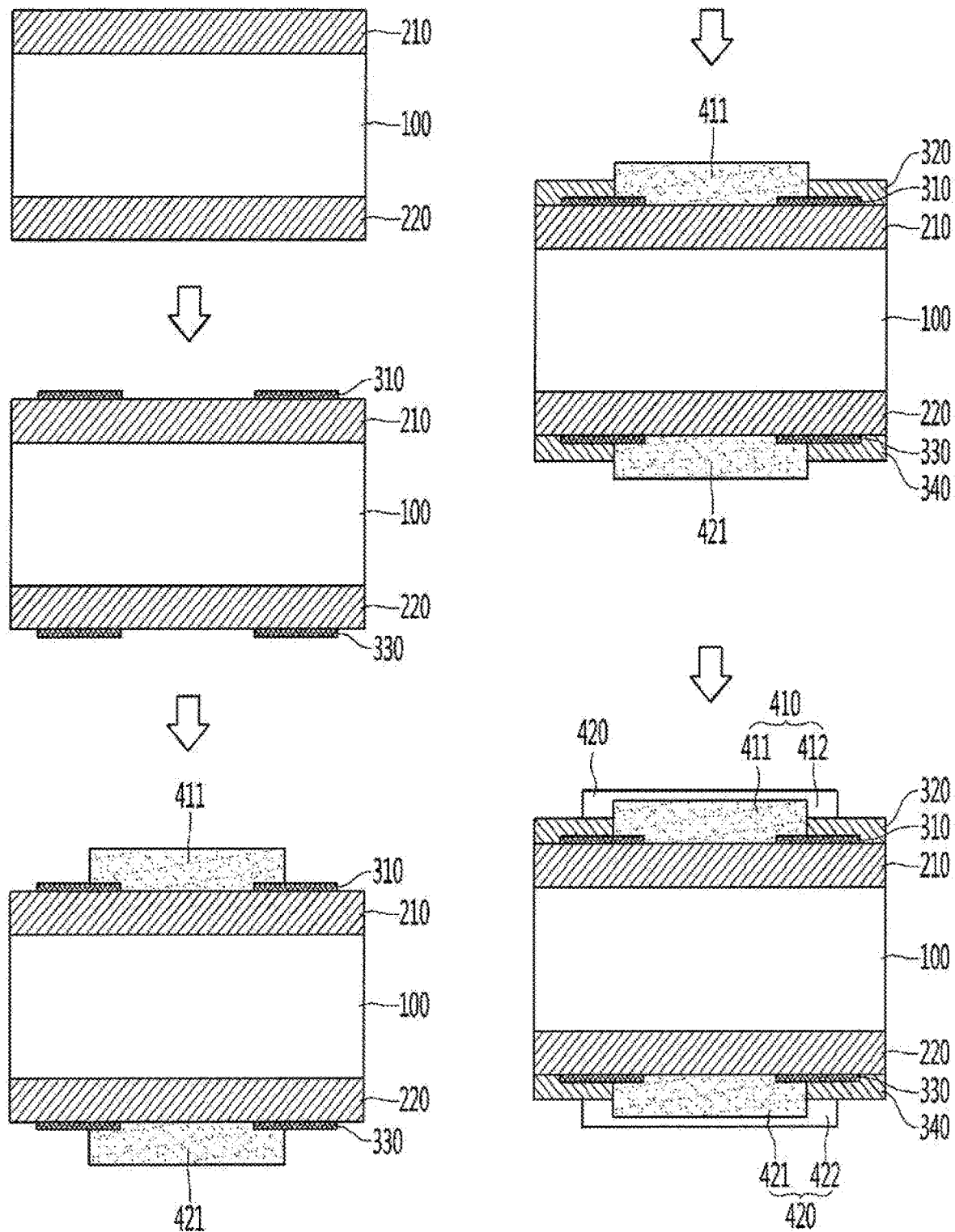

Referring to FIG. 31, a double-sided flexible printed circuit board may be manufactured according to a Spurt Jar plating method. First, a first wiring pattern layer 210 and a second wiring pattern layer 220 may be prepared on both sides of a flexible substrate 100. A circuit may be formed on both surfaces of a flexible substrate 100. The flexible substrate 100 may be a polyimide flexible substrate, and a wiring pattern may include copper.

Next, a first plating layer 310 and a third plating layer 330 including a first open area may be formed in an area corresponding to a bending area by performing Spurt Jar plating. The first plating layer 310 and the third plating layer 330 may be tin-plated respectively. Protective layers covering side surfaces and parts of upper surfaces of the first plating layer 310 and the third plating layer 330 may be provided while filling the first open area. Upper surfaces of the protective layers may have a larger width than that of the bending area.

Second and fourth plating layers 320 and 340 may be formed in peripheral areas of lower first and lower second protective layers 411 and 421. The second and fourth plating layers 320 and 340 may be formed in an area where the lower first and lower second protective layers 411 and 421 are not provided with a thickness smaller than that of the protective layer. Accordingly, side surfaces of the protective layers may be in contact with the second and fourth plating layers 320 and 340. The second plating layer 320 and the fourth plating layer 340 may be tin-plated respectively.

Next, an upper first protective layer 412 may be formed on the entire upper surface of the lower first protective layer 411 and on one area of the upper surface of the second plating layer 320 which may be a peripheral area of the lower first protective layer 411. An upper surface of the upper first protective layer 412 may be formed with a height higher than that of the lower first protective layer 411. The upper first protective layer 412 may include the same material as that of the lower first protective layer 411.

An upper second protective layer 422 may be formed on the entire upper surface of the lower second protective layer 421 and on one area of the upper surface of the fourth plating layer 340 which may be a peripheral area of the lower second protective layer 421. An upper surface of the upper second protective layer 422 may be formed with a height higher than that of the lower second protective layer 421. The upper second protective layer 422 may include the same material as that of the lower second protective layer 421.

A chip on film (COF) module 10 may include a flexible circuit board, or a flexible circuit board chip package 10, according to the embodiments. The COF module having a driving chip mounted thereon may be manufactured by providing on the wiring pattern layer 200 the driving chip that may be electrically connected to the wiring pattern layer 200 on the flexible circuit board.

Cross-sectional views of a flexible circuit board mounted on an electronic device are described with reference to FIG. 32 and FIG. 33. A bent portion of a flexible circuit board mounted on the electronic device may be equal to, wider or narrower than the bending area BA. An area without a plating layer may be in at least a part of the bending area BA. Therefore, breakage of the plating layer during bending may be prevented. The bending area BA may be wider than, corresponding to, or narrower than an area where the plating layer is not formed.

Figure 32:
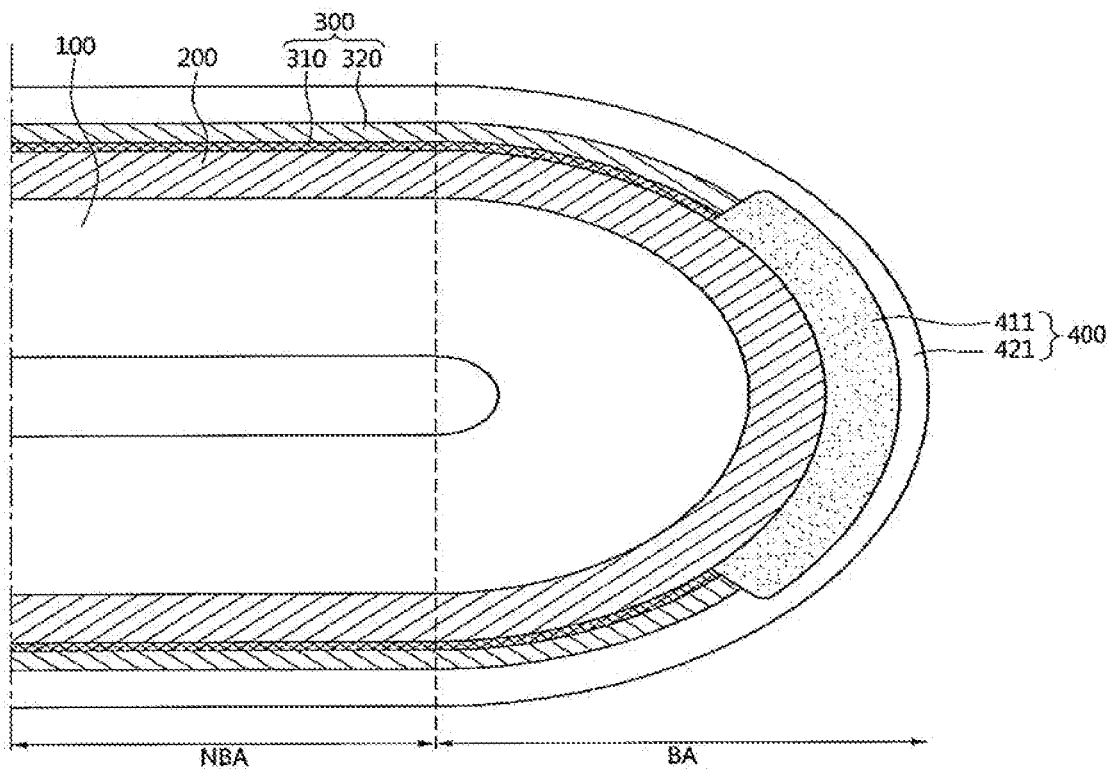
FIG. 32 to FIG. 34 are cross-sectional views of a flexible circuit board according to FIG. 13 mounted on an electronic device.
Figure 33:
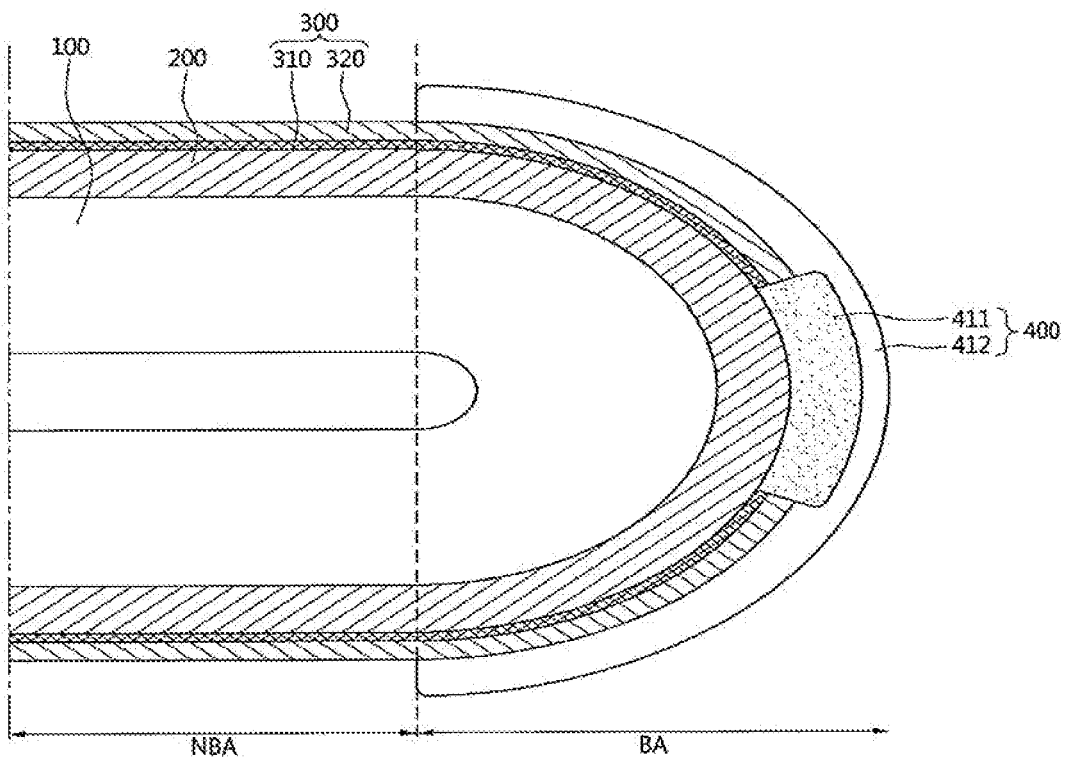

Referring to FIG. 32 and FIG. 33, the lower protective layer 411 may be provided narrower than the bending area BA. Alternatively, referring to FIG. 32, the lower protective layer 411 may be provided only in the bending area BA.

Figure 34:
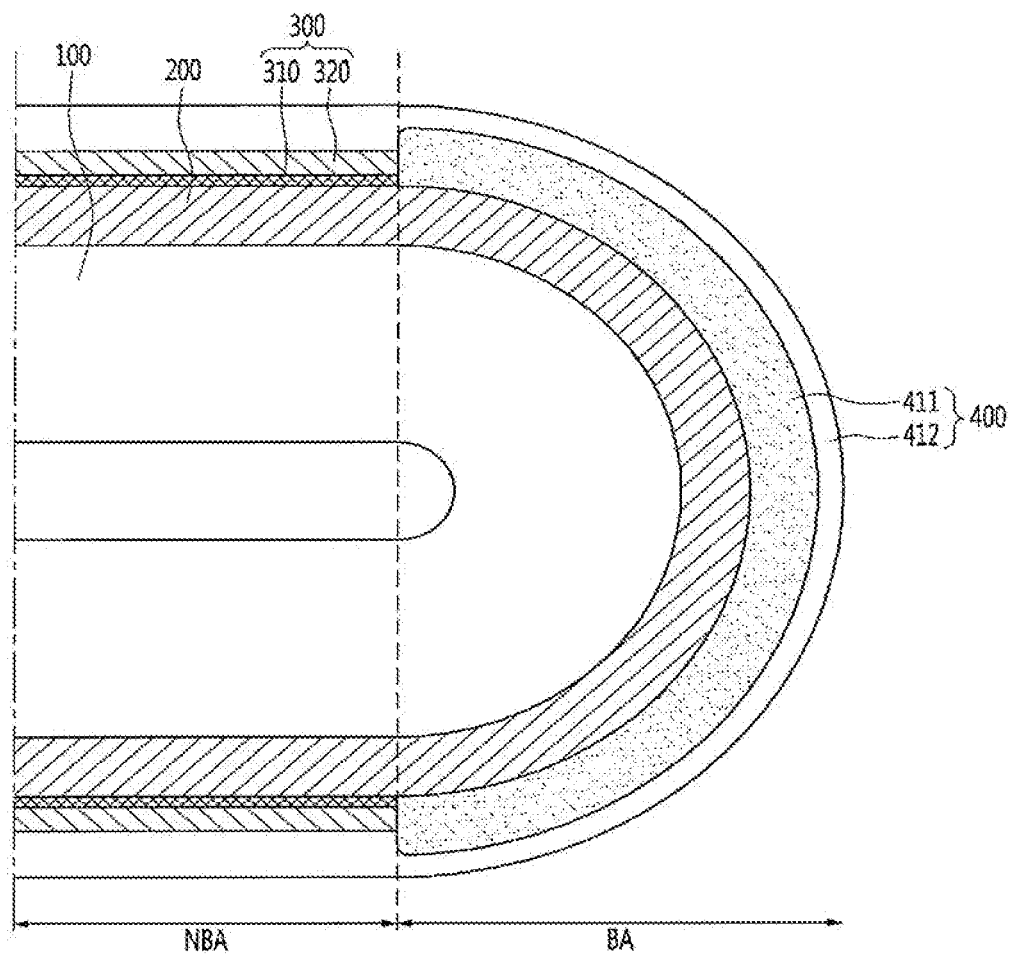

Referring to FIG. 32 and FIG. 34, the upper protective layer 412 may be provided wider than the bending area BA. Alternatively, referring to FIG. 32, the upper protective layer 412 may be provided only in the bending area BA.

Figure 35:
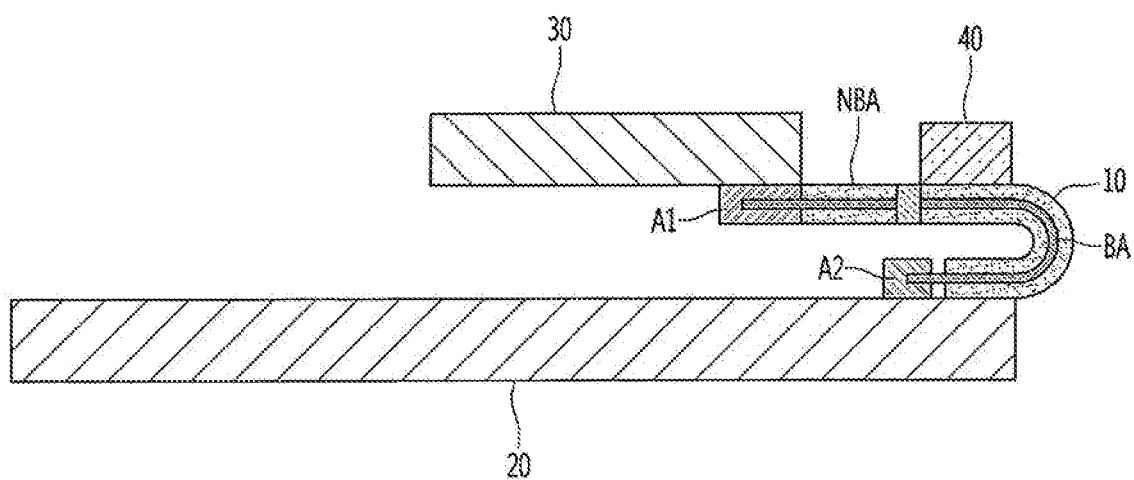
FIG. 35 is a cross-sectional view of a COF module having a flexible circuit board according to embodiments.

Referring to FIG. 35, the flexible circuit board according to the first and second embodiments may be included in an electronic device. The chip on film (COF) module 10 may include providing the driving chip 40 on the non-bending area NBA of the flexible circuit board. For example, in the bending area BA, the flexible substrate 100 may have a shape similar to a C-shape. In the bending area BA, the cross section of the flexible substrate 100 may have a curve shape. The bending area BA may be an area where one surface is bending and facing one surface of the substrate 100, or an area where the other surface faces the other surface of the substrate 100.

In the non-bending area NBA, the flexible substrate 100 may have a shape similar to a plate shape. In the non-bending area NBA, the cross section of the flexible substrate 100 may have a straight shape. The non-bending area NBA may include an area where the substrate 100 may be partially bent to connect with a display panel or a separate circuit board. The non-bending area NBA may be an area where one surface of the substrate may not face one opposite surface.

The bending area BA may be provided between the non-bending areas NBA. The bending area BA may be bent to connect the flexible circuit board to a display panel and a printed circuit board. The cross-sectional area of the bending area BA may be smaller than that of the non-bending area NBA. Accordingly, the flexible circuit board may be provided between the display panel and the printed circuit board.

The COF module 10 may be located between a display panel 20 and a printed circuit board 30 to connect an electrical signal. The printed circuit board 30 may be a rigid printed circuit board or a flexible printed circuit board. One end of the COF module 10 including the flexible circuit board may be electrically connected by being in contact with the display panel 20, and another end opposite to the one end may be electrically connected by being in contact with the printed circuit board 30. Such contact may be a direct contact. Alternatively, the contact may be a contact with an anisotropic conductive film (ACF) therebetween.

For example, the ACF may be provided between the COF module 10 and the printed circuit board 30. The COF module 10 and the printed circuit board 30 may be bonded together and electrically connected by the ACF simultaneously. The ACF may be a resin in which conductive particles may be dispersed. Therefore, an electrical signal connected by the printed circuit board 30 may be transmitted to the COF module 10 through the conductive particles contained in the ACF.

The flexible circuit board 10 may be connected to the display panel 20 in a first bonding area A1. The flexible circuit board 10 may be connected to the printed circuit board 30 in a second bonding area A2. The first bonding area A1 and the second bonding area A2 may be one end or another end of a non-bending area NBA.

A bending area BA that may be bent between the first bonding area A1 where the flexible circuit board 10 may be connected to the display panel 20 and the second bonding area A2 where the flexible circuit board 10 may be connected to the printed circuit board 30 may be located.

Since the COF module 10 may include a flexible substrate, the COF module 10 may have a rigid shape or a bending shape between the display panel 20 and the printed circuit board 30. The COF module 10 may be bent and connected between the display panel 20 and the printed circuit board 30 provided opposite to each other, and thus a thickness of the electronic device may be reduced, and a degree of freedom of design may be improved. The COF module 10 including the flexible substrate 100 may not break the wiring even in curved form, and thus reliability of the electronic device including the COF module may be improved.

Figure 36:
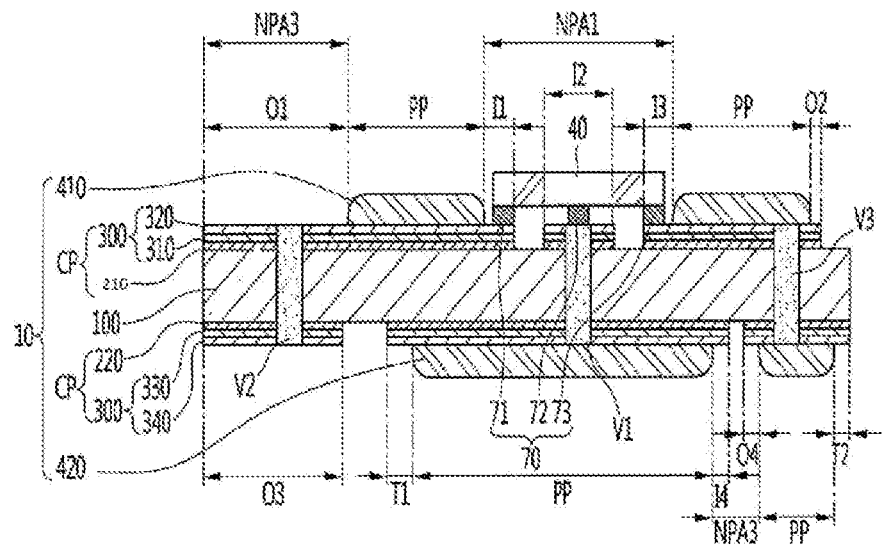
FIG. 36 and FIG. 37 are cross-sectional views of a chip package having a double-sided flexible printed circuit board.
Figure 37:
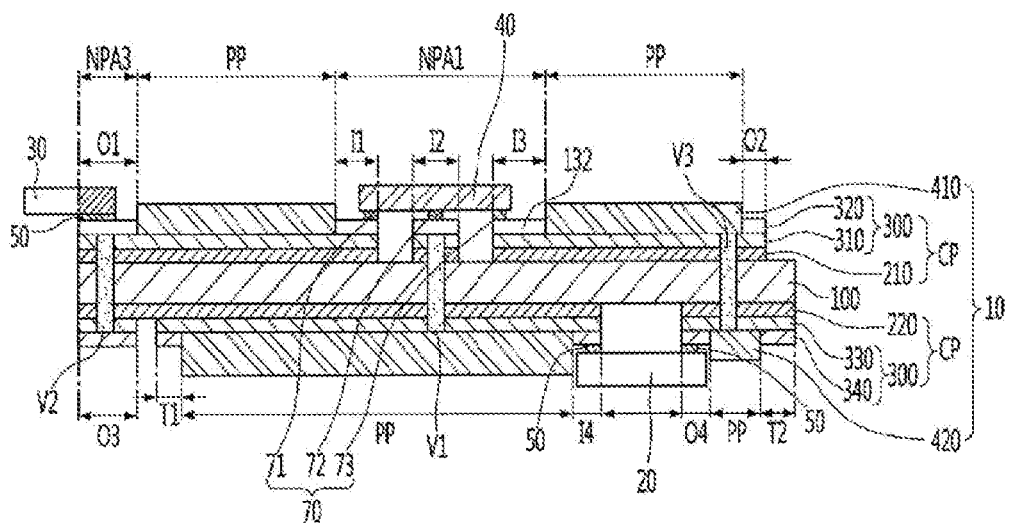

FIG. 36 and FIG. 37 are cross-sectional views of a chip package that may include a double-sided flexible printed circuit board according to an embodiment. Referring to FIG. 36 and FIG. 37, the substrate 100 may include a through hole. The substrate 100 may include a plurality of through holes. The plurality of through holes of the substrate 100 may be formed individually or simultaneously by a mechanical process or a chemical process. For example, the plurality of through holes of the substrate 100 may be formed by a drilling process or an etching process. The through holes of the substrate may be formed through laser punching and desmearing processes. The desmearing process may be a process of removing a polyimide smear attached to an inner surface of the through hole. By the desmearing process, an inner surface of the polyimide substrate may have an inclined surface similar to a straight line.

Wiring pattern layers 210 and 220, plating layers 300: 310, 320, 330 and 340, and protective layers 410 and 420 may be provided on the substrate 100. The wiring pattern layers 210 and 220, plating layers 310, 320, 330, and 340, and protective layers 410 and 420 may be sequentially provided on both surfaces of the substrate 100.

A conductive pattern part CP may be provided on one surface or both surfaces of the substrate 100. The conductive pattern part CP may include a wiring pattern layer and a plating layer. The wiring pattern layers 210 and 220 may be formed by at least one method of evaporation, plating, and sputtering. For example, a wiring layer for forming a circuit may be formed by electrolytic plating after sputtering. A wiring layer for forming a circuit may be a copper plating layer formed by electroless plating. Alternatively, the wiring layer may be a copper plating layer formed by electroless plating and electrolytic plating. A patterned wiring layer may be formed on both surfaces of a flexible circuit board, that is, on the upper and lower surfaces, after laminating a dry film on the wiring layer, through the processes of exposure, development, and etching. Thus, the wiring pattern layers 210 and 220 may be formed.

Conductive materials may be filled in via holes V1, V2, and V3 passing through the substrate 100. The conductive material filled in a via hole may correspond to the wiring pattern layers 210 and 220, or may be different conductive materials. For example, the conductive material filled in a via hole may include at least one metal among copper (Cu), aluminum (Al), chromium (Cr), nickel (Ni), silver (Ag), molybdenum (Mo), gold (Au), titanium (Ti), and an alloy thereof. The electrical signal of the conductive pattern part CP on the upper surface of the substrate 100 may be transmitted to the conductive pattern part CP of the lower surface of the substrate 100 through the conductive material filled in a via hole.

A plating layer 300 may be formed on the wiring pattern layers 210 and 220. Thereafter, a protective part PP may be screen printed on the conductive pattern part CP. Referring to FIG. 36, the area of the wiring pattern layer 210 and 220 may correspond to or differ from the plating layer 300. The area of the first plating layer 310 may correspond to or be different from the area of the second plating layer 320. The area of the first wiring pattern layer 210 may correspond to that of the plating layer 300. The area of the first plating layer 310 may correspond to the area of the second plating layer 320.

The first plating layer 310 may be provided on the first wiring pattern layer 210, and the second plating layer 320 may be formed on the first plating layer 310, and the first protective layer 410 may be partially provided on the second plating layer 320. Referring to FIG. 37, the area of the wiring pattern layers 210 and 220 may be different from that of the plating layer 300. The area of the first wiring pattern layer 210 may correspond to the area of the first plating layer 310. The area of the first plating layer 310 may be different from that of the second plating layer 320. For example, the area of the first plating layer 310 may be larger than that of the second plating layer 320.

The first plating layer 310 may be provided on the first wiring pattern layer 210, and the protective layer 410 may be partially provided on the first plating layer 310. The second plating layer 320 may be provided on an area on the first plating layer 310 other than an area where the protective layer 410 is provided.

The first plating layer 310 in contact with a lower surface of the protective layer 410 may be an alloy layer of copper and tin. The second plating layer 320 contacting a side surface of the protective layer 410 may include pure tin. As a result, formation of a cavity part between the protective layer 410 and the first plating layer 310 may prevent the protective layer from being removed and prevent the formation of whiskers, thereby increasing adhesion of the protective layer. Therefore, the embodiments may include two layers of plating layers, and thus an electronic device with high reliability may be provided.

The driving chip 40, the display panel 20, and the printed circuit board 30 mounted on the flexible circuit board chip package may be connected. The flexible circuit board chip package 10 may include a substrate 100 including a through hole, wiring pattern layers 210 and 220 provided on both sides of the substrate including a through hole, a first or third plating layer 310 or 330 provided on the wiring pattern layer, second and fourth plating layers 320 and 340 provided on the first or third plating layer, and protective layers 410 and 420 partially provided on the wiring pattern layers.

A providing area of the protective layer 400 on which the protective layer 400 may be formed may be the protective part PP. The conductive pattern part CP may be exposed to the outside in areas NPA1 and NPA3 other than the protective part where the protective layer is not formed. The conductive pattern part CP may be electrically connected to the driving chip 40, the display panel 20, and the printed circuit board 30 in an area where a protective part is not provided on an open area of a protective layer or a conductive pattern part.

A lead pattern part and a test pattern part of the flexible circuit board chip package 10 may not overlap a protective part PP. The lead pattern part and the test pattern part may be a conductive pattern part located in an open area not covered by a protective layer, and may be distinguished into a lead pattern part and a test pattern part according to functions.

The lead pattern part may be a conductive pattern part to be connected to the driving chip, the display panel, or the printed circuit board. The test pattern part may be a conductive pattern part for checking whether a flexible circuit board and a product of a chip package including the same may be defective.

The lead pattern part may be distinguished into an inner lead pattern part and an outer lead pattern part depending on a location. One area of a conductive pattern part that may be relatively close to the driving chip and not overlapped by a protective layer may be represented as the inner lead pattern part. One area of a conductive pattern part that may be located relatively far from the driving chip and not overlapped by a protective layer may be represented as the outer lead pattern part.

Referring to FIG. 36 to FIG. 39, the substrate 100 may include a first inner lead pattern part I1, a second inner lead pattern part I2, a third inner lead pattern part I3, and a fourth inner lead pattern part I4. The substrate 100 may include a first outer lead pattern part O1, a second outer lead pattern part O2, a third outer lead pattern part O3, and a fourth outer lead pattern part O4. The substrate 100 may include a first test pattern part T1 and a second test pattern part T2.

The first inner lead pattern part I1, the second inner lead pattern part I2, the third inner lead pattern part I3, the first outer lead pattern part O1, and the second outer lead pattern part O2 may be provided on one surface of the substrate 100. The fourth inner lead pattern part I4, the third outer lead pattern part O3, the fourth outer lead pattern part O4, the first test pattern part T1, and the second test pattern part T2 may be included on another surface of the substrate 100 opposite to the one surface.

The driving chip 40, which may be provided on one surface of the substrate 100 may be connected to the first inner lead pattern part I1, the second inner lead pattern part I2, or the third inner lead pattern part I3 through a first connecting part 70. The first connecting part 70 may include a first sub first connecting part 71, a second sub first connecting part 72, and a third sub first connecting part 73 depending on location and/or function. The driving chip 40 provided on one surface of the substrate 100 may be electrically connected to the first inner lead pattern part I1 through the first sub first connecting part 71.

The first inner lead pattern part I1 may transmit an electrical signal to the first outer lead pattern part O1 adjacent to a second via hole V2 along the upper surface of the substrate 100. The second via hole V2 and the first outer lead pattern part O1 may be electrically connected to each other. The first inner lead pattern part I1 and the first outer lead pattern part O1 may be one end and another end of the conductive pattern part extending in one direction.

For example, the printed circuit board 30 may be connected to the first outer lead pattern part O1 through an adhesive layer 50. Accordingly, a signal transmitted from the first chip may be transmitted to the printed circuit board 30 through the first inner lead pattern part I1 and the first outer lead pattern part O1.

The first inner lead pattern part I1 may be electrically connected to the second via hole V2 along the upper surface of the substrate 100, and an electrical signal may be transmitted to the third outer lead pattern part O3 adjacent to the second via hole V2 along the lower surface of the substrate 100 through the conductive material filled in the second via hole V2. The second via hole V2 may be electrically connected to the third outer lead pattern part O3. Accordingly, the printed circuit board 30 may be electrically connected to the third outer lead pattern part O3 through the adhesive layer 50.

The driving chip 40 provided on one surface of the substrate 100 may be electrically connected to the second inner lead pattern part I2 through the second sub first connecting part 72. The second inner lead pattern part I2 provided on the upper surface of the substrate 100 may transmit an electrical signal to the fourth inner lead pattern part I4 and the first test pattern part T1 adjacent to a first via hole V1 along the lower surface of the substrate 100 through a conductive material filled in the first via hole V1 located under the second inner lead pattern part I2. The first via hole V1, the first test pattern part T1, and the fourth inner lead pattern part I4 may be electrically connected on the lower surface of the substrate. The display panel 20 may be attached to the fourth inner lead pattern part I4 and the fourth outer lead pattern part O4.

The first test pattern part T1 may confirm a failure of an electrical signal that may be transmitted through the first via hole V1. For example, accuracy of a signal transmitted to the fourth inner lead pattern part I4 may be confirmed through the first test pattern part T1. By measuring a voltage or a current in the first test pattern part T1, it may be possible to confirm whether a short circuit or a short occurs or a generated location of the short circuit or short in the conductive pattern part located between the first chip and the display panel, thereby improving product reliability.

The driving chip 40 provided on one surface of the substrate 100 may be electrically connected to the third inner lead pattern part I3 through the third sub first connecting part 73. The third inner lead pattern part I3 may transmit an electrical signal to the second outer lead pattern part O2 adjacent to a third via hole V3 along the upper surface of the substrate 100. The third via hole V3 and the second outer lead pattern part O2 may be electrically connected. The third inner lead pattern part I3 and the second outer lead pattern part O2 may be one end and the other end of the conductive pattern part extending in one direction.

The third inner lead pattern part I3 may be electrically connected to the third via hole V3 along the upper surface of the substrate 100, and an electrical signal may be transmitted to the fourth outer lead pattern part O4 and the second test pattern part T2 adjacent to the third via hole V3 along the lower surface of the substrate 100 through the conductive material filled in the third via hole V3.

The second via hole V2, the fourth outer lead pattern part O4, and the second test pattern part T2 may be electrically connected at the lower surface of the substrate. As described above, the display panel 20 may be attached to the fourth inner lead pattern part I4 and the fourth outer lead pattern part O4 through the adhesive layer 50.

The second test pattern part T2 may confirm a failure of an electrical signal that may be transmitted through the third via hole V3. For example, accuracy of a signal transmitted to the fourth outer lead pattern part O4 may be confirmed through the second test pattern part T2. By measuring a voltage or a current in the second test pattern part T2, it may be possible to confirm whether a short circuit or a short occurs or a generated location of the short circuit or short in the conductive pattern part located between the first chip and the display panel, thereby improving product reliability.

The flexible circuit board may dispose or have the display panel 20 on the other surface opposite to one surface on which the driving chip 40 is provided, thereby improving a degree of freedom of design.

Figure 38:
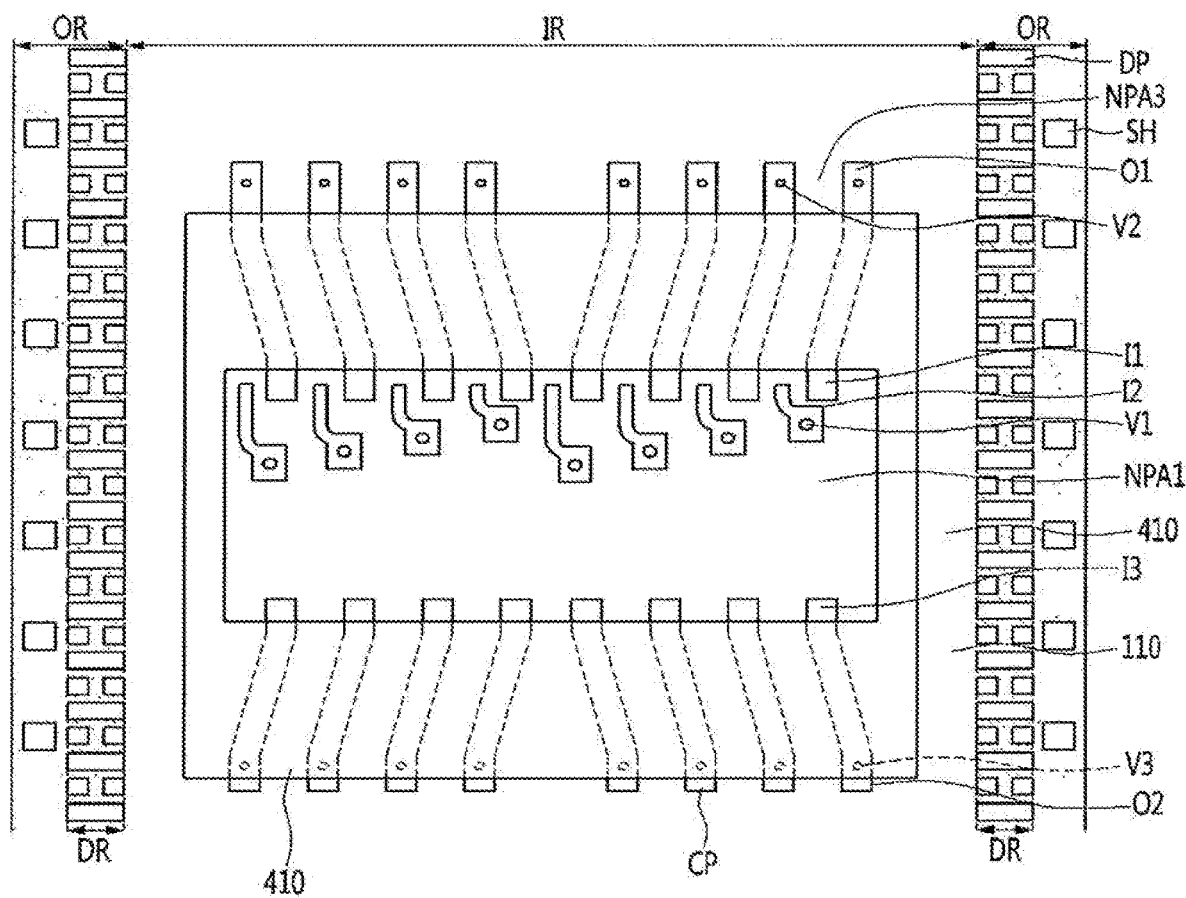
FIG. 38 is a top plan view of a double-sided flexible printed circuit board according to FIG. 37.
Figure 39:
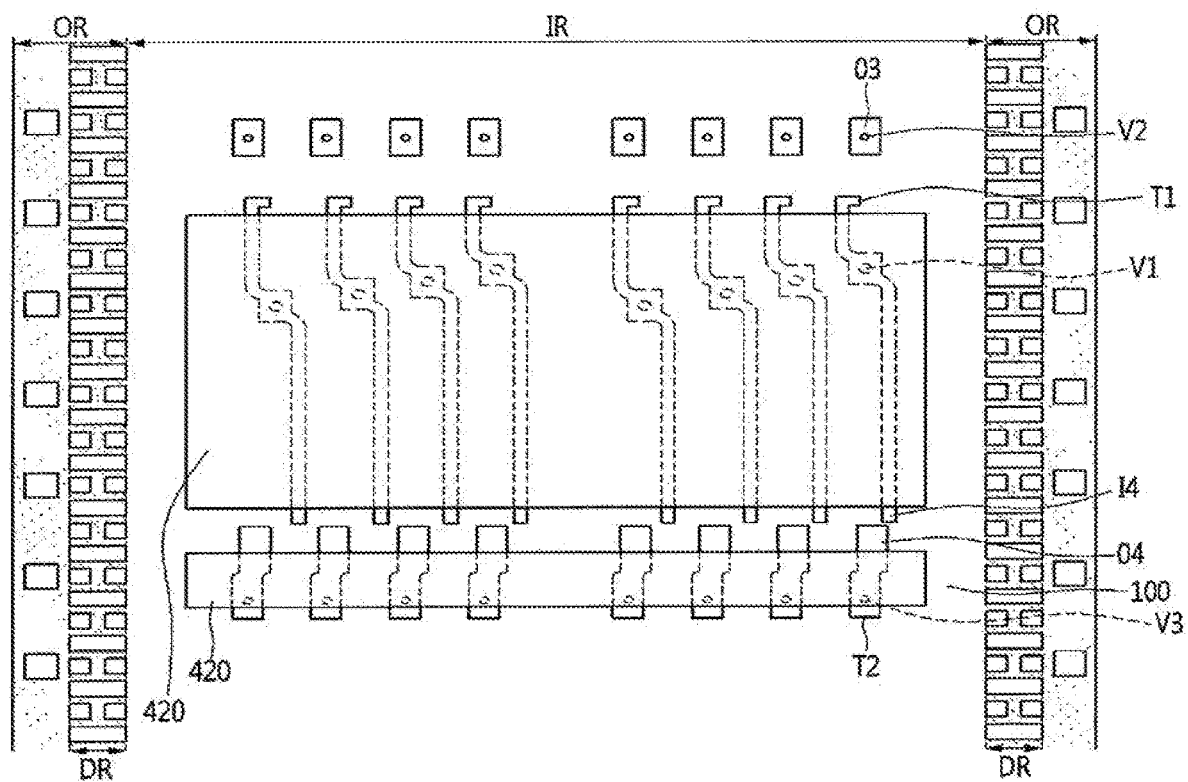
FIG. 39 is a bottom view of a double-sided flexible printed circuit board according to FIG. 37.

FIG. 38 is a top plan view of the double-sided flexible printed circuit board according to FIG. 37, and FIG. 39 is a bottom view of the double-sided flexible printed circuit board according to FIG. 37. Referring to FIG. 38 and FIG. 39, the substrate 100 may have sprocket holes on both sides in the longitudinal direction for convenience of manufacturing or processing. Accordingly, the substrate 100 may be rolled or unwound by sprocket holes SH in a roll-to-roll manner.

The substrate 100 of the embodiment may be defined as an inner area IR and an outer area OR based on a cut portion indicated by a dotted line. The outer area OR may include a plurality of sprocket holes SH and a plurality of dummy patterns DP. The sprocket holes SH may improve the convenience of transporting a flexible circuit board.

A dummy area DR may be included between the sprocket holes SH and the inner area IR in which a conductive pattern part CP may be provided. A plurality of dummy patterns DP may be provided in the dummy area DR. The plurality of dummy patterns DP of the outer area OR may prevent the conductive pattern part CP of the inner area IR from being excessively etched and, and thus uniformity of the width and pitch of the conductive pattern part CP may be improved.

The conductive pattern part for connecting the driving chip, the display panel, and the printed circuit board may be provided in the inner area IR of the substrate 100. By cutting a portion where a sprocket hole is formed on the substrate 100 and providing a chip on the board, the chip package having the substrate 100 and the electronic device including the same may be processed.

Referring to FIG. 38, on the upper surface of the substrate 100, the first inner lead pattern part I1, the second inner lead pattern part I2, and the third inner lead pattern part I3, which are one area of the conductive pattern part CP, may be exposed to an outside through a first non-providing area NPA1 of the protective layer 410.

The plating layer may be connected to a chip in a non-providing area of the protective layer. In addition, on the upper surface of the substrate 100, the first outer lead pattern part O1, which may be one area of the conductive pattern part CP, may be exposed to the outside through a third non-providing area NPA3 of the protective layer 410.

The first inner lead pattern part I1 and the third inner lead pattern part I3 may be a conductive pattern part connected to a chip through a first connecting part. Ends of the first inner lead pattern part I1 and the third inner lead pattern part I3 may be provided in the same row. For example, a plurality of the first inner lead pattern parts I1 may be spaced apart from each other in a horizontal direction (x-axis direction) of a substrate, and ends of the first inner lead pattern part I1 may be provided in a same row. For example, a plurality of the third inner lead pattern parts I3 may be spaced apart from each other in a horizontal direction (x-axis direction) of a substrate, and the ends of the third inner lead pattern part I3 may be provided in the same row. Accordingly, the first inner lead pattern part I1 and the third inner lead pattern part I3 may be excellent in bonding with a first connecting part and a driving chip.

A plurality of the second via holes V2 may be spaced apart from each other in a horizontal direction (x-axis direction) of a substrate, and may be provided in a same row. A plurality of the third via holes V3 may be spaced apart from each other in a horizontal direction (x-axis direction) of a substrate, and may be provided in the same row.

The end of the first inner lead pattern part I1 may be spaced apart from an end of a second inner lead pattern part I2. The second inner lead pattern part I2 may be a conductive pattern that may not be bonded to a driving chip. At least one end of one end and the other end of the second inner lead pattern part I2 may not be provided in the same row.

For example, a plurality of the second inner lead pattern parts I2 may be spaced from each other in a horizontal direction (x-axis direction) of a substrate. A distance between at least one end of the one end and the other end of the second inner lead pattern part I2 and the end of the first inner lead pattern part I1 may decrease as closer to the horizontal direction (x-axis direction) of the substrate. A distance between at least one end of the one end and the other end of the second inner lead pattern part I2 and the end of the first inner lead pattern part I1 may increase as closer to the horizontal direction (x-axis direction) of the substrate. A plurality of the first via holes V1 may be spaced apart from each other and provided in different rows in a horizontal direction (x-axis direction) of a substrate.

The length between one end and the other end of the second inner lead pattern part I2 may include a first set part of the second inner lead pattern parts I2 gradually decreasing as closer to the horizontal direction (x-axis direction) of the substrate. A length between one end and the other end of the second inner lead pattern part I2 may include a first set part of the second inner lead pattern parts I2 that gradually decreases from a first length to a second length as closer toward the horizontal direction (x-axis direction) of the substrate. The first length may be larger than the second length. A plurality of first sets may be provided on the substrate 100. Accordingly, on the substrate 100, the second inner lead pattern parts I2 may be gradually reduced in length from the first length to the second length. The second inner lead pattern part I2 adjacent to the second inner lead pattern part I2 having the second length may have a first length again. Accordingly, a first set part of the second inner lead pattern parts I2, whose length is gradually reduced from the first length to the second length as closer to a horizontal (x-axis direction) of the substrate; and the first set part of the second inner lead pattern parts I2, whose length is gradually reduced from the first length to the second length, may be repeatedly provided.

A distance between at least one end of the one end and the other end of the second inner lead pattern part I2 and the end of the first inner lead pattern part I1 may decrease as closer to the horizontal direction (x-axis direction) of the substrate. A plurality of the first inner lead pattern parts I1 may be spaced apart from each other by a first distance. One end of the second inner lead pattern part I2 may be located in an area between two adjacent first inner lead pattern parts I1 which may be spaced apart from each other. In a horizontal direction of the substrate, the end of the first inner lead pattern part I1 and the end of the second inner lead pattern part I2 may be alternately provided.

Referring to FIG. 39, on the lower surface of the substrate 100 of the embodiment, the fourth inner lead pattern part I4 and the fourth outer lead pattern part O4, which may be one area of the conductive pattern part CP, may be exposed to the outside through the third non-providing area NPA3 of the protective layer 420.

Figure 40:
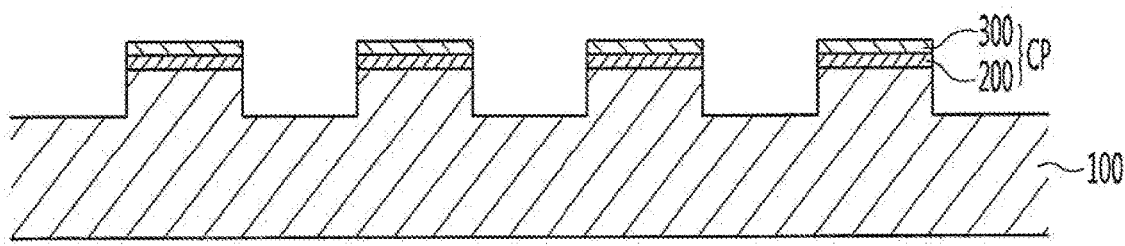
FIG. 40 is a cross-sectional view of a pattern shape of a lead pattern part of an all-in-one chip on film (COF) flexible circuit board according to an embodiment.

FIG. 40 is a cross-sectional view of a pattern shape of a lead pattern part of an all-in-one chip on film (COF) flexible circuit board according to an embodiment. In detail, FIG. 40 is a cross-sectional view illustrating a cross sectional shape on one surface of the lead pattern part. The conductive pattern part may form a pattern by sequentially forming a seed metal layer and a conductive metal layer on a base substrate, then laminating a photoresist layer, and performing exposure, development, and etching. Thereafter, the seed metal layer may be removed. The base substrate may be etched.

For example, when sputtering a seed metal layer on a base substrate, a short circuit may occur as adjacent patterns are electrically connected. In order to solve this problem, one surface of the base substrate located between the patterns may be etched. Thus, the seed layer injected into the base substrate may be removed, and a short circuit of adjacent patterns may be prevented. Therefore, the base substrate may be etched up to a predetermined depth for electrical isolation of adjacent patterns.

Accordingly, the lead pattern part may include a wiring pattern layer 200 and a plating layer 300 on a substrate 100. A thickness of a substrate in an area in which a conductive pattern part CP is formed may be larger than that of a substrate having no pattern.

Figure 41:
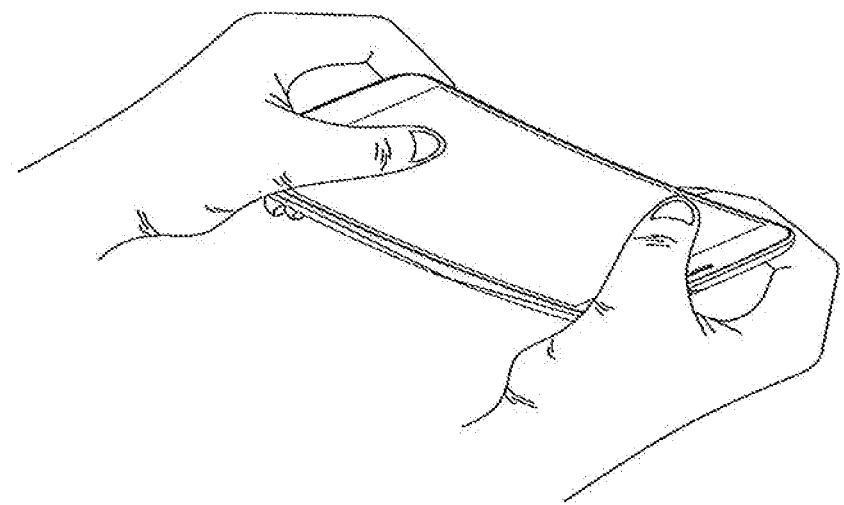
FIG. 41 to FIG. 43 are electronic devices having a flexible circuit board according to embodiments.

Since the COF module is flexible, various electronic devices may be used. For example, referring to FIG. 41, the COF module may be included in a flexible touch window. Accordingly, a touch device including the COF module may be a flexible touch device. Thus, a user may fold or bend the touch window or touch device. Such a flexible touch window may be applied, for example, to a wearable touch device.

Figure 42:
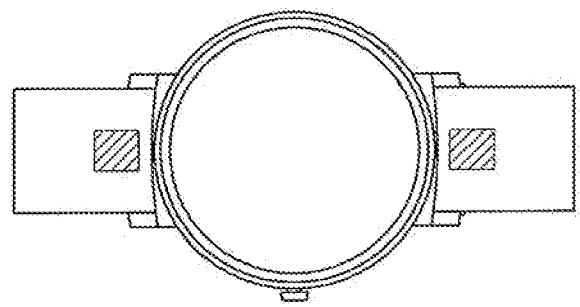

Referring to FIG. 42, the COF module may be included in various wearable touch devices such as a curved display. The electronic device including the COF module may be thin or lightweight.

Figure 43:
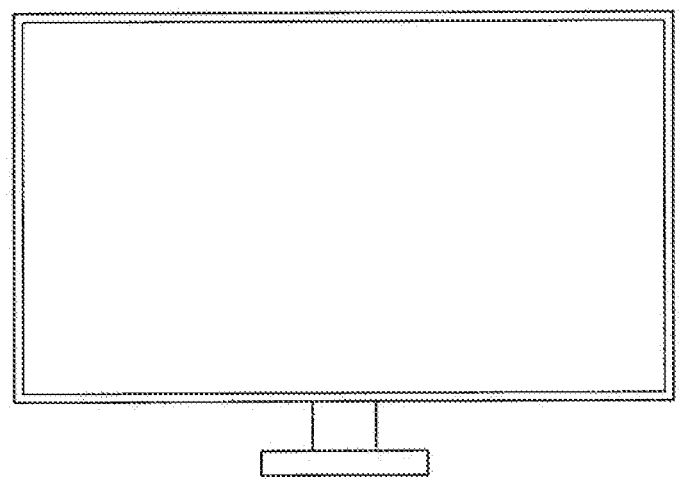

Referring to FIG. 43, the COF module may be applied in various electronic devices having a display portion, such as, e.g., a TV, a monitor, and a notebook. The COF module may also be applied in an electronic device having a curved display portion. However, the embodiment is not limited thereto, and such a COF flexible circuit board and a COF module obtained by processing the same may be applied in various electronic devices.

In a flexible circuit board according to embodiments disclosed herein, a wiring pattern layer may be provided on a substrate having a bending area and a non-bending area, and a plating layer having an open area may be provided on the wiring pattern layer. A protective layer may contact one surface of the wiring pattern layer and a side surface of the plating layer exposed at the open area. The plating layer may include a first plating layer and a second plating layer provided in two layers. A width of an open area of the second plating layer may be larger than a width of an open area of the first plating layer. The protective layer may contact an upper surface of the first plating layer. As one surface of the protective layer contacts the first plating layer, a crack generated in the wiring pattern layer and/or the plating layer may be prevented at a portion with tension when the flexible circuit board and a chip on film (COF) module including the same are folded. Therefore, reliability of the flexible circuit board and the COF module including the same according to the embodiments may be improved.

In the flexible circuit board according to the embodiments disclosed herein, the protective layer may be provided of two layers and the flexible circuit board may include an upper protective layer and a lower protective layer. The upper protective layer may have a larger width than a width of the lower protective layer.

The upper protective layer may be provided to have a wider width than the lower protective layer, and stress due to tension or compression may be dispersed, and damage due to deformation may be prevented. Therefore, reliability and lifetime of the flexible circuit board according to the exemplary embodiments may be improved.

The upper protective layer may cover the lower protective layer and a second plating layer located in a peripheral part of the lower protective layer. Accordingly, it may be possible to prevent damage and/or removal of a film caused by oxidation of a wiring pattern due to infiltration of moisture or foreign matter into an interface between the second plating layer and the lower protective layer.

An upper surface of the lower protective layer of the flexible circuit board may be provided higher than an upper surface of the second plating layer. And thus, it may be possible to prevent formation of a cavity part between the lower protective layer and the plating layer or between the lower protective layer and the wiring pattern layer. Accordingly, removal of a film or damage of the wiring pattern layer and/or the plating layer may be prevented.

A part of the lower protective layer of the flexible circuit board may be in contact with an upper surface of the first plating layer. The lower protective layer may be provided to cover an upper surface of the wiring pattern layer, a side surface of the first plating layer, and a part of the upper surface of the first plating layer. As the lower protective layer contacts the first plating layer, it may be possible to prevent a crack from being generated in the wiring pattern layer and/or the plating layer at a portion with tension when the flexible circuit board and the chip on film (COF) module including the same are folded. Therefore, reliability of the flexible circuit board and the COF module including the same according to the exemplary embodiments may be improved.

In addition, by providing a plating layer partially on a wiring pattern layer, generation of metal particles, such as Sn particles, generated in a plating process may be reduced, thereby improving reliability of a flexible circuit board and a COF module including the same. As at least one protective layer of a first protective layer and a second protective layer of a double-sided COF flexible circuit board may be in contact with a wiring pattern layer, a crack due to a change in tensile force during bending may be prevented. Moreover, a semiconductor chip may be mounted in a narrow region of an electronic device in or with high density. Therefore, a high-resolution display may be realized.

According to embodiments disclosed herein, a flexible circuit board may include: a substrate having a bending area and a non-bending area; a wiring pattern layer provided on a bending area and a non-bending area on the substrate; a plating layer provided on the wiring pattern layer and having an open area in an area corresponding to the bending area; and a protective layer directly contacting one surface of the wiring pattern layer exposed to the open area and a side surface of the plating layer, wherein the protective layer is provided to have a larger thickness than that of the plating layer.

According to embodiments disclosed herein, a flexible circuit board may include: a substrate having a bending area and a non-bending area; a first wiring pattern layer provided on a bending area and a non-bending area on one surface of the substrate; a first plating layer provided on the first wiring pattern layer and having an open area in an area corresponding to the bending area; a second plating layer provided on the first plating layer; a first protective layer directly contacting one surface of the first wiring pattern layer exposed at the open area, a side surface of the first plating layer, and a side surface of the second plating layer; a second wiring pattern layer provided on a bending area and a non-bending area on the other surface opposite to the one surface of the substrate; a third plating layer provided on the second wiring pattern layer; a fourth plating layer provided on the third plating layer; and a second protective layer provided on an area corresponding to the bending area on the other surface of the substrate, wherein the first protective layer is provided higher than an upper surface of the second plating layer.

According to embodiments disclosed herein, an electronic device may include: a flexible circuit board having a wiring pattern layer on one surface or both surfaces of a substrate; a display panel connected to one end of the flexible circuit board; and a printed circuit board connected to the other end opposite to the one end of the flexible circuit board.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. Flexible circuit board comprising:
   a substrate;
   a first wiring pattern layer provided on a first surface of the substrate;
   a first plating layer provided on the first wiring pattern layer and including a first open area;
   a first protective layer that contacts a part of the first wiring pattern layer, a part of the first plating layer, and a part of the substrate;
   a second wiring pattern layer provided under a second surface opposite to the first surface of the substrate;
   a third plating layer provided under the second wiring pattern layer; and
   a second protective layer provided under the third plating layer,
   wherein the first protective layer includes:
   an overlapping region in which the first plating layer and the first protective layer are in contact with each other and
   wherein a first thickness of the first protective layer in the overlapping region is correspond to a thickness of the second protective layer in a region vertically overlapping with the overlapping region; and
   wherein a second thickness of the first protective layer in the first open area is different from a thickness of the second protective layer in a region vertically overlapping with the first open area.

2. The flexible circuit board of claim 1, further comprising:
   a second plating layer provided on the first plating layer.

3. The flexible circuit board of claim 2, wherein an upper surface of the first protective layer is higher than an upper surface of the first plating layer and an upper surface of the second plating layer.

4. The flexible circuit board of claim 2, wherein the overlapping region includes:
   a first overlapping region in which the first plating layer and the first protective layer are in contact with each other at one side of the first open area, and a second overlapping region in which the first plating layer and the first protective layer are in contact with each other at the other side different from the one side of the first open area, wherein a width of the first overlapping region is different from a width of the second overlapping region.

5. The flexible circuit board of claim 4, wherein the width of the first overlapping region or the second overlapping region is 400 µm or more.

6. The flexible circuit board of claim 5, wherein each of thicknesses of the first protective layer and the second protective layer in a non-the first open area is 5 µm to 20 µm.

7. The flexible circuit board of claim 5, wherein at least one protective layer of the first protective layer and the second protective layer has a thickness of 1 to 20 µm.

8. The flexible circuit board of claim 5, wherein the thickness of the first protective layer in the first open area is larger than the thickness of the second protective layer in the region vertically overlapping with the first open area.

9. The flexible circuit board of claim 4, wherein each of the widths of the first overlapping region and the second overlapping region is larger than a sum of thicknesses of the first plating layer and the second plating layer.

10. The flexible circuit board of claim 4, wherein each of the widths of the first overlapping region and the second overlapping region is larger than a thickness of the first plating layer.

11. The flexible circuit board of claim 4, wherein the width of the first overlapping region is smaller than the width of second overlapping region.

12. The flexible circuit board of claim 2, wherein a thickness of the first wiring pattern layer is larger than a thickness of the first plating layer and a thickness of the second plating layer.

13. The flexible circuit board of claim 2, wherein the second plating layer includes a second open area;
wherein the substrate has a bending area and a non-bending area, and
wherein a width of the bending area is smaller than a width of the second open area.

14. The flexible circuit board of claim 13, wherein the first protective layer overlaps the first plating layer in the non-bending area and the bending area.

15. The flexible circuit board of claim 1, wherein the first protective layer directly contacts the part of the first wiring pattern layer, the part of the first plating layer, and the part of the substrate.

16. A flexible circuit board chip package;
a flexible circuit board; and
a chip mounted on the flexible circuit board,
wherein the flexible circuit board comprises:
a substrate;
a first wiring pattern layer provided on a first surface of the substrate;
a first plating layer provided on the first wiring pattern layer and including a first open area;
a first protective layer that contacts a part of the first wiring pattern layer, a part of the first plating layer, and a part of the substrate;
a second wiring pattern layer provided under a second surface opposite to the first surface of the substrate;
a third plating layer provided under the second wiring pattern layer; and
a second protective layer provided under the third plating layer,
wherein the first protective layer includes:
an overlapping region in which the first plating layer and the first protective layer are in contact with each other, and
wherein a first thickness of the first protective layer in the overlapping region is correspond to a thickness of the second protective layer in a region vertically overlapping with the overlapping region; and
wherein a second thickness of the first protective layer in the first open area is different from a thickness of the second protective layer in a region vertically overlapping with the first open area.

17. An electronic device, comprising:
a flexible circuit board;
a display panel connected to a first end of the flexible circuit board; and
a printed circuit board connected to a second end opposite to the first end of the flexible circuit board, the flexible circuit board including:
a substrate;
a first wiring pattern layer provided on a first surface of the substrate;
a first plating layer provided on the first wiring pattern layer and including a first open area;
a first protective layer that contacts a part of the first wiring pattern layer, a part of the first plating layer, and a part of the substrate;
a second wiring pattern layer provided under a second surface opposite to the first surface of the substrate;
a third plating layer provided under the second wiring pattern layer; and
a second protective layer provided under the third plating layer,
wherein the first protective layer includes:
an overlapping region in which the first plating layer and the first protective layer are in contact with each other, and
wherein a first thickness of the first protective layer in the overlapping region is correspond to a thickness of the second protective layer in a region vertically overlapping with the overlapping region; and
wherein a second thickness of the first protective layer in the first open area is different from a thickness of the second protective layer in a region vertically overlapping with the first open area.

\* \* \* \* \*